(12) United States Patent
Xia et al.

(10) Patent No.: US 9,045,579 B2
(45) Date of Patent: Jun. 2, 2015

(54) PERIODIC NANOSTRUCTURES FROM SELF ASSEMBLED WEDGE-TYPE BLOCK-COPOLYMERS

(71) Applicants: Yan Xia, Mountain View, CA (US); Benjamin R Sveinbjornsson, Pasadena, CA (US); Robert H Grubbs, South Pasadena, CA (US); Raymond Weitekamp, Pasadena, CA (US); Garret M Miyake, Pasadena, CA (US); Victoria Piunova, Altadena, CA (US); Christopher Scot Daeffler, Pasadena, CA (US)

(72) Inventors: Yan Xia, Mountain View, CA (US); Benjamin R Sveinbjornsson, Pasadena, CA (US); Robert H Grubbs, South Pasadena, CA (US); Raymond Weitekamp, Pasadena, CA (US); Garret M Miyake, Pasadena, CA (US); Victoria Piunova, Altadena, CA (US); Christopher Scot Daeffler, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 105 days.

(21) Appl. No.: 13/801,710

(22) Filed: Mar. 13, 2013

(65) Prior Publication Data

US 2013/0296491 A1 Nov. 7, 2013

Related U.S. Application Data

(60) Provisional application No. 61/610,379, filed on Mar. 13, 2012, provisional application No. 61/736,421, filed on Dec. 12, 2012.

(51) Int. Cl.

| | | |
|---|---|---|
| C08F 26/06 | (2006.01) |
| C08F 2/00 | (2006.01) |
| C08F 10/00 | (2006.01) |
| C08F 299/00 | (2006.01) |
| C08G 81/00 | (2006.01) |
| C08F 222/04 | (2006.01) |
| C08F 222/40 | (2006.01) |
| C08F 293/00 | (2006.01) |
| C08F 232/08 | (2006.01) |
| B82Y 40/00 | (2011.01) |
| C08G 61/08 | (2006.01) |

(52) U.S. Cl.
CPC .............. *C08F 299/00* (2013.01); *C08G 81/00* (2013.01); *C08F 222/04* (2013.01); *C08F 222/40* (2013.01); *C08F 293/00* (2013.01); *C08F 232/08* (2013.01); *B82Y 40/00* (2013.01); *C08G 61/08* (2013.01); *B81C 2201/0149* (2013.01); *C08G 2261/126* (2013.01); *C08G 2261/128* (2013.01); *C08G 2261/1426* (2013.01); *C08G 2261/146* (2013.01); *C08G 2261/149* (2013.01); *C08G 2261/3324* (2013.01); *C08G 2261/418* (2013.01); *C08G 2261/74* (2013.01)

(58) Field of Classification Search
CPC .... C08F 293/00; C08F 299/00; C08F 297/00; C08G 81/00
USPC .................................... 526/259, 258, 72, 280
See application file for complete search history.

(56) References Cited

U.S. PATENT DOCUMENTS

| | | | |
|---|---|---|---|
| 5,462,990 A | 10/1995 | Hubbell et al. |
| 6,007,845 A | 12/1999 | Domb et al. |
| 6,383,500 B1 | 5/2002 | Wooley et al. |
| 6,407,187 B1 | 6/2002 | Matyjaszewski et al. |
| 6,433,931 B1 | 8/2002 | Fink et al. |
| 6,627,314 B2 | 9/2003 | Matyjaszewski et al. |
| 6,671,097 B2 | 12/2003 | Fink et al. |
| 6,692,914 B1 | 2/2004 | Klaerner et al. |
| 7,101,937 B1 | 9/2006 | Frechet et al. |
| 7,795,355 B2 | 9/2010 | Matyjaszewski et al. |
| 7,960,479 B2 | 6/2011 | Cheng et al. |
| 8,415,436 B2 | 4/2013 | Han et al. |
| 8,419,792 B2 | 4/2013 | Vanderbilt et al. |
| 8,454,689 B2 | 6/2013 | Vanderbilt et al. |
| 2002/0135880 A1 | 9/2002 | Fink et al. |
| 2005/0192409 A1* | 9/2005 | Rhodes et al. ............. 525/326.7 |
| 2007/0099791 A1 | 5/2007 | Wan et al. |
| 2013/0324666 A1* | 12/2013 | Xia et al. ...................... 525/182 |
| 2014/0011958 A1* | 1/2014 | Miyake et al. ................ 525/280 |

FOREIGN PATENT DOCUMENTS

| | | | |
|---|---|---|---|
| JP | 2006-052326 | * | 2/2006 |
| WO | WO 2013/138494 | | 9/2013 |

OTHER PUBLICATIONS

Murakami et al, JP 2006-052326 Machine translation, Feb. 23, 2006.*

(Continued)

*Primary Examiner* — Ling Choi
*Assistant Examiner* — Jessica E Whiteley
(74) *Attorney, Agent, or Firm* — Lathrop & Gage LLP

(57) ABSTRACT

The invention provides a class of wedge-type block copolymers having a plurality of chemically different blocks, at least a portion of which incorporates a wedge group-containing block providing useful properties. For example, use of one or more wedge group-containing blocks in some block copolymers of the invention significantly inhibits chain entanglement and, thus, the present block copolymers materials provide a class of polymer materials capable of efficient molecular self-assembly to generate a range of structures, such as periodic nanostructures and microstructures. Materials of the present invention include copolymers having one or more wedge group-containing blocks, and optionally for some applications copolymers also incorporating one or more polymer side group-containing blocks. The present invention also provides useful methods of making and using wedge-type block copolymers.

31 Claims, 7 Drawing Sheets

(56) References Cited

OTHER PUBLICATIONS

Fiset, Erika and Jean-Franquis Morin, Synthesis, Characterization and modification of azide-containing dendronized diblock copolymers, Jan. 30, 2009, Polymer, 50, 1369-1377.*

Aguirre et al. (2010) "Tunable Colors in Opals and Inverse Opal Photonic Crystals," *Adv. Funct. Mater.* 20:2565-2578.

Akbari et al. (2001) "Cool Surfaces and Shade Trees to Reduce Energy Use and Improve Air Quality in Urban Areas", *Solar Energy*, vol. 70 No. 3, pp. 295-310.

Albert et al. (2010) "Self-Assembly of Block Copolymer Thin Films," *Materials Today*. 13:24-33.

Aharoni (1979), "Rigid Backbone Polymers. 2. Polyisocyanates and Their Liquid-Crystal Behavior," Macromolecules, 12, 94-103.

Atwater et al. (2010) "Plasmonics for Improved Photovoltaic Devices", *Nature Material*, vol. 9, pp. 205-214.

Azzaroni et al. (2012), "Polymer Brushes Here, There, and Everywhere: Recent Advances in Their Practical Applications and Emerging Opportunities in Multiple Research Fields", Journal of Polymer Science Part A: Polymer Chemistry 2012, 50, 3225-3258.

Bang et al. (2009) "Block Copolymer Nanolithography: Translation of Molecular Level Control to Nanoscale Patterns," *Adv. Mater.* 21:4769-4792.

Bang et al. (2009) "Dual Templating Synthesis of Mesoporous Titanium Nitride Microspheres," *Adv. Mater.* 21:3186-3190.

Bates et al. (1990) "Block Copolymer Thermodynamics: Theory and Experiment," *Ann. Rev. Phys. Chem.* 41:525-557.

Bates et al. (1999) "Block Co-polymers-Designer Soft Materials," *Physics Today*. 52:32-38.

Bates et al. (Apr. 27, 2012) "Multiblock Polymers: Panacea or Pandora's Box?" *Science*. 336:434-440.

Bajpai et al. (2008), "Responsive polymers in controlled drug delivery", Progress in Polymer Science 33 (2008) 1088-1118.

Bae et al. (2005), "Organization of Rigid Wedge-Flexible Coil Block Copolymers into Liquid Crystalline Assembly", Macromolecules, vol. 38, No. 10, pp. 4226-4230.

Bennett et al. (1982) "Modelling of the urban heat island and of its interaction with pollutant dispersal," *Atmospheric Environment*. 16:1797-1822.

Bertone et al. (1999) "Thickness Dependence of the Optical Properties of Ordered Silica-Air and Air-Polymer Photonic Crystals," *Phys. Rev. Lett.* 83:300-303.

Bielawski et al. (2007) "Living ring-opening metathesis polymerization," *Prog. Polym. Sci.* 32:1-29.

Bielawski et al. (2009) "Living Ring-Opening Metathesis Polymerization," In; Ch. 6 *Controlled and Living Polymerizations*. Eds.: Müller, A. H. E.; Matyjaszewski, K. *Wiley-VCH*. Weinheim, Germany. pp. 297-342.

Black (2005) "Self-Aligned Self Assembly of Multi-Nanowire Silicon Field Effect Transistors," *Appl. Phys. Lett.* 87:163116-163118.

Black et al. (2001) "Integration of Self-Assembled Diblock Copolymers for Semiconductor Capacitor Fabrication," *Appl. Phys. Lett.* 79:409-411.

Braun et al. (1999) "Microporous materials: Electrochemically grown photonic crystals," *Nature*. 402:603-604.

Campbell et al. (2000) "Fabrication of photonic crystals for the visible spectrum by holographic lithography," *Nature*. 404:53-56.

Carmesin et al. (1990) "Static and Dynamic Properties of Two-Dimensional Polymer Melts," *J. Phys.* (Paris). 51:915-932.

Carney et al. (2008), "Intramolecular Hydroamination of Aminoalkynes with Silver—Phenanthroline Catalysts," Org. Lett. 2008, 10, 3903-3906.

Crutzen (2004) "New Directions: The Growing Urban Heat and Pollution "Island" Effect—Impact on Chemistry and Climate," *Atmospheric Environment* 38, 3539-3540.

Cheng et al. (2001) "Formation of a Cobalt Magnetic Dot Array via Block Copolymer Lithography," *Adv. Mater.* 13:1174-1178.

Cheng et al. (2006) "Templated Self-Assembly of Block Copolymers: Top-Down Helps Bottom-Up," *Adv. Mater.* 18:2505-2521.

Cushen et al. (2012) "Oligosaccharide/Silicon-Containing Block Copolymers with 5 nm Features for Lithographic Applications," *ACS Nano*. 6:3424-3433.

Daeffler (2013), "Ring-Opening Metathesis of Bulky Norbornene Monomers and Radical-Mediated Hydrophosphonation of Olefins" Ph.D. Thesis, California Institute of Technology, Pasadena, California.

Deutsch et al. (1991) "Interdiffusion and Self-Diffusion in Polymer Mixtures: A Monte Carlo Study," *J. Chem. Phys.* 94:2294-2304.

Edrington et al. (2001) "Polymer-Based Photonic Crystals," *Adv. Mater.* 13:421-425.

Ferry et al. (2010), "Design Considerations for Plasmonic Photovoltaics," *Adv. Mater*, vol. 22, pp. 4794-4808.

Fink et al. (1999) "Block Copolymers as Photonic Bandgap Materials," *Journal of Lightwave Technology*, vol. 17, No. 11, pp. 1963-1969.

Fredrickson et al. (1996) "Dynamics of Block Copolymers: Theory and Experiment," *Annu. Rev. Mater. Sci.* 26: 501-550.

Galisteo-Lopez et al. (2011) "Self-Assembled Photonic Structures," *Adv. Mater*, vol. 23, 30-69.

Gao et al. (2007) "Synthesis of Molecular Brushes by "Grafting Onto" Method: Combination of ATRP and Click Reactions," *J. Am. Chem. Soc.* 129:6633.

Ge et al. (Jan. 20, 2011) "Responsive Photonic Crystals," *Angew. Chem. Int. Ed.* 50:1492-1522.

Grason (2006) "The Packing of Soft Materials: Molecular Asymmetry, Geometric Frustration and Optimal Lattices in Block Copolymer Melts," *Phys. Rep.* 433:1-64.

Green et al. (1999) "The Macromolecular Route to Chiral Amplification," *Angew. Chem. Int. Ed.* 38:3138-3154.

Green et al. (1989), "Macromolecular stereochemistry: the out-of-proportion influence of optically active comonomers on the conformational characteristics of polyisocyanates. The sergeants and soldiers experiment," J. Am. Chem. Soc., 111, 6452-6454.

Grimm et al. (2008) "Global Change and the Ecology of Cities," *Science*. 319:756-760.

Gu et al. (Published online Jan. 31, 2013) "Self-Assembly of Symmetric Brush Diblock Copolymers," *ACS Nano*. 7:2551-2558.

Hadjichristidis et al. (2001) "Polymers with Complex Architecture by Living Anionic Polymerization," *Chem. Rev.* 101:3747-3792.

Hadjichristidis et al. (2003) "The Strength of the Macromonomer Strategy for Complex Macromolecular Architecture: Molecular Characterization, Properties and Applications of Polymacromonomers," *Macromol. Rapid Commun.* 24:979-1013.

Hamley (2003) "Nanostructure Fabrication Using Block Copolymers," *Nanotechnology*. 14:R39.

Hashimoto et al. (1993) "Ordered structure in blends of block copolymers. 1. Miscibility criterion for lamellar block copolymers," *Macromolecules*. 26:2895-2904.

Hawker et al. (2005) "Block Copolymer Lithography: Merging 'Bottom-Up' with 'Top-Down' Processes," *MRS Bull*. 30:952-966.

Heroguez et al. (1996) "Synthesis of α-Norbornenylpoly(ethylene oxide) Macromonomers and Their Ring-Opening Metathesis Polymerization," *Macromolecules*. 29:4459-4464.

Hu et al. (Aug. 4, 2011) "Linear Rheological Response of a Series of Densely Branched Brush Polymers," *Macromolecules*. 44:6935-6943.

Hustad et al. (2009) "Photonic Polyethylene from Self-Assembled Mesophases of Polydisperse Olefin Block Copolymers," *Macromolecules*. 42:3788-3794.

International Search Report and Written Opinion mailed Jul. 18, 2013, corresponding to International Application No. PCT/US2013/030978.

Jeon et al. (2004) "Fabricating Complex Three-Dimensional Nanostructures with High-Resolution Conformable Phase Masks," *Proc. Natl. Acad. Sci. USA* 101:12428-12433.

Jeon, et al. (1999) "Patterned Polymer Growth on Silicon Surfaces Using Microcontact Printing and Surface-Initiated Polymerization," Applied Physics Letters 75(26):4201-4203.

Johnson et al. (2010) "Drug-loaded, bivalent-bottle-brush polymers by graft-through ROMP," *Macromolecules*. 43:10326-10335.

(56) References Cited

OTHER PUBLICATIONS

Johnson et al. (Dec. 13, 2011) "Core-Clickable PEG-Branch-Azide Bivalent-Bottle-Brush Polymers by ROMP: Grafting-Through and Clicking-To," *J. Am. Chem. Soc.* 133:559-566.

Kalnay et al. (2003) "Impact of Urban and Land-Use Change on Climate," *Nature*, vol. 423, 523-531.

Kane et al. (1996) "Phase Behavior and Morphological Characteristics of Compositionally Symmetric Diblock Copolymer Blends," *Macromolecules*. 29:8862-8870.

Kang et al. (2007) "Broad-Wavelength-Range Chemically Tunable Block-Copolymer Photonic Gels," *Nat. Mater.* 6:957-960.

Kang et al. (2009) "Full Color Stop Bands in Hybrid Organic/Inorganic Block Copolymer Photonic Gels by Swelling—Freezing," *J. Am. Chem. Soc.* 131:7538-7539.

Kang et al. (2011), "Ultrafast Cyclopolymerization for Polyene Synthesis: Living Polymerization to Dendronized Polymers," J. Am. Chem. Soc. 2011, 133, 11904-11907.

Karl et al. (2003) "Modern Global Climate Change," *Science*. 302:1719-1723.

Kikuchi et al. (2008) "Conformational Properties of Cylindrical Rod Brushes Consisting of a Polystyrene Main Chain and Poly(n-hexyl isocyanate) Side Chains," Macromolecules. 41:6564-6572.

Kim et al. (2001) "A Route to Nanoscopic $SiO_2$ Posts via Block Copolymer Templates," *Adv. Mater.* 13:795-797.

Krause et al. (2003), "Simple Synthesis of Poly(acetylene) Latex Particles in Aqueous Media," Angew. Chem. Int. Ed. 2003, 42, 5965-5969.

Kumar et al. (2009), "Factors Relevant for the Regioselective Cyclopolymerization of 1,6-Heptadiynes, N,N-Dipropargylamines, N,N-Dipropargylammonium Salts, and Dipropargyl Ethers by RuIV—Alkylidene-Based Metathesis Initiators", J. Am. Chem. Soc., 131, 387-395.

Lanson et al. (2007) "Poly(styrene)comb-b-Poly(ethylene oxide)comb Copolymers: Synthesis and AFM Investigation of Intra- and Supramolecular Organization as Thin Deposits," *Macromolecules*. 40:9503-9509.

Lanson et al. (2007) "Synthesis of (Poly(chloroethyl vinyl ether)-g-polystyrene)comb-b-(poly(chloropyran ethoxy vinyl ether)-g-polyisoprene)comb Copolymers and Study of Hyper-Branched Micelle Formation in Dilute Solutions," *Macromolecules*. 40:5559-5565.

Lee et al. (2008) "Hetero-Grafted Block Brushes with PCL and PBA Side Chains," *Macromolecules*. 41:6073-6080.

Lee et al. (2010) "Quasi-Amorphous Colloidal Structures for Electrically Tunable Full-Color Photonic Pixels with Angle-Independency," *Adv. Mater.* 22:4973-4977.

Leibler (1980) "Theory of Microphase Separation in Block Copolymers," *Macromolecules*. 13:1602-1617.

Leitgeb et al. (2010) "The ROMP toolbox upgraded," *Polymer*. 51:2927-2946.

Li et al. (2000) "Dense Arrays of Ordered GaAs Nanostructures by Selective Area Growth on Substrates Patterned by Block Copolymer Lithography," *Appl. Phys. Lett.* 76:1689-1691.

Li et al. (2001) "The Internal Pressure and New Solubility Parameter of Polymeric Liquids," *J. Chem. Eng. Chin. Univ.* 3:206-212.—English Abstract Only.

Lin et al. (1998) "A three-dimensional photonic crystal operating at infrared wavelengths," *Nature*. 394:251-253.

Linquist, et al. (2008) "Plasmonic Nanocavity Arrays for Enhanced Efficiency in Organic Photovoltaic Cells," *Applied Physics Letters*. 93:123308.

Lopes et al. (2001) "Hierarchical Self-Assembly of Metal Nanostructures on Diblock Copolymer Scaffolds," *Nature*. 414:735-738.

Love et al. (2002) "A Practical and Highly Active Ruthenium-Based Catalyst that Effects the Cross Metathesis of Acrylonitrile," *Angew. Chem. Int. Ed.* 41:4035-4037.

Luttge (2009) "Massively Parallel Fabrication of Repetitive Nanostructures: Nanolithography for Nanoarrays," J. Phys. D: Appl. Phys. 42:123001.

Marencic et al. (2010) "Controlling Order in Block Copolymer Thin Films for Nanopatterning Applications," *Annu. Rev. Chem. Bimol. Eng.* 1:277-297.

Maede et al. (2012), "Helical polymer brushes with a preferred-handed helix-sense triggered by a terminal optically active group in the pendant," Chem. Commun, 48, 3342-3344.

Masuda et al. (1999) "Photonic Crystal Using Anodic Porous Alumina," *Jpn. J. Appl. Phys.* 38:L1403-L1405.

Matsen et al. (1997) "Conformationally asymmetric block copolymers," *J. Poly. Sci. Part B: Polym. Phys.* 35:945-952.

Matson et al. (2008) "Synthesis of Fluorine-18 Functionalized Nanoparticles for use as in vivo Molecular Imaging Agents," *J. Am. Chem. Soc.* 130:6731-6733.

Mayer et al. (2001) "Chiral polyisocyanates, a special class of helical polymers," *Prog. Polym. Sci.* 26:1973-2013.

Maxein et al. (1999), "Structure—Property Relations in Cholesteric Networks from Chiral Polyisocyanates," Macromolecules, 32, 5747-5754.

Maxein et al. (1998), "Opalescent Cholesteric Networks from Chiral Polyisocyanates in Polystyrene," Adv. Mater., 10, 341-345.

Mayershofer et al. (2006), Bi- and Trinuclear Ruthenium Alkylidene Triggered Cyclopolymerization of 1,6-Heptadiynes: Access to An—X—An, Block and $(An)_3$ X Tristar Copolymers, Macromolecules, 39, 3484-3493.

Milner et al. (1988), "Theory of the Grafted Polymer Brush," Mecromolecules, 21(8):2610-2619.

Miyake et al. (Published online Aug. 14, 2012) "Synthesis of Isocyanate-Based Brush Block Copolymers and Their Rapid Self Assembly to Infrared Reflecting Photonic Crystals," *J. Am. Chem. Soc.* 134:14249-14254.

Miyake et al. (Published online Sep. 13, 2012) "Precisely Tunable Photonic Crystals From Rapidly Self-Assembling Brush Block Copolymer Blends," *Angew. Chem. Int. Ed.* 51:11246-11248.

Miyake et al. (2010) "Stereospecific Polymerization of Chiral Oxazolidinone-Functionalized Alkenes," Macromolecules, 43, 7504-7514.

Moon et al. (2010) "Chemical Aspects of Three-Dimensional Photonic Crystals," *Chem. Rev.* 110:547-574.

Neiser et al. (2003) "Polymerization of Macromonomers to Cylindrical Brushes Initiated by Organolanthanides," *Macromolecules*. 36:5437-5439.

Neugebauer et al. (2004) "How Dense are Cylindrical Brushes Grafted from a Multifunctional Macroinitiator?" *Polymer*. 45:8173-8179.

Oono et al. (1988) "⅔-Power Law for Copolymer Lamellar Thickness Implies a ⅓-Power Law for Spinodal Decomposition," *Phys. Rev. Lett.* 61:1109-1111.

Orfanidis (Retrieved May 2012) Electromagnetic Waves and Antennas. Online book, http:// http://www.ece.rutgers.edu/~orfanidi/ewa.

Pangborn et al. (1996) "Safe and Convenient Procedure for Solvent Purification," *Organometallics*. 15:1518-1520.

Paquet et al. (2008) "Nanostructured polymers for photonics," *Materials Today*. 2008, 11, 48-56.

Park et al. (1997) "Block Copolymer Lithography: Periodic Arrays of~$10^{11}$ Holes in 1 Square Centimeter," *Science*. 276:1401-1404.

Park et al. (2003) "Enabling Nanotechnology with Self Assembled Block Copolymer Patterns," *Polymer*. 44:6725-6760.

Park et al. (2009) "Macroscopic 10-Terabit-per-Square-Inch Arrays from Block Copolymers with Lateral Order," *Science*. 323:1030-1033.

Parnell et al. (Feb. 4, 2011) "Continuously Tuneable Optical Filters from Self-Assembled Block Copolymer Blends," *Soft Matter*. 7:3721-3725.

Patten et al. (1991) "'Living' titanium(IV) catalyzed coordination polymerizations of isocyanates," *J. Am. Chem. Soc.* 113:5065-5066.

Patten et al. (1996) "Living Organotitanium(IV)-Catalyzed Polymerizations of Isocyanates," *J. Am. Chem. Soc.* 118:1906-1916.

Patz et al. (2005) "Impact of regional climate change on human health," *Nature*. 438:310-317.

Pelletier et al. (2006) "Aluminum nanowire polarizing grids: Fabrication and analysis," *Appl. Phys. Lett.* 88:211114.

Peng et al. (2011) "Surface Urban Heat Island Across 419 Global Big Cities," *Environ. Sci. Technol.* 2012, 46, 696-703.

(56) References Cited

OTHER PUBLICATIONS

Poelma et al. (2012) "Cyclic Block Copolymers for Controlling Feature Sizes in Block Copolymer Lithography," *ACS Nano.* 6:10845-10854.
Rizwan et al. (2008) "A review on the generation, determination and mitigation of Urban Heat Island," *Journal of Environmental Sciences.* 20:120-128.
Runge et al. (2007) "Synthesis of High Molecular Weight Comb Block Copolymers and Their Assembly into Ordered Morphologies in the Solid State," *J. Am. Chem. Soc.* 129:10551-10560.
Runge et al. (2008) "Investigation of the Assembly of Comb Block Copolymers in the Solid State," *Macromolecules.* 41:7687-7694.
Rutenburg (2004) "Synthesis of Polymer Dielectric Layers for Organic Thin Film Transistors via Surface-Initiated Ring-Opening Metathesis Polymerization," *J. Am. Chem. Soc.* 2004, 126,4062-4063.
Rzayev et al. (2009) "Synthesis of Polystyrene-Polylactide Bottlebrush Block Copolymers and Their Melt Self-Assembly into Large Domain Nanostructures," *Macromolecules.* 42:2135.
Schappacher et al. (2005) "From Combs to Comb-g-Comb Centipedes," *Macromolecules.* 38:7209-7213.
Segalman (2005) "Patterning with Block Copolymer Thin Films," *Materials Science and Engineering.* R48:191-226.
Shah et al. (2011), "Chiroptical Properties of Graft Copolymers Containing Chiral Poly(n-hexyl isocyanate) as a Side Chain", Macromolecules, 44, 7917-7925.
Sheiko et al. (2001) "Visualization of Macromolecules—A First Step to Manipulation and Controlled Response," *Chem. Rev.* 101:4099-4123.
Slugovc (2004) "The Ring Opening Metathesis Polymerisation Toolbox," *Macromol. Rapid Commun.* 25:1283-1297.
South et al. (2007), "Modular and Dynamic Functionalization of Polymeric Scaffolds", Accounts of Chemical Research, vol. 40, No. 1, pp. 63-74.
Stoykovich et al. (2006) "Block Copolymers and Conventional Lithography," *Materials Today.* 9:20.
Sumerlin et al. (2007) "Initiation Efficiency in the Synthesis of Molecular Brushes by Grafting from via Atom Transfer Radical Polymerization," *Macromolecules.* 38:702-708.
Sveinbjörnsson et al. (Jul. 30, 2012) "Rapid Self-Assembly of Brush Block Copolymers to Photonic Crystals," *Proc. Natl. Acad. Sci. USA.* 109(36):14332-14336.
The Proceedings of the Austrian-Slovenian Polymer Meeting 2013, www.ASPM.SI pp. 1-303.
Thompson et al. (2005) "Solvent Accelerated Polymer Diffusion in Thin Films," *Macromolecules.* 38:4339-4344.
Thurn-Albrecht et al. (2000) "High-Density Nanowire Arrays Grown in Self-Assembled Diblock Copolymer Templates," *Science.* 290:2126-2129.
Troparevsky et al. (2010) "Transfer-matrix formalism for the calculation of optical response in multilayer systems: from coherent to incoherent interference," *Optics Express.* 18:24715-24721.
Tseng et al. (2010) "Block Copolymer Nanostructures for Technology," *Polymers.* 2:470-489.
Urbas et al. (2000) "Tunable Block Copolymer/Homopolymer Photonic Crystals," *Adv. Mater.* 12:812-814.
Urbas et al. (1999) "One-Dimensionally Periodic Dielectric Reflectors from Self-Assembled Block Copolymers—Homopolymer Blends," *Macromolecules.* 32:4748-4750.
Valkama et al. (2004) "Self-Assembled Polymeric Solid Films with Temperature-Induced Large and Reversible Photonic-Bandgap Switching," *Nature Mater.* 3:872-876.
Vayer et al. (2010) "Perpendicular Orientation of Cylindrical Domains Upon Solvent Annealing Thin Films of Polystyrene-B-Polylactide,"*Thin Solid Films.* 518:3710-3715.
Vougioukalakis et al. (2010) "Ruthenium-Based Heterocyclic Carbene-Coordinated Olefin Metathesis Catalysts," *Chem. Rev.* 110:1746-1787.
Vygodskii et al. (2008), "Cyclopolymerization of N,N-Dipropargylamines and N,N-Dipropargyl Ammonium Salts," Macromolecules 2008, 41, 1919-1928.
Wanakule et al. (2010) "Thermodynamic Properties of Block Copolymer Electrolytes Containing Imidazolium and Lithium Salts," *Macromolecules.* 43:8282-8289.
Wang et al. (Mar. 14, 2011) "Bioinspired Colloidal Photonic Crystals with Controllable Wettability," *Acc. Chem. Res.* 44:405-415.
Westphalen, et al. (1999), "Metal Cluster Enhanced Organic Solar Cells," *Solar Energy Materials & Solar Cells* 61 (2000) 97-105.
Xia et al. (2009) "Efficient synthesis of narrowly dispersed brush copolymers and study of their assemblies: the importance of side chain arrangement," *J. Am. Chem. Soc.* 131:18525-18532.
Xia et al. (2009) "Efficient Synthesis of Narrowly Dispersed Brush Polymers via Living Ring-Opening Metathesis Polymerization of Macromonomers," *Macromolecules.* 42:3761-3766.
Xu et al. (Nov. 24, 2011) "Fabrication of Silicon Oxide Nanodots with an Areal Density Beyond 1 Teradots Inch$^{-2}$," *Adv. Mater.* 22:5755.
Yang et al. (2010), "Supramolecular ABC Triblock Copolymers via One-Pot, Orthogonal Self-Assembly", J. Am. Chem. Soc. 2010, vol. 132, pp. 1637-1645.
Yamaguchi et al. (2001) "A Phase Diagram for the Binary Blends of Nearly Symmetric Diblock Copolymers. 1. Parameter Space of Molecular Weight Ratio and Blend Composition," *Macromolecules.* 34:6495-6505.
Yashima et al. (2009) "Helical Polymers: Synthesis, Structures, and Functions," *Chem. Rev.* 109:6102-6211.
Yoon et al. (2005) "Self-Assembly of Block Copolymers for Photonic-Bandgap Materials," MRS Bull. 2005, 30, 721-726.
Yoon et al. (2006) "Optically Transparent and High Molecular Weight Polyolefin Block Copolymers toward Self-Assembled Photonic Band Gap Materials," *Macromolecules.* 39:1913-1919.
Yoon et al. (2008) "Thermochromic Block Copolymer Photonic Gel," *Macromolecules.* 41:4582-4584.
Zalusky et al. (2002) "Ordered Nanoporous Polymers from Polystyrene-Polylactide Block Copolymers," *J. Am. Chem. Soc.* 124:12761-12773.
Zhang et al. (2005) "Cylindrical Polymer Brushes," *J. Polym. Sci. Part A: Polym. Chem.* 43:3461-3481.
Zhulina "Polymer brushes: Polymers in Soft and Biological Matter" Jul. 30-Aug. 1, 2012, Boulder CO, USA, Institute of Macromolecular Compounds, Russian Academy of Sciences, St. Petersburg, Russia.
Zhulina "Polymer brushes: Simple Views on Polymers at Surfaces and Interfaces: Simposium Honoring P.-G. de Gennes", APS meeting, Mar. 13, 2008, New Orleans USA, Institute of Macromolecular Compounds, Russian Academy of Sciences, St. Petersburg, Russia.
Office Action corresponding to U.S. Appl. No. 13/800,646 dated Mar. 13, 2015.
Eberhardt, M. et al. (2005) "Synthesis of Active Ester Polymers and Block Copolymers via Controlled Radical Polymerization," Polymer Preprints vol. 41(1), pp. 100-101.

\* cited by examiner

PERIODIC NANOSTRUCTURES FROM SELF ASSEMBLED WEDGE-TYPE BLOCK-COPOLYMERS

CROSS-REFERENCE TO RELATED APPLICATIONS

This application claims the benefit of priority from U.S. Provisional Patent Application No. 61/610,379, filed Mar. 13, 2012, and U.S. Provisional Patent Application No. 61/736,421, filed Dec. 12, 2012, each of which is hereby incorporated by reference in its entirety.

STATEMENT REGARDING FEDERALLY SPONSORED RESEARCH OR DEVELOPMENT

This invention was made with government support under DE-FG02-05ER46218 awarded by the Department of Energy and support under GM031332 awarded by the National Institutes of Health. The government has certain rights in the invention.

BACKGROUND OF INVENTION

Well-defined, periodic nanostructures have received considerable attention since they can be served as useful templates and scaffolds for nanodots, nanowires, magnetic storage media, semiconductors, optical devices, polarizers, and photonic materials [1]. For this purpose, bottom-up approaches have extensively been studied because they can offer an efficient, cost-effective strategy to overcome the technological and economic limits associated with large-scale top-down approaches [1 k]. The self-assembly of block copolymers (BCPs) [1 k, 2], one of the most promising candidates for this purpose, have widely been studied as the sizes, spacings, and morphologies of the nanostructures from the self-assembled BCPs can be simply tuned by varying molecular weight and composition ratio of BCPs and, more importantly, the versatilities in the properties of the blocks can be easily introduced by many well-known chemical techniques.

For some practical applications like polarizers and photonic band gap materials for visible wavelengths, the alternating domain spacing of the self-assembled BCPs usually has to be up to a few hundred nanometers. Thomas and coworkers utilized the partially cross-linked, conventional BCPs to prepare the photonic band gap materials for visible wavelengths [3], but this normally requires the molecular weight (MW) of BCPs to be extremely large for the applications mentioned above. It is noted that, according to the model system for polymers with the MW over the critical entanglement MW [4], the viscosity of polymers gets higher abruptly as the MW gets larger due to polymer chain-entanglement, which yields a significant kinetic barrier for the effective self-assembly of conventional BCPs with high MW [2c, 3, 5]. For this reason, the defects might not be able to be effectively annihilated even upon longer annealing time due to the entanglement, and there could be degradation of polymer chains upon thermal treatment due to significantly increased annealing temperature and time to overcome the kinetic barrier.

Brush polymers (also called comb or graft polymers) are defined as grafted polymers with both relatively high MW and significantly dense and regularly spaced side brush chains attached to the backbone [6]. Due to the significant steric hindrance between densely grafted side brush chains, brush polymers have a highly extended backbone and exhibit a reduced degree of chain-entanglement compared to conventional polymers. Therefore, it is often favorable for brush polymers to self-assemble into well aligned and ordered nanostructures even though the MW of brush polymers is relatively high. There are three general methods to make brush polymers. In the "grafting from" approach, a macro-initiator backbone is first synthesized but there are limitations in the efficiency of its initiation and conversion of monomers. The "grafting onto" method, where the side chains and the backbone are separately synthesized and then coupled together, have difficulties in obtaining complete grafting due to increasing steric hindrance and the subsequent purification of unreacted brush side chains can be problematic [6d, 6e, 6g, 7]. In the "grafting through" method, which is also called the "Macromonomer (MM) approach" the side chains are synthesized with a polymerizable end group which is subsequently polymerized. This approach has many advantages over those 'graft from' or 'graft onto' approaches, but still contains drawbacks like not being able to obtain high MW and/or narrow polydispersity index (PDI) [8]. Recently, Grubbs and coworkers successfully reported a novel ring-opening metathesis polymerization (ROMP) exploiting the high ring strain of norbornene monomer and the high activity of Ru-based olefin metathesis catalyst to synthesize brush polymers with ultra-high MW, narrow PDI, and well-defined, structural architectures [6f]. It is noted that, when two different brush side chains, where the difference in polymer interaction parameters is large enough to induce micro-phase segregation, are used to prepare blocky or random type of brush polymers with ultra-high MW, one, two, or three dimensionally periodic nanostructures with extremely large feature sizes can be very easily achieved, due to the significantly reduced degree of entanglements.

While BCPs have been previously used to make periodic dielectric media, the use of brush copolymers has not been extensively studied before now. There have been a couple of observations made in past publications. Bowden et al. reported in 2007 that they observed one of their block copolymers, that was combined of one grafted block and one linear block, reflecting blue light (and transmitting yellow light) and upon swelling with solvent, as is common with linear polymers, they were able to observe a red color. That system was still limited by the high degree of polymerization (≈450:2000) of the graft:linear block required to observe this optical property [6d]. Rzayev reported in 2009 that one of his brush block copolymers appeared to reflect blue light indicating interaction with visible light [6g]. In 2009 we noted that we saw one of our brush block copolymers reflect green light but no further analysis or discussion was made apart from that simple observation [6f].

It will be apparent from the foregoing description that block copolymer materials exhibiting useful physical, chemical and optical properties are useful for a range of applications including photonics, optoelectronics, and molecular templates and scaffolding. Specifically block copolymer materials are needed that are capable of efficient self-assembly to generate useful periodic structures with domain lengths in the nanometer range and exhibiting optical functionality in the visible and NIR regions of the electromagnetic spectrum.

SUMMARY OF THE INVENTION

The invention provides a class of wedge-type block copolymers having a plurality of chemically different blocks, at least a portion of which incorporates a wedge group-containing block providing useful properties. For example, use of one or more wedge group-containing blocks in some block copolymers of the invention significantly inhibits chain entanglement and, thus, the present block copolymers materials provide a class of polymer materials capable of efficient molecular self-assembly to generate a range of structures, such as periodic nanostructures and microstructures. For example, incorporation of a wedge group-containing block in some of the block copolymers the invention provides a means of imparting steric properties resulting in a highly extended polymer backbone configuration allowing for rapid self-assembly to stacked lamellae of alternating layers of block-copolymer component providing useful photonic materials. Materials of the present invention include copolymers having one or more wedge group-containing blocks, and optionally for some applications copolymers also incorporating one or more polymer side group-containing blocks. The present invention also provides useful methods of making and using wedge-type block copolymers.

In an aspect, the invention provides a wedge-type block copolymer comprising: (i) a first polymer block comprising at least 10 first repeating units; wherein each of the repeating units of the first polymer block comprises a first polymer backbone group covalently linked to a first wedge group characterized by at least two branch points each terminating in an independent terminating branch moiety comprising at least 4 atoms; and (ii) a second polymer block comprising at least 10 second repeating units; the second polymer block directly or indirectly covalently linked to the first polymer block along a backbone of the wedge-type block copolymer; wherein each of the repeating units of the second polymer block comprises a second polymer backbone group covalently linked to a first polymer side chain group or a second wedge group different from the first wedge group. In embodiments, the second polymer block of block copolymers of this aspect has a different chemical composition than the first polymer block and can be a wedge group-containing block or a polymer side chain-containing group. In an embodiment, for example, a copolymer of the invention comprises 10 to 2000 of the first repeating units and 10 to 2000 of the second repeating units, optionally for some embodiments 100 to 2000 of the first repeating units and 100 to 2000 of the second repeating units and optionally for some embodiments 500 to 2000 of the first repeating units and 500 to 2000 of the second repeating units.

In an embodiment, the first and second blocks of the wedge-type block copolymers provide steric interactions and/or bulk that enforces the rigidity of the backbone, for example, resulting in an extended polymer backbone. Wedge-type block copolymers of the invention may further comprises additional blocks directly or indirectly linked to the first and second blocks, such as one or more additional wedge-group containing blocks, one or more additional polymer side chain-containing blocks and/or one or more additional wedge-group containing blocks and one or more additional polymer side chain-containing blocks. In an embodiment, for example, a copolymer of the invention has a molecular weight selected from the range of 100,000 Da up to 30,000,000 Da, optionally for some embodiments 500,000 Da up to 30,000,000 Da and optionally for some embodiments 1,000,000 Da up to 30,000,000 Da.

In an embodiment, for example, a the wedge-type block copolymer of claim 1 has the formula (FX1a), (FX1b), (FX1c) or (FX1d):

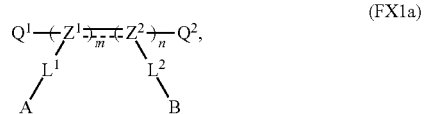
(FX1a)

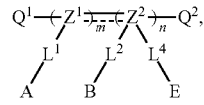
(FX1b)

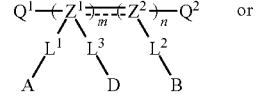
(FX1c)

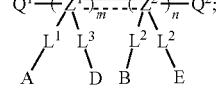
(FX1d)

wherein: $Z^1$ is the first polymer backbone group and $Z^2$ is the second polymer backbone group; $Q^1$ is a first backbone terminating group and $Q^2$ is a second backbone terminating group; $L^1$ is a first linking group, $L^2$ is a second linking group, $L^3$ is a third linking group and $L^4$ is a fourth linking group; A and D are each independently a wedge group, wherein A is the first wedge group; B and E are each independently a polymer side chain group or a wedge group, wherein B is the first polymer side chain group or the second wedge group; and each of n and m is independently an integer selected from the range of 20 to 2000. Optionally, for some embodiments m is an integer selected from the range of 100 to 2000 and n is an integer selected from the range of 100 to 2000. In an embodiment, for example, the ratio of m to n in any of formula (FX1a)-(FX1d) is selected over the range of 0.1 to 10, and optionally for some embodiments over the range of 0.5 to 2.

Wedge-type block copolymers of the invention may incorporate a broad range of polymer backbone groups, including polymer back bone groups capable of assuming an extended backbone configuration. In an embodiment, for example, the first wedge groups of the first polymer side chain groups or the second wedge groups of the second polymer block provide steric, bulk or interactions within the wedge-type block copolymer resulting in the backbone of the wedge-type block copolymer being an extended backbone. In an embodiment, the invention provides a wedge-type block copolymer having any of formula (FX1a)-(FX1d), wherein $Z^1$ and $Z^2$ are same polymer backbone group, for example, providing blocks that differ via the composition of the wedge groups or polymer side chain groups linked to the polymer backbone group. In an embodiment, the invention provides a wedge-type block copolymer having formula (FX1), wherein $Z^1$ and $Z^2$ are not the same polymer backbone group, for example, providing first and second polymer blocks that differ via the composition of the wedge groups or polymer side chain groups in addition to having different polymer backbone groups. In an embodiment, the invention provides a wedge-type block copolymer having any of formula (FX1a)-(FX1d), wherein $Z^1$ and $Z^2$ are derived from polymerization of a monomer selected from the group consisting of a substituted or unsubstituted norbornene, olefin or cyclic olefin, such as norbornene, norbornene anhydride, cyclooctene, cyclopentadiene, styrene, ester, ether, thioether, amine, imide, halocarbon chain (perfluoro, etc.) and acrylate.

The invention includes wedge-type block copolymers comprising blocks having the same or different sizes, for example, block copolymers wherein first and second polymer blocks are the same length, or alternatively wherein the first polymer block is larger than the second polymer block, or alternatively wherein the second polymer block is larger than the first polymer block. In an embodiment, for example, the invention provides a wedge-type block copolymer having any of formula (FX1a)-(FX1d), wherein m is greater than or equal to 10 and wherein n is greater than or equal to 10. Optionally, in embodiments, m is greater than or equal to 100. Optionally, in embodiments, n is greater than or equal to 100. In an embodiment, for example, the invention provides a wedge-type block copolymer having any of formula (FX1a)-(FX1d), wherein the ratio of m to n is selected from the range of 0.1 to 10, or optionally 0.2 to 5 for some embodiments.

In an embodiment, the invention provides a wedge-type block copolymer having the formula (FX2a), (FX2b), FX2c) or (FX2d):

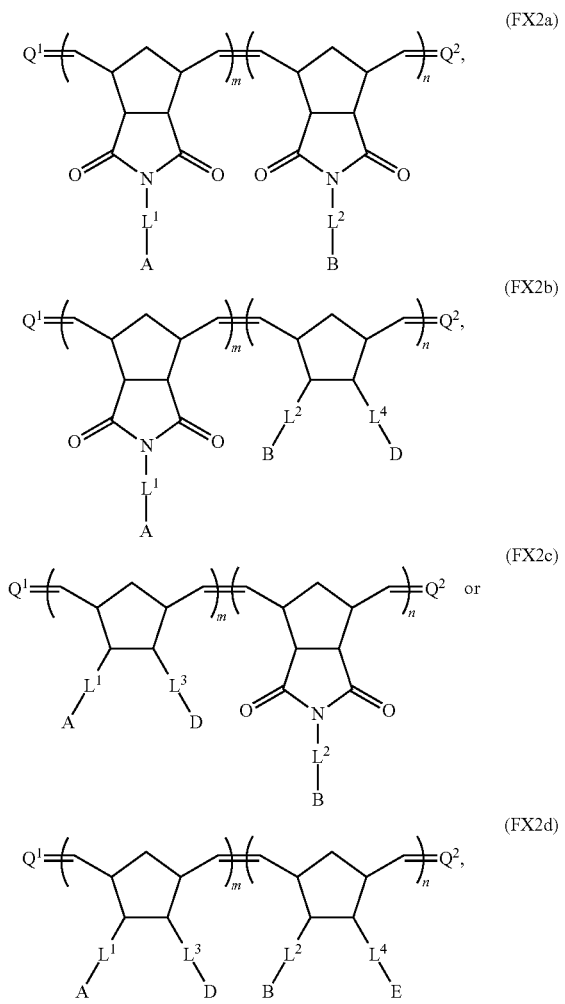

wherein $Q^1$, $Q^2$, m, n, $L^1$, $L^2$, $L^3$, $L^4$, A, B, D and E are as defined in connection with formula (FX1a)-(FX1d).

The composition and physical properties of the wedge groups of block copolymers of the invention are important to providing materials exhibiting useful chemical, physical and optical properties. For example, wedge-type block copolymers of the invention having a first block comprising a first wedge group that is chemically dissimilar to the second wedge groups or polymer side chain group is beneficial to allow for efficient molecular self-assembly into useful structures, such as nanostructures and microstructures character- ized by a domain length greater than or equal to 80 nm, optionally for some embodiments greater than or equal to 160 nm. In an embodiment, for example, the first wedge group is large enough to result in the backbone of the wedge-type block copolymer being an extended backbone. In an embodiment, for example, the first wedge group is characterized by at least three branch points each terminating in an independent terminating branch moiety comprising at least 10 atoms. In an embodiment, for example, the first wedge group has a molecular weight selected over the range of 15 Da to 1500 Da, optionally selected over the range of 50 Da to 1500 Da. In an embodiment, for example the first wedge group has a molecular weight greater than or equal to 50 Da, optionally for some embodiments greater than or equal to 100 Da, optionally for some embodiments greater than or equal to 500 Da. In an embodiment, for example, each of the terminating branch moieties of the first wedge group independently has a number of atoms selected from the range of 10 to 500, optionally selected from the range of 10 to 200, and optionally selected from the range of 10 to 200. In an embodiment, for example, each of the terminating branch moieties of the first wedge group independently has at least 10 atoms. In an embodiment, for example, the first wedge group is cross linked to the first polymer side chain group or the second wedge group.

Useful wedge groups for block copolymers of the invention can have a wide range of chemical compositions. In an embodiment, for example, the first wedge group comprises a $C_2$-$C_{30}$ alkyl, $C_3$-$C_{30}$ cycloalkyl, $C_5$-$C_{30}$ aryl, $C_5$-$C_{30}$ heteroaryl, $C_2$-$C_{30}$ ester, $C_2$-$C_{30}$ ether, $C_2$-$C_{30}$ thioether, $C_2$-$C_{30}$ amine, $C_2$-$C_{30}$ imide, $C_2$-$C_{30}$ halocarbon chain, $C_2$-$C_{30}$ perfluorocarbon or $C_2$-$C_{30}$ polyethylene glycol. In an embodiment, for example, the first wedge group comprises an aromatic or alicyclic fused ring structure, such as a substituted or unsubstituted adamantine, silsesquioxane, norbornane, terpenoid, polyethylene glycol, borneol or a group derived from any of these.

In an embodiment, the invention provides wedge-type block copolymers of any of formula (FX1a)-(FX1d), wherein the first wedge group (A) has the formula (W1), (W2) or (W3):

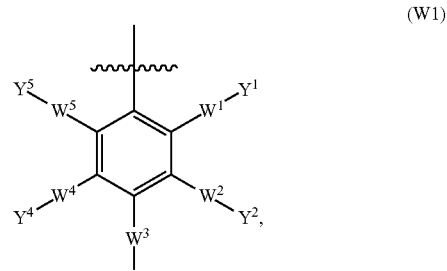

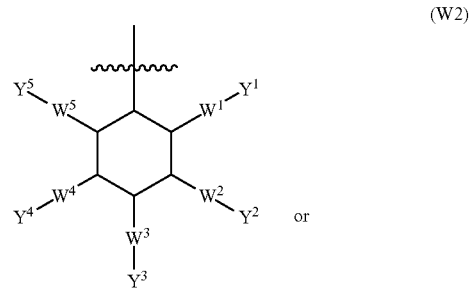

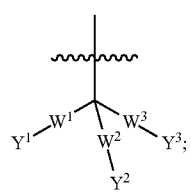
(W3)

wherein each of $W^1$-$W^5$ is independently a linking group; and each of $Y^1$-$Y^5$ is independently a hydrogen, $C_1$-$C_{30}$ alkyl, $C_3$-$C_{30}$ cycloalkyl, $C_5$-$C_{30}$ aryl, $C_5$-$C_{30}$ heteroaryl, $C_1$-$C_{30}$ acyl, $C_1$-$C_{30}$ hydroxyl, $C_1$-$C_{30}$ alkoxy, $C_2$-$C_{30}$ alkenyl, $C_2$-$C_{30}$ alkynyl, $C_5$-$C_{30}$ alkylaryl, —$CO_2R^{30}$, —$CONR^{31}R^{32}$, —$COR^{33}$, —$SOR^{34}$, —$OSR^{35}$, —$SO_2R^{36}$, —$OR^{37}$, —$SR^{38}$, —$NR^{39}R^{40}$, —$NR^{41}COR^{42}$, $C_1$-$C_{30}$ alkyl halide, phosphonate, phosphonic acid, silane, siloxane, silsesquioxane, $C_2$-$C_{30}$ halocarbon chain, $C_2$-$C_{30}$ perfluorocarbon, or $C_2$-$C_{30}$ polyethylene glycol; wherein each of $R^{30}$-$R^{42}$ is independently hydrogen, $C_5$-$C_{10}$ aryl or $C_1$-$C_{10}$ alkyl. Optionally, at least two of $Y^1$-$Y^5$ is independently is a substituted or unsubstituted $C_1$-$C_{30}$ alkyl, $C_3$-$C_{30}$ cycloalkyl, $C_5$-$C_{30}$ aryl or $C_5$-$C_{30}$ heteroaryl. Embodiments wherein any of $W^1$-$W^{10}$ is independently a single bond refers to polymers wherein a group, such as $Y^1$-$Y^{10}$, is directly linked via a single bond to an adjacent moiety, such as an aromatic group (e.g., benzyl) or an alicyclic group (e.g., cyclohexane group). In an embodiment, for example, any of $W^1$-$W^5$, is independently $C_1$-$C_{10}$ alkylene, $C_3$-$C_{10}$ cycloalkylene, $C_2$-$C_{10}$ alkenylene, $C_3$-$C_{10}$ cycloalkenylene, $C_2$-$C_{10}$ alkynylene, ethenylene, ethynylene, or phenylene. In an embodiment, for example, each of $W^1$-$W^5$ is independently $C_1$-$C_5$ alkylene.

In an embodiment, the invention provides a wedge-type block copolymer of any of formula (FX1a)-(FX1d), wherein the first wedge group (A) has the formula (W4), (W5), (W6), (W7), (W8), (W9) or (W10):

W4

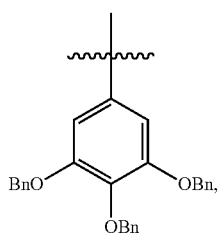

W5

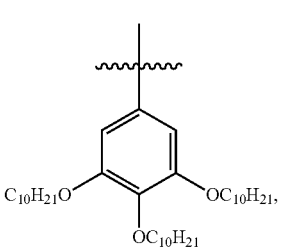

W6

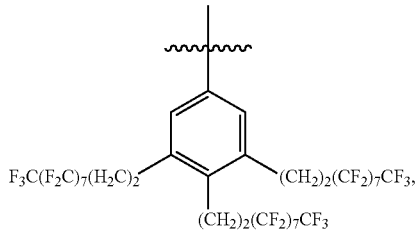

W7

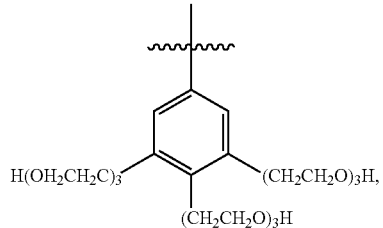

W8

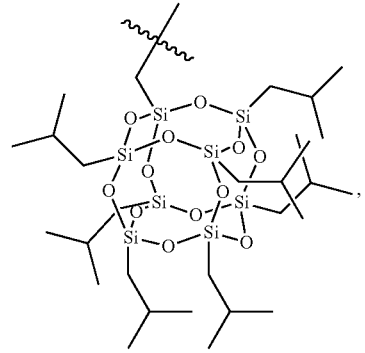

(W9)

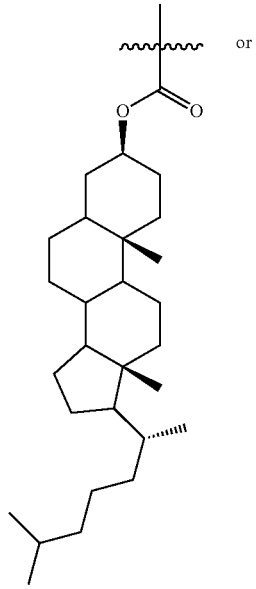

(W10)

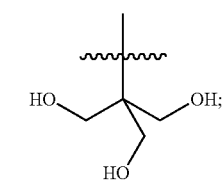

wherein Bn is a benzyl group. In an embodiment, the invention provides a wedge-type block copolymer having the formula (FX3a), (FX3b) or (FX3c):

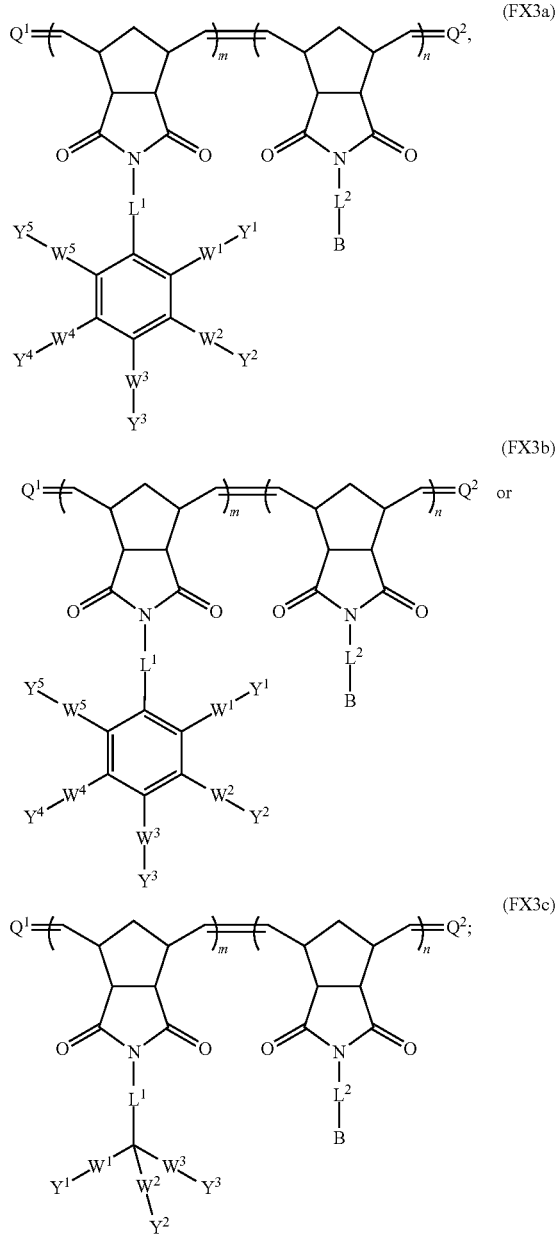

wherein each of $W^1$-$W^5$ is independently a linking group; each of $Y^1$-$Y^5$ is independently a hydrogen, $C_1$-$C_{30}$ alkyl, $C_3$-$C_{30}$ cycloalkyl, $C_5$-$C_{30}$ aryl, $C_5$-$C_{30}$ heteroaryl, $C_1$-$C_{30}$ acyl, $C_1$-$C_{30}$ hydroxyl, $C_1$-$C_{30}$ alkoxy, $C_2$-$C_{30}$ alkenyl, $C_2$-$C_{30}$ alkynyl, $C_5$-$C_{30}$ alkylaryl, —$CO_2R^{30}$, —$CONR^{31}R^{32}$, —$COR^{33}$, —$SOR^{34}$, —$OSR^{35}$, —$SO_2R^{36}$, —$OR^{37}$, —$SR^{38}$, —$NR^{39}R^{40}$, —$NR^{41}COR^{42}$, $C_1$-$C_{30}$ alkyl halide, phosphonate, phosphonic acid, silane, siloxane, silsesquioxane, $C_2$-$C_{30}$ halocarbon chain, $C_2$-$C_{30}$ perfluorocarbon, or $C_2$-$C_{30}$ polyethylene glycol; wherein each of $R^{30}$-$R^{42}$ is independently hydrogen, $C_5$-$C_{10}$ aryl or $C_1$-$C_{10}$ alkyl; wherein $Q^1$, $Q^2$, m, n, $L^1$, $L^2$, and B are as defined in connection with formula (FX1a)-(FX1d). Optionally, at least two of $Y^1$-$Y^5$ is independently is a substituted or unsubstituted $C_1$-$C_{30}$ alkyl, $C_3$-$C_{30}$ cycloalkyl, $C_5$-$C_{30}$ aryl or $C_5$-$C_{30}$ heteroaryl. In an embodiment, the invention provides a wedge-type block copolymer wherein each of $W^1$-$W^5$ is independently a single bond, —$(CH_2)_q$—, —$(CH_2)_qO(CH_2)_r$—, —$(CH_2)_qS(CH_2)_r$—, —$(CH_2)_qO_2(CH_2)_r$—, —$(CH_2)_qSO(CH_2)_r$—, —$(CH_2)_qSO_2(CH_2)_r$—, —$(CH_2)_qSO_3(CH_2)_r$—, —$(CH_2)_qOSO_2(CH_2)_r$—, —$(CH_2)_qNR^{19}(CH_2)_r$—, —$(CH_2)_qCO(CH_2)_r$—, —$(CH_2)_qCOO(CH_2)_r$—, —$(CH_2)_qOCO(CH_2)_r$—, —$(CH_2)_qOCOO(CH_2)_r$—, —$(CH_2)_qCONR^{20}(CH_2)_r$—, —$(CH_2)_qNR^{21}CO(CH_2)_r$—, —$(CH_2)_qOCONR^{22}(CH_2)_r$—, —$(CH_2)_qNR^{23}COO(CH_2)_r$—, or —$(CH_2)_qNR^{24}CONR^{25}(CH_2)_r$—; wherein each of $R^{19}$-$R^{25}$ is independently hydrogen, or $C_1$-$C_5$ alkyl; and wherein each of q and r is independently an integer selected from the range of 0 to 10.

In an embodiment, the invention provides a wedge type block copolymer having a dual wedge configuration, for example, wherein the first and second polymer blocks comprise wedge groups having different compositions. In an embodiment, the invention provides a wedge-type block copolymer having any of formula (FX1a)-(FX1d), wherein B is the second wedge group different from the first wedge group. In an embodiment, for example, the second wedge group is characterized by at least two branch points each terminating in an independent terminating branch moiety comprising at least 4 atoms. In an embodiment, for example, the second wedge block group has a molecular weight greater than or equal to 50 Da, optionally for some embodiments greater than or equal to 100 Da, optionally for some embodiments greater than or equal to 500 Da. In an embodiment, for example, the second wedge group is characterized by at least three branching points each terminating in an independent terminating branch moiety comprising at least 10 atoms. In an embodiment, for example, the second wedge group has a molecular weight selected over the range of 15 Da to 150 Da, optionally selected over the range of 15 Da to 1500 Da. In an embodiment, for example, each of the terminating branch moieties of the second wedge group independently has a number of atoms selected from the range of 10 to 500, optionally selected from the range of 10 to 200, and optionally selected from the range of 10 to 200. In an embodiment, for example, each of the terminating branch moieties of the second wedge group independently has a number of atoms selected from the range of 10 to 100. In an embodiment, for example, the second wedge group comprises a $C_1$-$C_{30}$ alkyl, $C_3$-$C_{30}$ cycloalkyl, $C_5$-$C_{30}$ aryl or $C_5$-$C_{30}$ heteroaryl. In an embodiment, for example, the first wedge group comprises an aromatic or alicyclic fused ring structure, such as a substituted or unsubstituted adamantine, silsesquioxane, norbornane, terpenoid, polyethylene glycol or borneol.

In an embodiment, the second polymer group comprises a second wedge group having any of formula (W1)-(W3) as described above in the context of the first wedge group, including all the variations and species described herein. In an embodiment, the second polymer group comprises a second wedge group having any of formula (W4)-(W10) as described above in the context of the first wedge group, including all the variations and species described herein.

In an embodiment, for example, the invention provides a wedge-type block copolymer having the formula (FX4):

(FX4)

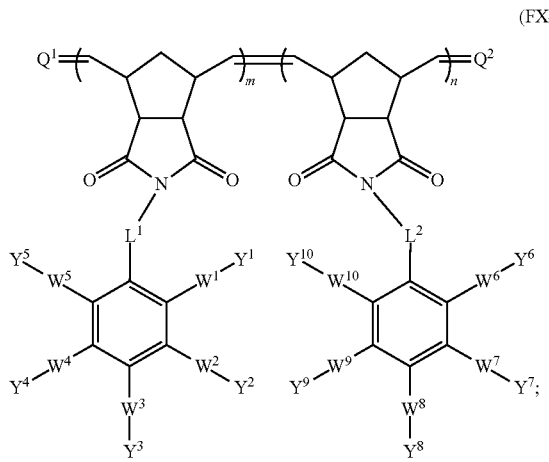

(FX5)

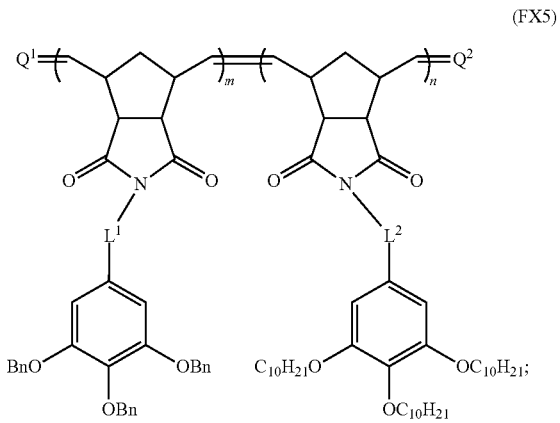

wherein each of $W^1$-$W^{10}$ is independently a linking group; and each of $Y^1$-$Y^{10}$ independently a hydrogen, $C_1$-$C_{30}$ alkyl, $C_3$-$C_{30}$ cycloalkyl, $C_5$-$C_{30}$ aryl, $C_5$-$C_{30}$ heteroaryl, $C_1$-$C_{30}$ acyl, $C_1$-$C_{30}$ hydroxyl, $C_1$-$C_{30}$ alkoxy, $C_2$-$C_{30}$ alkenyl, $C_2$-$C_{30}$ alkynyl, $C_5$-$C_{30}$ alkylaryl, —$CO_2R^{30}$, —$CONR^{31}R^{32}$, —$COR^{33}$, —$SOR^{34}$, —$OSR^{35}$, —$SO_2R^{36}$, —$OR^{37}$, —$SR^{38}$, —$NR^{39}R^{40}$, —$NR^{41}COR^{42}$, $C_1$-$C_{30}$ alkyl halide, phosphonate, phosphonic acid, silane, siloxane, silsesquioxane, $C_2$-$C_{30}$ halocarbon chain, $C_2$-$C_{30}$ perfluorocarbon, or $C_2$-$C_{30}$ polyethylene glycol; wherein each of $R^{30}$-$R^{42}$ is independently hydrogen, $C_5$-$C_{10}$ aryl or $C_1$-$C_{10}$ alkyl; and wherein at least a portion of $Y^1$-$Y^5$ are different than $Y^6$-$Y^{10}$, and wherein $Q^1$, $Q^2$, m, n, $L^1$, and $L^2$ are as defined in connection with formula (FX1a)-(FX1d). In an embodiment, for example, at least two of $Y^1$-$Y^5$ are different than at least two of $Y^6$-$Y^{10}$, optionally at least three of $Y^1$-$Y^5$ are different than at least three of $Y^6$-$Y^{10}$, and optionally wherein all of $Y^1$-$Y^5$ are different than $Y^6$-$Y^{10}$. Optionally, at least two of $Y^1$-$Y^5$ and at least two of $Y^6$-$Y^{10}$ are independently a substituted or unsubstituted $C_1$-$C_{30}$ alkyl, $C_3$-$C_{30}$ cycloalkyl, $C_5$-$C_{30}$ aryl or $C_5$-$C_{30}$ heteroaryl. In an embodiment, for example, each of $W^1$-$W^{10}$ in formula (FX4) is independently a single bond, —$(CH_2)_q$—, —$(CH_2)_qO(CH_2)_r$—, —$(CH_2)_qS(CH_2)_r$—, —$(CH_2)_qO_2(CH_2)_r$—, —$(CH_2)_qSO(CH_2)_r$—, —$(CH_2)_qSO_2(CH_2)_r$—, —$(CH_2)_qSO_3(CH_2)_r$—, —$(CH_2)_qOSO_2(CH_2)_r$—, —$(CH_2)_qNR^{19}(CH_2)_r$—, —$(CH_2)_qCO(CH_2)_r$—, —$(CH_2)_qCOO(CH_2)_r$—, —$(CH_2)_qOCO(CH_2)_r$—, —$(CH_2)_qOCOO(CH_2)_r$—, —$(CH_2)_qCONR^{20}(CH_2)_r$—, —$(CH_2)_qNR^{21}CO(CH_2)_r$—, —$(CH_2)_qOCONR^{22}(CH_2)_r$—, —$(CH_2)_qNR^{23}COO(CH_2)_r$—, or —$(CH_2)_qNR^{24}CONR^{25}(CH_2)_r$—; wherein each of $R^{19}$-$R^{25}$ is independently hydrogen, or $C_1$-$C_5$ alkyl; and wherein each of q and r is independently an integer selected from the range of 0 to 10. In an embodiment, for example, any of $W^1$-$W^{10}$, is independently $C_1$-$C_{10}$ alkylene, $C_3$-$C_{10}$ cycloalkylene, $C_2$-$C_{10}$ alkenylene, $C_3$-$C_{10}$ cycloalkenylene, $C_2$-$C_{10}$ alkynylene, ethenylene, ethynylene, or phenylene. In an embodiment, for example, each of $W^1$-$W^{10}$ is independently $C_1$-$C_5$ alkylene.

In an embodiment, for example, the invention provides a wedge-type block copolymer having the formula (FX5):

wherein $Q^1$, $Q^2$, m, n, $L^1$, and $L^2$ are as defined in connection with formula (FX1a)-(FX1d). In an embodiment, for example, the invention provides a wedge-type block copolymer having the formula (FX6):

(FX6)

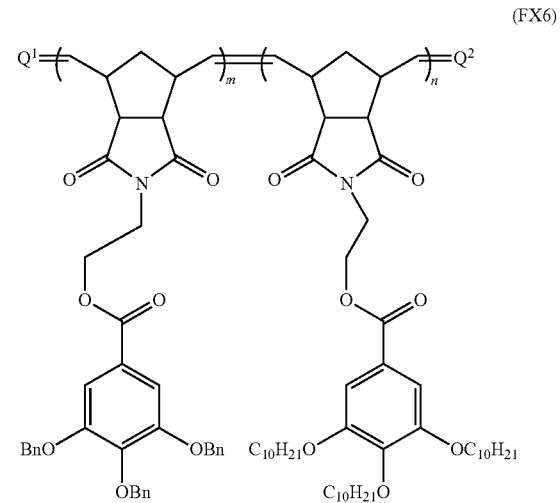

wherein $Q^1$, $Q^2$, m, and n are as defined in connection with formula (FX1a)-(FX1d).

In an embodiment, the invention provides a wedge type block copolymer having a hybrid wedge and polymer side chain configuration, for example, wherein the first polymer block comprises wedge groups and wherein the second block comprises polymer side chain blocks rather than a wedge blocks. In an embodiment, for example, the invention provides a wedge-type block copolymer having any of formula (FX1a)-(FX1d), wherein B is the first polymer side chain group. In an embodiment, for example, the first polymer side chain group has a molecular weight greater than or equal to 500 Da.

In an embodiment, for example, the invention provides a wedge-type block copolymer having formula (FX7):

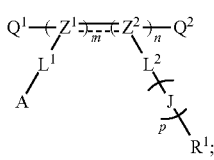

(FX7)

wherein J is a repeating group of the polymer side chain group; $R^1$ is a polymer side chain terminating group and wherein p is selected from the range of 35 to 2000 and wherein $Q^1$, $Q^2$, $Z^1$, $L^1$, $L^2$, A, m, and n are as defined in connection with formula (FX1a)-(FX1d).

The composition and physical properties of the polymer side chain groups of block copolymers of the invention are important to providing materials exhibiting useful chemical, physical and optical properties. For example, wedge-type block copolymers of the invention having a polymer side chain group that is chemically dissimilar to the first wedge group of the first polymer block is beneficial to allow for efficient molecular self-assembly into useful structures, such as nanostructures and microstructures characterized by a domain length greater than or equal to 80 nm, optionally for some embodiments greater than or equal to 160 nm. In an embodiment, for example, the polymer side chain group is large enough to result in the backbone of the wedge-type block copolymer being an extended backbone. In an embodiment, for example, the first polymer side chain group has a molecular weight greater than or equal to 500 Da, optionally for some embodiments greater than or equal to 1000 Da, and optionally for some embodiments greater than or equal to 5000 Da. In embodiments, for example, the first polymer side chain group has a molecular weight selected from the range of 500 Da to 30,000 Da, optionally selected over the range of 1000 to 30,000 Da or optionally selected over the range of 5000 to 30,000 Da. In an embodiment, for example, a repeating unit of the first polymer side chain group is a group corresponding to a lactide, styrene, acrylate, tert-butyl acrylate, methyl methacrylate, siloxane, dimethylsiloxane, n-butyl acrylate, ethylene glycol, ethylene oxide, ethylene, propylene, tetrafluoroethylene, or vinyl chloride.

In an embodiment, the invention provides a wedge-type block copolymer having the formula (FX8):

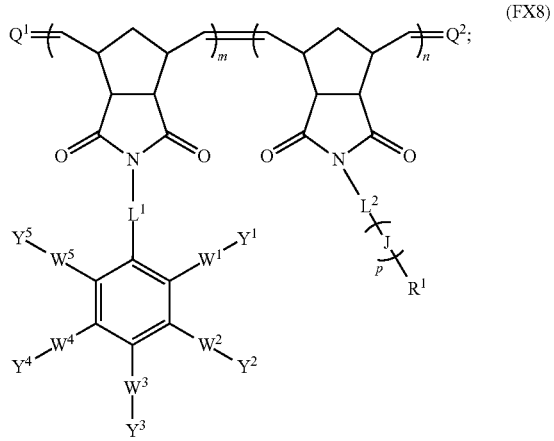

(FX8)

wherein each of $W^1$-$W^5$ is independently a linking group; each of $Y^1$-$Y^5$ is independently a hydrogen, $C_1$-$C_{30}$ alkyl, $C_3$-$C_{30}$ cycloalkyl, $C_5$-$C_{30}$ aryl, $C_5$-$C_{30}$ heteroaryl, $C_1$-$C_{30}$ acyl, $C_1$-$C_{30}$ hydroxyl, $C_1$-$C_{30}$ alkoxy, $C_2$-$C_{30}$ alkenyl, $C_2$-$C_{30}$ alkynyl, $C_5$-$C_{30}$ alkylaryl, —$CO_2R^{30}$, —$CONR^{31}R^{32}$, —$COR^{33}$, —$SOR^{34}$, —$OSR^{35}$, —$SO_2R^{36}$, —$OR^{37}$, —$SR^{38}$, —$NR^{39}R^{40}$, —$NR^{41}COR^{42}$, $C_1$-$C_{30}$ alkyl halide, phosphonate, phosphonic acid, silane, siloxane, silsesquioxane, $C_2$-$C_{30}$ halocarbon chain, $C_2$-$C_{30}$ perfluorocarbon, or $C_2$-$C_{30}$ polyethylene glycol; wherein each of $R^{30}$-$R^{42}$ is independently hydrogen, $C_5$-$C_{10}$ aryl or $C_1$-$C_{10}$ alkyl; wherein $Q^1$, $Q^2$, $L^1$, $L^2$, m, and n are as defined in connection with formula (FX1a)-(FX1d). Optionally, at least two of $Y^1$-$Y^5$ is independently is a substituted or unsubstituted $C_1$-$C_{30}$ alkyl, $C_3$-$C_{30}$ cycloalkyl, $C_5$-$C_{30}$ aryl or $C_5$-$C_{30}$ heteroaryl. In an embodiment, for example, each of $W^1$-$W^5$ is independently a single bond, —$(CH_2)_q$—, —$(CH_2)_qO(CH_2)_r$—, —$(CH_2)_qS(CH_2)_r$—, —$(CH_2)_qO_2(CH_2)_r$—, —$(CH_2)_qSO(CH_2)_r$—, —$(CH_2)_qSO_2(CH_2)_r$—, —$(CH_2)_qSO_3(CH_2)_r$—, —$(CH_2)_qOSO_2(CH_2)_r$—, —$(CH_2)_qNR^{19}(CH_2)_r$—, —$(CH_2)_qCO(CH_2)_r$—, —$(CH_2)_qCOO(CH_2)_r$—, —$(CH_2)_qOCO(CH_2)_r$—, —$(CH_2)_qOCOO(CH_2)_r$—, —$(CH_2)_qCONR^{20}(CH_2)_r$—, —$(CH_2)_qNR^{21}CO(CH_2)_r$—, —$(CH_2)_qOCONR^{22}(CH_2)_r$—, —$(CH_2)_qNR^{23}COO(CH_2)_r$—, or —$(CH_2)_qNR^{24}CONR^{25}(CH_2)_r$—; wherein each of $R^{19}$-$R^{25}$ is independently hydrogen, or $C_1$-$C_5$ alkyl; and wherein each of q and r is independently an integer selected from the range of 0 to 10. In an embodiment, for example, $R^1$ is hydrogen, $C_1$-$C_{10}$ alkyl, $C_3$-$C_{10}$ cycloalkyl, $C_5$-$C_{10}$ aryl, $C_5$-$C_{10}$ heteroaryl, $C_1$-$C_{10}$ acyl, $C_1$-$C_{10}$ hydroxyl, $C_1$-$C_{10}$ alkoxy, $C_2$-$C_{10}$ alkenyl, $C_2$-$C_{10}$ alkynyl, $C_5$-$C_{10}$ alkylaryl, —$CO_2R^{30}$, —$CONR^{31}R^{32}$, —$COR^{33}$, —$SOR^{34}$, —$OSR^{35}$, —$SO_2R^{36}$, —$OR^{37}$, —$SR^{38}$, —$NR^{39}R^{40}$, —$NR^{41}COR^{42}$, $C_1$-$C_{10}$ alkyl halide, phosphonate, phosphonic acid, silane, siloxane, acrylate or catechol; wherein each of $R^{30}$-$R^{42}$ is independently hydrogen or $C_1$-$C_5$ alkyl.

A wide range of linking groups are useful in the wedge-type block copolymers of the invention, for example, for linking wedge groups and/or polymer side chain groups to the polymer backbone groups. In some embodiments, for example, direct covalent linking is provided by a single bond between two linked groups, such as wedge groups and/or polymer side chain groups and a polymer backbone groups. In some embodiments, for example, indirect covalent linking is provided by a linking moiety provided between two linked groups, such as wedge groups and/or polymer side chain groups and a polymer backbone groups. In an embodiment, for example, the invention provides a wedge-type block copolymer of any of formula (FX1a)-(FX8), wherein each of $L^1$, $L^2$, $L^3$ and $L^4$ is independently a single bond, —$(CH_2)_q$—, —$(CH_2)_qO(CH_2)_r$—, —$(CH_2)_qS(CH_2)_r$—, —$(CH_2)_qO_2(CH_2)_r$—, —$(CH_2)_qSO(CH_2)_r$—, —$(CH_2)_qSO_2(CH_2)_r$—, —$(CH_2)_qSO_3(CH_2)_r$—, —$(CH_2)_qOSO_2(CH_2)_r$—, —$(CH_2)_qNR^{19}(CH_2)_r$—, —$(CH_2)_qCO(CH_2)_r$—, —$(CH_2)_qCOO(CH_2)_r$—, —$(CH_2)_qOCO(CH_2)_r$—, —$(CH_2)_qOCOO(CH_2)_r$—, —$(CH_2)_qCONR^{20}(CH_2)_r$—, —$(CH_2)_qNR^{21}CO(CH_2)_r$—, —$(CH_2)_qOCONR^{22}(CH_2)_r$—, —$(CH_2)_qNR^{23}COO(CH_2)_r$—, or —$(CH_2)_qNR^{24}CONR^{25}(CH_2)_r$—; wherein each of $R^{19}$-$R^{25}$ is independently hydrogen, or $C_1$-$C_5$ alkyl; and wherein each of q and r is independently an integer selected from the range of 0 to 10. In an embodiment, for example, the invention provides a wedge-type block copolymer of any of formula (FX1a)-(FX8), wherein each of $L^1$, $L^2$, $L^3$ and $L^4$ is independently $C_1$-$C_{10}$ alkylene, $C_3$-$C_{10}$ cycloalkylene, $C_2$-$C_{10}$ alkenylene, $C_3$-$C_{10}$ cycloalkenylene, $C_2$-$C_{10}$ alkynylene, ethenylene, ethynylene, or phenylene. In an embodiment, for example, the invention provides a wedge-type block copolymer of any of formula (FX1a) (FX8), wherein each of $L^1$, $L^2$, $L^3$ and $L^4$ is independently $C_1$-$C_5$ alkylene.

A wide range of backbone terminating groups are useful in the wedge-type block copolymers of the invention. In an embodiment, for example, the invention provides a wedge-type block copolymer of any of formula (FX1a) (FX8), wherein each of $Q^1$ and $Q^2$ is independently hydrogen, $C_1$-$C_{10}$ alkyl, $C_3$-$C_{10}$ cycloalkyl, $C_5$-$C_{10}$ aryl, $C_5$-$C_{10}$ heteroaryl, $C_1$-$C_{10}$ acyl, $C_1$-$C_{10}$ hydroxyl, $C_1$-$C_{10}$ alkoxy, $C_2$-$C_{10}$ alkenyl, $C_2$-$C_{10}$ alkynyl, $C_5$-$C_{10}$ alkylaryl, $-CO_2R^{30}$, $-CONR^{31}R^{32}$, $-COR^{33}$, $-SOR^{34}$, $-OSR^{35}$, $-SO_2R^{36}$, $-OR^{37}$, $-SR^{38}$, $-NR^{39}R^{40}$, $-NR^{41}COR^{42}$, $C_1$-$C_{10}$ alkyl halide, phosphonate, phosphonic acid, silane, siloxane, acrylate, or catechol; wherein each of $R^{30}$-$R^{42}$ is independently hydrogen, $C_1$-$C_{10}$ alkyl or $C_5$-$C_{10}$ aryl. In an embodiment, each of $R^{30}$-$R^{42}$ is independently hydrogen or $C_1$-$C_4$ alkyl.

The invention includes wedge-type block copolymers having more than two polymer blocks, such as wedge-type block copolymers having three polymer blocks, four polymer blocks or more than four polymer blocks. In some embodiments, the additional polymer blocks comprise wedge groups and/or polymer side chain groups. In some embodiments, the additional polymer blocks comprise the same wedge groups and/or polymer side chain groups as the first and second blocks. Alternatively, the additional polymer blocks comprise the different wedge groups and/or polymer side chain groups as the first and second blocks. Wedge-type block copolymers having additional polymer blocks are useful for generating a wide range of structures via self-assembly processes.

In an embodiment, for example, a wedge-type block copolymer of the invention further comprises a third polymer block comprising at least 10 third repeating units; the third polymer block indirectly or directly covalently linked to the first polymer block and the second polymer block along the backbone of the wedge-type block copolymer; wherein each of the repeating units of the third polymer block comprises a third polymer backbone group covalently linked to a second polymer side chain group or a third wedge group. In an embodiment, for example, a copolymer of the invention comprises 20 to 2000 of the third repeating units, optionally for some embodiments 100 to 2000 of the third repeating units and optionally for some embodiments 500 to 2000 of the third repeating units. In an embodiment, for example, the third polymer block is provided between the first polymer block and the second polymer block; or is provided on a side of the first polymer block opposite to the second polymer block; or is provided on a side of the second polymer block opposite to the first polymer block. In an embodiment, for example, the third polymer backbone group of the third polymer block is the same as the first polymer backbone group of the first polymer block; or wherein the third polymer backbone group of the third polymer block is the same as the second polymer backbone group of the second polymer block, or wherein the third polymer backbone group of the third polymer block is the same as the first polymer backbone group of the first polymer block and the second polymer backbone group of the second polymer block. In an embodiment, for example, the third wedge group of the third polymer block is different from the first wedge group of the first polymer block; or wherein the third wedge group of the third polymer block is different from the second wedge group of the second polymer block; or wherein the second polymer side chain group of the third polymer block is different from the first polymer side chain group of the second polymer block.

In an embodiment, for example, the invention provides a wedge-type block copolymer further comprises a fourth polymer block comprising at least 10 fourth repeating units; the fourth polymer block directly or indirectly covalently linked to the first polymer block, the second polymer block and the third polymer block along the backbone of the wedge-type block copolymer; wherein each of the repeating units of the fourth polymer block comprises a fourth polymer backbone group covalently linked to a third polymer side chain group or a fourth wedge group. In an embodiment, for example, a copolymer of the invention comprises 20 to 2000 of the fourth repeating units, optionally for some embodiments 100 to 2000 of the fourth repeating units and optionally for some embodiments 500 to 2000 of the fourth repeating units. In an embodiment, for example, the fourth polymer block is provided between the first polymer block and the second polymer block; or is provided between the first polymer block and the third polymer block; or is provided between the second polymer block and the third polymer block; or is provided on a side of the first polymer block opposite to the second polymer block; or is provided on a side of the first polymer block opposite to the third polymer block; or is provided on a side of the second polymer block opposite to the first polymer block; or is provided on a side of the second polymer block opposite to the third polymer block. In an embodiment, for example, the fourth polymer backbone group of the fourth polymer block is the same as the first polymer backbone group of the first polymer block; or wherein the fourth polymer backbone group of the fourth polymer block is the same as the second polymer backbone group of the second polymer block; or wherein the fourth polymer backbone group of the fourth polymer block is the same as the third polymer backbone group of the third polymer block; or wherein the fourth polymer backbone group of the fourth polymer block is the same as both the first polymer backbone group of the first polymer block and the second polymer backbone group of the second polymer block; or wherein the fourth polymer backbone group of the fourth polymer block is the same as both the first polymer backbone group of the first polymer block and the third polymer backbone group of the third polymer block; or wherein the fourth polymer backbone group of the fourth polymer block is the same as both the second polymer backbone group of the second polymer block and the third polymer backbone group of the third polymer block; or wherein the fourth polymer backbone group of the fourth polymer block is the same as the first polymer backbone group of the first polymer block, the second polymer backbone group of the second polymer block and the third polymer backbone group of the third polymer block. In an embodiment, for example, the fourth wedge group of the fourth polymer block is different from the first wedge group of the first polymer block; or wherein the fourth wedge group of the fourth polymer block is different from the second wedge group of the second polymer block; or wherein the fourth wedge group of the fourth polymer block is different from the third wedge group of the third polymer block; or wherein the third polymer side chain group of the fourth polymer block is different from the first polymer side chain group of the second polymer block; or wherein the third polymer side chain group of the fourth polymer block is different from the second polymer side chain group of the third polymer block.

In another aspect, the invention provides structures generated from wedge-type block copolymers, for example, structures generated from any of the block copolymer compositions and/or composition classes described herein. In an embodiment, a structure of the invention is generated via molecular self-assembly, or a similar process, thereby forming a supramolecular assembly comprising a plurality of wedge-type block copolymer of the invention.

In an embodiment, for example, the invention provides a structure comprising a supramolecular assembly of a plurality of wedge-type block copolymers; wherein each of the wedge-type block copolymers comprises: (i) a first polymer block comprising at least 10 first repeating units; wherein each of the repeating units of the first polymer block comprises a first polymer backbone group covalently linked to a first wedge group characterized by at least two branch points each terminating in an independent terminating branch moiety comprising at least 4 atoms; and (ii) a second polymer block comprising at least 10 second repeating units; the second polymer block directly or indirectly covalently linked to the first polymer block along a backbone of the wedge-type block copolymer; wherein each of the repeating units of the second polymer block comprises a second polymer backbone group covalently linked to a first polymer side chain group or a second wedge group different from the first wedge block group. In an embodiment, for example, the structure comprises a plurality of wedge-type block copolymers independently having any of the formulas (FX1a)-(FX8).

In an embodiment, for example, the structure of this aspect of the invention is formed via molecular self-assembly of the wedge-type block copolymers to generate the supramolecular assembly. In an embodiment, for example, the structure is formed via thermal annealing, solvent annealing and/or by the application of an external pressure.

In an embodiment, for example, the structure comprises a periodic structure. In an embodiment, for example, the structure comprises a nanostructure or a microstructure. In an embodiment, for example, the structure is characterized by at least one domain having a size greater than or equal to 80 nm, and optionally for some embodiments at least one domain having a size greater than 160 nm. In an embodiment, for example, the domain length corresponds to a periodic feature of the structure, optionally having a length greater than or equal to 80 nm, optionally for some embodiments greater than or equal to 160 nm. In an embodiment, for example, the structure absorbs, scatters or reflects electromagnetic radiation having wavelengths greater than or equal to 400 nm, optionally greater than or equal to 800 nm, such as visible and/or NIR electromagnetic radiation. In an embodiment, the structure is characterized by an optical thickness greater than or equal to 100 nm, and optionally greater than or equal to 200 nm. As used herein, optical thickness is equal to the product of the geometric thickness and the refractive index (e.g. optical thickness=(geometric thickness)×(refractive index).

In an embodiment, for example, the structure comprises a one dimensional, two dimensional or three dimensional photonic crystal. In an embodiment, for example, the wedge-type block copolymers that make up the structure are characterized by a polydispersity index selected over the range of 1 to 2, optionally for some embodiments selected over the range of 1 to 1.6. In an embodiment, for example, the structure is a stacked lamellar structure. In an embodiment, for example, the structure is characterized by a periodically varying refractive index. In an embodiment, for example, the structure further comprises an additive selected from the group consisting of a ceramic, metal, metal oxide, liquid, silicon, semiconductor and any mixture or combination of these, for example, wherein the additive is associated with only one of the blocks of the wedge-type block copolymer.

In another aspect, the invention provides a method of making a wedge-type block copolymer. In an embodiment, for example, the invention provides a method of making a wedge-type block copolymer comprising the steps of: (i) providing first polymer monomers each having a first polymer backbone group linked to a first wedge group characterized by at least two branch points each terminating in an independent terminating branch moiety comprising at least 4 atoms; (ii) polymerizing the first polymer monomers; (iii) providing second polymer monomers each having a second polymer backbone group linked to a first polymer side chain group or a second wedge group different from the first wedge block group; (iv) polymerizing the second polymer monomers, to form the wedge-type block copolymer having the formula (FX1a), (FX1b), (FX1c) or (FX1d):

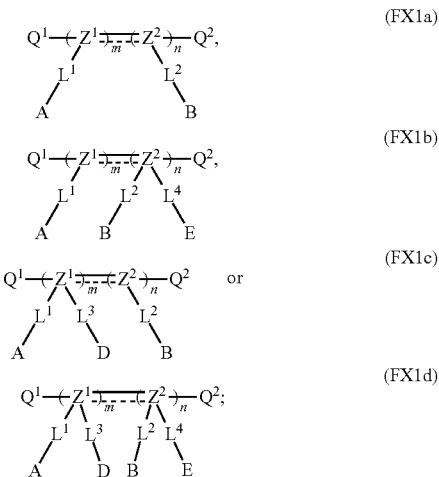

wherein: $Z^1$ is the first polymer backbone group and $Z^2$ is the second polymer backbone group; $Q^1$ is a first backbone terminating group and $Q^2$ is a second backbone terminating group; $L^1$ is a first linking group, $L^2$ is a second linking group, $L^3$ is a third linking group and $L^4$ is a fourth linking group; A and D are each independently a wedge group, wherein A is the first wedge group; B and E are each independently a polymer side chain group or a wedge group, wherein B is the first polymer side chain group or the second wedge group; and each of n and m is independently an integer selected from the range of 20 to 2000. In an embodiment, for example, the polymerization steps are carried out via ring opening polymerization or controlled radical polymerization. In an embodiment, for example, the polymerization steps are carried out in the presence of a Ru-based olefin metathesis catalyst. In an embodiment, for example, the method of the invention comprises a grafting through synthesis.

In an embodiment, the invention provides copolymers, such as block copolymers, generated by polymerization of one or more substituted or unsubstituted norbornene monomers. In an embodiment, the invention provides copolymers, such as block copolymers, generated by polymerization of one or more monomers selected from the group consisting of:

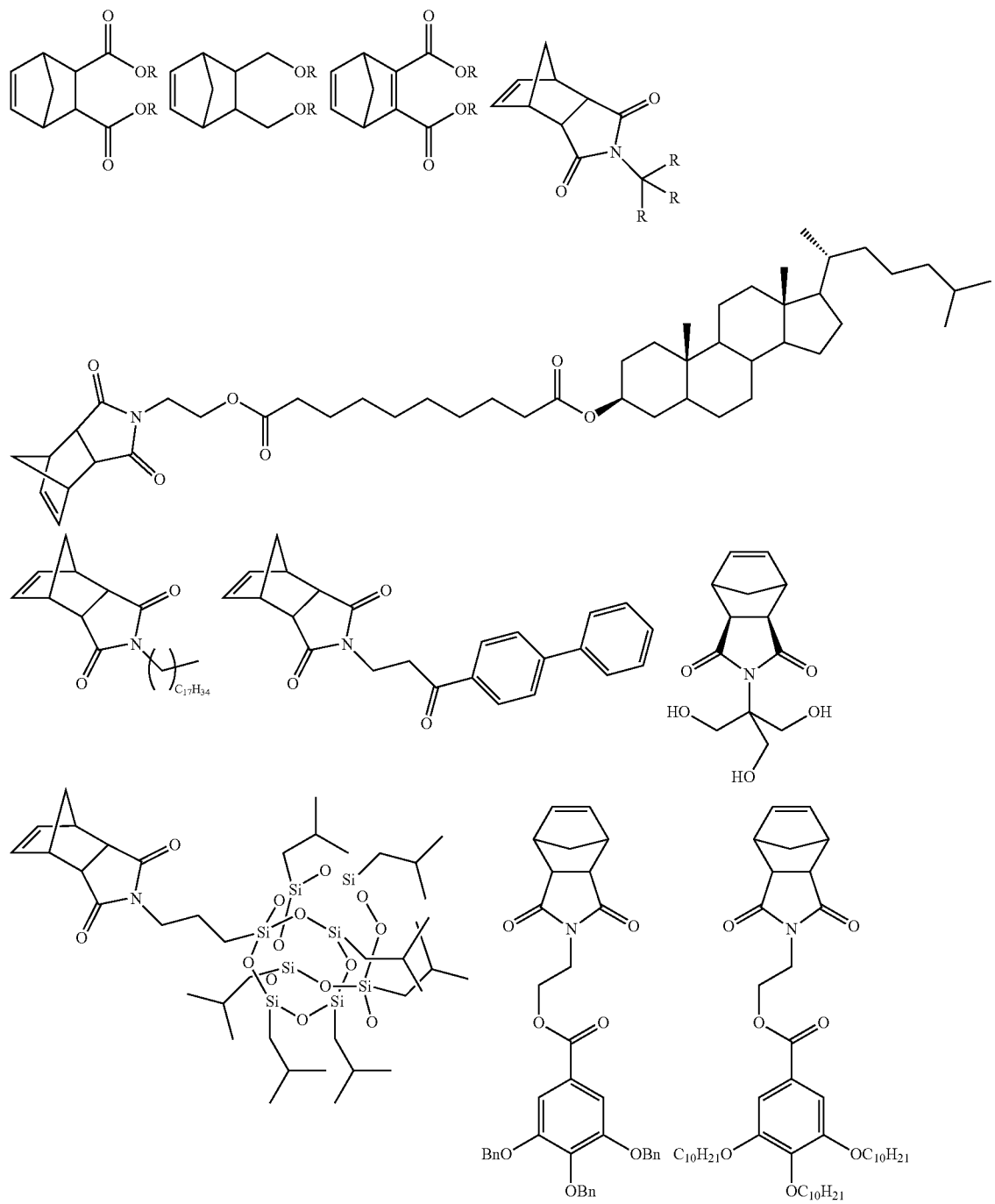

wherein each Bn is independently a substituted or unsubstituted benzyl group and wherein each R is independently a hydrogen, $C_1$-$C_{30}$ alkyl, $C_3$-$C_{30}$ cycloalkyl, $C_5$-$C_{30}$ aryl, $C_5$-$C_{30}$ heteroaryl, $C_1$-$C_{30}$ acyl, $C_1$-$C_{30}$ hydroxyl, $C_1$-$C_{30}$ alkoxy, $C_2$-$C_{30}$ alkenyl, $C_2$-$C_{30}$ alkynyl, $C_5$-$C_{30}$ alkylaryl, —$CO_2R^{30}$, —$CONR^{31}R^{32}$, —$COR^{33}$, —$SOR^{34}$, —$OSR^{35}$, —$SO_2R^{36}$, —$OR^{37}$, —$SR^{38}$, —$NR^{39}R^{40}$, —$NR^{41}COR^{42}$, $C_1$-$C_{30}$ alkyl halide, phosphonate, phosphonic acid, silane, siloxane, silsesquioxane, $C_2$-$C_{30}$ halocarbon chain, $C_2$-$C_{30}$ perfluorocarbon, or $C_2$-$C_{30}$ polyethylene glycol; wherein each of $R^{30}$-$R^{42}$ is independently hydrogen, $C_5$-$C_{10}$ aryl or $C_1$-$C_{10}$ alkyl.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

BRIEF DESCRIPTION OF THE DRAWINGS

FIG. 5. A schematic image of the main synthetic approaches to graft polymers, grafting to, grafting from and grafting through.

STATEMENTS REGARDING CHEMICAL COMPOUNDS AND NOMENCLATURE

Figure 1:
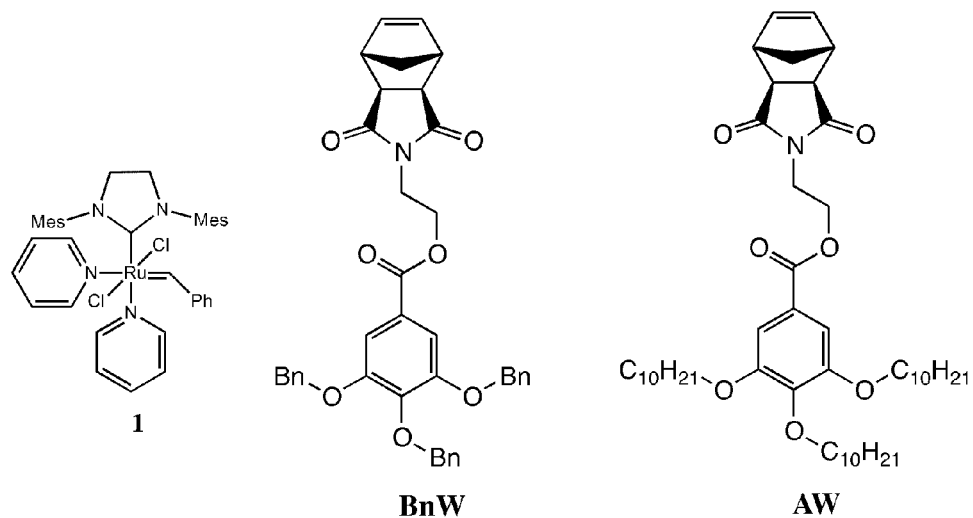
FIG. 1. Structures of initiator and monomers.

In an embodiment, a composition or compound of the invention is isolated or purified. In an embodiment, an isolated or purified compound is at least partially isolated or purified as would be understood in the art. In an embodiment, the composition or compound of the invention has a chemical purity of 95%, optionally for some applications 99%, optionally for some applications 99.9%, optionally for some applications 99.99%, and optionally for some applications 99.999% pure.

As used herein, the term "polymer" refers to a molecule composed of repeating structural units connected by covalent chemical bonds or the polymerization product of one or more monomers, often characterized by a high molecular weight. The term polymer includes homopolymers, or polymers consisting essentially of a single repeating monomer subunit. The term polymer also includes copolymers which are formed when two or more different types of monomers are linked in the same polymer. Copolymers may comprise two or more monomer subunits, and include random, block, alternating, segmented, grafted, tapered and other copolymers. Useful polymers include organic polymers or inorganic polymers that may be in amorphous, semi-amorphous, crystalline or partially crystalline states. Cross linked polymers having linked monomer chains are useful for some applications.

"Block copolymers" are a type of copolymer comprising blocks or spatially segregated domains, wherein different domains comprise different polymerized monomers, for example, including at least two chemically distinguishable blocks. Block copolymers may further comprise one or more other structural domains, such as hydrophobic groups, hydrophilic groups, etc. In a block copolymer, adjacent blocks are constitutionally different, i.e. adjacent blocks comprise constitutional units derived from different species of monomer or from the same species of monomer but with a different composition or sequence distribution of constitutional units. Different blocks (or domains) of a block copolymer may reside on different ends or the interior of a polymer (e.g. [A][B]), or may be provided in a selected sequence ([A][B][A][B]). "Diblock copolymer" refers to block copolymer having two different chemical blocks.

"Polymer backbone group" refers to groups that are covalently linked to make up a backbone of a polymer, such as a block copolymer. Polymer backbone groups may be linked to side chain groups, such as wedge groups and polymer side chain groups.

"Wedge group" refers to a group covalently linked to a polymer backbone group that comprises a branched moiety, optionally imparting steric properties to the polymer. In an embodiment, a wedge group of the present polymer materials and methods is not a polymer group. In an embodiment, for example, a wedge group is characterized by at least two branch points, optionally at least three, each terminating in an independent terminating branch moiety comprising at least 4 atoms, and optionally at least 10 atoms, and optionally at least 20 atoms and optionally at least 50 atoms. A wedge group may be directly or indirectly linked to the polymer back bone group. In some embodiments, wedge groups provide steric bulk and/or interactions that result in an extended polymer backbone and/or a rigid polymer backbone.

"Polymer side chain group" refers to a group covalently linked to a polymer backbone group that comprises a polymer side chain, optionally imparting steric properties to the polymer. In an embodiment, for example, a polymer side chain group is characterized by a plurality of repeating units having the same, or similar, chemical composition. A polymer side chain may terminate in a wide range of polymer side chain terminating group. A polymer side chain group may be directly or indirectly linked to the polymer back bone groups. In some embodiments, polymer side chain groups provide steric bulk and/or interactions that result in an extended polymer backbone and/or a rigid polymer backbone.

As used herein, the term "group" may refer to a functional group of a chemical compound. Groups of the present compounds refer to an atom or a collection of atoms that are a part of the compound. Groups of the present invention may be attached to other atoms of the compound via one or more covalent bonds. Groups may also be characterized with respect to their valence state. The present invention includes groups characterized as monovalent, divalent, trivalent, etc. valence states.

As used herein, the term "substituted" refers to a compound wherein a hydrogen is replaced by another functional group.

As is customary and well known in the art, hydrogen atoms in formulas (FX1a)-(FX8) and (W1)-(W10) are not always explicitly shown, for example, hydrogen atoms bonded to the carbon atoms of aromatic, heteroaromatic, and alicyclic rings are not always explicitly shown in formulas (FX1a)-(FX8) and (W1)-(W10). The structures provided herein, for example in the context of the description of formulas (FX1a)-(FX8) and (W1)-(W10), are intended to convey to one of reasonable skill in the art the chemical composition of compounds of the methods and compositions of the invention, and as will be understood by one of skill in the art, the structures provided do not indicate the specific positions of atoms and bond angles between atoms of these compounds.

As used herein, the terms "alkylene" and "alkylene group" are used synonymously and refer to a divalent group derived from an alkyl group as defined herein. The invention includes compounds having one or more alkylene groups. Alkylene groups in some compounds function as attaching and/or spacer groups. Compounds of the invention may have substituted and/or unsubstituted $C_1$-$C_{20}$ alkylene, $C_1$-$C_{10}$ alkylene and $C_1$-$C_5$ alkylene groups.

As used herein, the terms "cycloalkylene" and "cycloalkylene group" are used synonymously and refer to a divalent group derived from a cycloalkyl group as defined herein. The invention includes compounds having one or more cycloalkylene groups. Cycloalkyl groups in some compounds function as attaching and/or spacer groups. Compounds of the invention may have substituted and/or unsubstituted $C_3$-$C_{20}$ cycloalkylene, $C_3$-$C_{10}$ cycloalkylene and $C_3$-$C_5$ cycloalkylene groups.

As used herein, the terms "arylene" and "arylene group" are used synonymously and refer to a divalent group derived from an aryl group as defined herein. The invention includes compounds having one or more arylene groups. In some embodiments, an arylene is a divalent group derived from an aryl group by removal of hydrogen atoms from two intra-ring carbon atoms of an aromatic ring of the aryl group. Arylene groups in some compounds function as attaching and/or spacer groups. Arylene groups in some compounds function as chromophore, fluorophore, aromatic antenna, dye and/or imaging groups. Compounds of the invention include substituted and/or unsubstituted $C_3$-$C_{30}$ arylene, $C_3$-$C_{20}$ arylene, $C_3$-$C_{10}$ arylene and $C_1$-$C_5$ arylene groups.

As used herein, the terms "heteroarylene" and "heteroarylene group" are used synonymously and refer to a divalent group derived from a heteroaryl group as defined herein. The invention includes compounds having one or more heteroarylene groups. In some embodiments, a heteroarylene is a divalent group derived from a heteroaryl group by removal of hydrogen atoms from two intra-ring carbon atoms or intra-ring nitrogen atoms of a heteroaromatic or aromatic ring of the heteroaryl group. Heteroarylene groups in some compounds function as attaching and/or spacer groups. Heteroarylene groups in some compounds function as chromophore, aromatic antenna, fluorophore, dye and/or imaging groups. Compounds of the invention include substituted and/or unsubstituted $C_3$-$C_{30}$ heteroarylene, $C_3$-$C_{20}$ heteroarylene, $C_1$-$C_{10}$ heteroarylene and $C_3$-$C_5$ heteroarylene groups.

As used herein, the terms "alkenylene" and "alkenylene group" are used synonymously and refer to a divalent group derived from an alkenyl group as defined herein. The invention includes compounds having one or more alkenylene groups. Alkenylene groups in some compounds function as attaching and/or spacer groups. Compounds of the invention include substituted and/or unsubstituted $C_2$-$C_{20}$ alkenylene, $C_2$-$C_{10}$ alkenylene and $C_2$-$C_5$ alkenylene groups.

As used herein, the terms "cylcoalkenylene" and "cylcoalkenylene group" are used synonymously and refer to a divalent group derived from a cylcoalkenyl group as defined herein. The invention includes compounds having one or more cylcoalkenylene groups. Cycloalkenylene groups in some compounds function as attaching and/or spacer groups. Compounds of the invention include substituted and/or unsubstituted $C_3$-$C_{20}$ cylcoalkenylene, $C_3$-$C_{10}$ cylcoalkenylene and $C_3$-$C_5$ cylcoalkenylene groups.

As used herein, the terms "alkynylene" and "alkynylene group" are used synonymously and refer to a divalent group derived from an alkynyl group as defined herein. The invention includes compounds having one or more alkynylene groups. Alkynylene groups in some compounds function as attaching and/or spacer groups. Compounds of the invention include substituted and/or unsubstituted $C_2$-$C_{20}$ alkynylene, $C_2$-$C_{10}$ alkynylene and $C_2$-$C_5$ alkynylene groups.

As used herein, the term "halo" refers to a halogen group such as a fluoro (—F), chloro (—Cl), bromo (—Br), iodo (—I) or astato (—At).

The term "heterocyclic" refers to ring structures containing at least one other kind of atom, in addition to carbon, in the ring. Examples of such heteroatoms include nitrogen, oxygen and sulfur. Heterocyclic rings include heterocyclic alicyclic rings and heterocyclic aromatic rings. Examples of heterocyclic rings include, but are not limited to, pyrrolidinyl, piperidyl, imidazolidinyl, tetrahydrofuryl, tetrahydrothienyl, furyl, thienyl, pyridyl, quinolyl, isoquinolyl, pyridazinyl, pyrazinyl, indolyl, imidazolyl, oxazolyl, thiazolyl, pyrazolyl, pyridinyl, benzoxadiazolyl, benzothiadiazolyl, triazolyl and tetrazolyl groups. Atoms of heterocyclic rings can be bonded to a wide range of other atoms and functional groups, for example, provided as substituents.

The term "carbocyclic" refers to ring structures containing only carbon atoms in the ring. Carbon atoms of carbocyclic rings can be bonded to a wide range of other atoms and functional groups, for example, provided as substituents.

The term "alicyclic ring" refers to a ring, or plurality of fused rings, that is not an aromatic ring. Alicyclic rings include both carbocyclic and heterocyclic rings.

The term "aromatic ring" refers to a ring, or a plurality of fused rings, that includes at least one aromatic ring group. The term aromatic ring includes aromatic rings comprising carbon, hydrogen and heteroatoms. Aromatic ring includes carbocyclic and heterocyclic aromatic rings. Aromatic rings are components of aryl groups.

The term "fused ring" or "fused ring structure" refers to a plurality of alicyclic and/or aromatic rings provided in a fused ring configuration, such as fused rings that share at least two intra ring carbon atoms and/or heteroatoms.

As used herein, the term "alkoxyalkyl" refers to a substituent of the formula alkyl-O-alkyl.

As used herein, the term "polyhydroxyalkyl" refers to a substituent having from 2 to 12 carbon atoms and from 2 to 5 hydroxyl groups, such as the 2,3-dihydroxypropyl, 2,3,4-tri hydroxybutyl or 2,3,4,5-tetrahydroxypentyl residue.

As used herein, the term "polyalkoxyalkyl" refers to a substituent of the formula alkyl-(alkoxy)$_n$-alkoxy wherein n is an integer from 1 to 10, preferably 1 to 4, and more preferably for some embodiments 1 to 3.

Amino acids include glycine, alanine, valine, leucine, isoleucine, methionine, proline, phenylalanine, tryptophan, asparagine, glutamine, glycine, serine, threonine, serine, rhreonine, asparagine, glutamine, tyrosine, cysteine, lysine, arginine, histidine, aspartic acid and glutamic acid. As used herein, reference to "a side chain residue of a natural α-amino acid" specifically includes the side chains of the above-referenced amino acids.

Alkyl groups include straight-chain, branched and cyclic alkyl groups. Alkyl groups include those having from 1 to 30 carbon atoms. Alkyl groups include small alkyl groups having 1 to 3 carbon atoms. Alkyl groups include medium length alkyl groups having from 4-10 carbon atoms. Alkyl groups include long alkyl groups having more than 10 carbon atoms, particularly those having 10-30 carbon atoms. The term cycloalkyl specifically refers to an alky group having a ring structure such as ring structure comprising 3-30 carbon atoms, optionally 3-20 carbon atoms and optionally 2-10 carbon atoms, including an alkyl group having one or more rings. Cycloalkyl groups include those having a 3-, 4-, 5-, 6-, 7-, 8-, 9- or 10-member carbon ring(s) and particularly those having a 3-, 4-, 5-, 6-, or 7-member ring(s). The carbon rings in cycloalkyl groups can also carry alkyl groups. Cycloalkyl groups can include bicyclic and tricycloalkyl groups. Alkyl groups are optionally substituted. Substituted alkyl groups include among others those which are substituted with aryl groups, which in turn can be optionally substituted. Specific alkyl groups include methyl, ethyl, n-propyl, iso-propyl, cyclopropyl, n-butyl, s-butyl, t-butyl, cyclobutyl, n-pentyl, branched-pentyl, cyclopentyl, n-hexyl, branched hexyl, and cyclohexyl groups, all of which are optionally substituted. Substituted alkyl groups include fully halogenated or semihalogenated alkyl groups, such as alkyl groups having one or more hydrogens replaced with one or more fluorine atoms, chlorine atoms, bromine atoms and/or iodine atoms. Substituted alkyl groups include fully fluorinated or semifluorinated alkyl groups, such as alkyl groups having one or more hydrogens replaced with one or more fluorine atoms. An alkoxy group is an alkyl group that has been modified by linkage to oxygen and can be represented by the formula R—O and can also be referred to as an alkyl ether group. Examples of alkoxy groups include, but are not limited to, methoxy, ethoxy, propoxy, butoxy and heptoxy. Alkoxy groups include substituted alkoxy groups wherein the alky portion of the groups is substituted as provided herein in connection with the description of alkyl groups. As used herein MeO— refers to $CH_3O$—.

Alkenyl groups include straight-chain, branched and cyclic alkenyl groups. Alkenyl groups include those having 1, 2 or more double bonds and those in which two or more of the double bonds are conjugated double bonds. Alkenyl groups include those having from 2 to 20 carbon atoms. Alkenyl groups include small alkenyl groups having 2 to 3 carbon atoms. Alkenyl groups include medium length alkenyl groups having from 4-10 carbon atoms. Alkenyl groups include long alkenyl groups having more than 10 carbon atoms, particularly those having 10-20 carbon atoms. Cycloalkenyl groups include those in which a double bond is in the ring or in an alkenyl group attached to a ring. The term cycloalkenyl specifically refers to an alkenyl group having a ring structure, including an alkenyl group having a 3-, 4-, 5-, 6-, 7-, 8-, 9- or 10-member carbon ring(s) and particularly those having a 3-, 4-, 5-, 6- or 7-member ring(s). The carbon rings in cycloalkenyl groups can also carry alkyl groups. Cycloalkenyl groups can include bicyclic and tricyclic alkenyl groups. Alkenyl groups are optionally substituted. Substituted alkenyl groups include among others those which are substituted with alkyl or aryl groups, which groups in turn can be optionally substituted. Specific alkenyl groups include ethenyl, prop-1-enyl, prop-2-enyl, cycloprop-1-enyl, but-1-enyl, but-2-enyl, cyclobut-1-enyl, cyclobut-2-enyl, pent-1-enyl, pent-2-enyl, branched pentenyl, cyclopent-1-enyl, hex-1-enyl, branched hexenyl, cyclohexenyl, all of which are optionally substituted. Substituted alkenyl groups include fully halogenated or semihalogenated alkenyl groups, such as alkenyl groups having one or more hydrogens replaced with one or more fluorine atoms, chlorine atoms, bromine atoms and/or iodine atoms. Substituted alkenyl groups include fully fluorinated or semifluorinated alkenyl groups, such as alkenyl groups having one or more hydrogen atoms replaced with one or more fluorine atoms.

Aryl groups include groups having one or more 5-, 6- or 7-member aromatic rings, including heterocyclic aromatic rings. The term heteroaryl specifically refers to aryl groups having at least one 5-, 6- or 7-member heterocyclic aromatic rings. Aryl groups can contain one or more fused aromatic rings, including one or more fused heteroaromatic rings, and/or a combination of one or more aromatic rings and one or more nonaromatic rings that may be fused or linked via covalent bonds. Heterocyclic aromatic rings can include one or more N, O, or S atoms in the ring. Heterocyclic aromatic rings can include those with one, two or three N atoms, those with one or two O atoms, and those with one or two S atoms, or combinations of one or two or three N, O or S atoms. Aryl groups are optionally substituted. Substituted aryl groups include among others those which are substituted with alkyl or alkenyl groups, which groups in turn can be optionally substituted. Specific aryl groups include phenyl, biphenyl groups, pyrrolidinyl, imidazolidinyl, tetrahydrofuryl, tetrahydrothienyl, furyl, thienyl, pyridyl, quinolyl, isoquinolyl, pyridazinyl, pyrazinyl, indolyl, imidazolyl, oxazolyl, thiazolyl, pyrazolyl, pyridinyl, benzoxadiazolyl, benzothiadiazolyl, and naphthyl groups, all of which are optionally substituted. Substituted aryl groups include fully halogenated or semihalogenated aryl groups, such as aryl groups having one or more hydrogens replaced with one or more fluorine atoms, chlorine atoms, bromine atoms and/or iodine atoms. Substituted aryl groups include fully fluorinated or semifluorinated aryl groups, such as aryl groups having one or more hydrogens replaced with one or more fluorine atoms. Aryl groups include, but are not limited to, aromatic group-containing or heterocylic aromatic group-containing groups corresponding to any one of the following: benzene, naphthalene, naphthoquinone, diphenylmethane, fluorene, anthracene, anthraquinone, phenanthrene, tetracene, tetracenedione, pyridine, quinoline, isoquinoline, indoles, isoindole, pyrrole, imidazole, oxazole, thiazole, pyrazole, pyrazine, pyrimidine, purine, benzimidazole, furans, benzofuran, dibenzofuran, carbazole, acridine, acridone, phenanthridine, thiophene, benzothiophene, dibenzothiophene, xanthene, xanthone, flavone, coumarin, azulene or anthracycline. As used herein, a group corresponding to the groups listed above expressly includes an aromatic or heterocyclic aromatic group, including monovalent, divalent and polyvalent groups, of the aromatic and heterocyclic aromatic groups listed herein are provided in a covalently bonded configuration in the compounds of the invention at any suitable point of attachment. In embodiments, aryl groups contain between 5 and 30 carbon atoms. In embodiments, aryl groups contain one aromatic or heteroaromatic six-membered ring and one or more additional five- or six-membered aromatic or heteroaromatic ring. In embodiments, aryl groups contain between five and eighteen carbon atoms in the rings. Aryl groups optionally have one or more aromatic rings or heterocyclic aromatic rings having one or more electron donating groups, electron withdrawing groups and/or targeting ligands provided as substituents.

Arylalkyl groups are alkyl groups substituted with one or more aryl groups wherein the alkyl groups optionally carry additional substituents and the aryl groups are optionally substituted. Specific alkylaryl groups are phenyl-substituted alkyl groups, e.g., phenylmethyl groups. Alkylaryl groups are alternatively described as aryl groups substituted with one or more alkyl groups wherein the alkyl groups optionally carry additional substituents and the aryl groups are optionally substituted. Specific alkylaryl groups are alkyl-substituted phenyl groups such as methylphenyl. Substituted arylalkyl groups include fully halogenated or semihalogenated arylalkyl groups, such as arylalkyl groups having one or more alkyl and/or aryl groups having one or more hydrogens replaced with one or more fluorine atoms, chlorine atoms, bromine atoms and/or iodine atoms.

As to any of the groups described herein which contain one or more substituents, it is understood that such groups do not contain any substitution or substitution patterns which are sterically impractical and/or synthetically non-feasible. In addition, the compounds of this invention include all stereochemical isomers arising from the substitution of these compounds. Optional substitution of alkyl groups includes substitution with one or more alkenyl groups, aryl groups or both, wherein the alkenyl groups or aryl groups are optionally substituted. Optional substitution of alkenyl groups includes substitution with one or more alkyl groups, aryl groups, or both, wherein the alkyl groups or aryl groups are optionally substituted. Optional substitution of aryl groups includes substitution of the aryl ring with one or more alkyl groups, alkenyl groups, or both, wherein the alkyl groups or alkenyl groups are optionally substituted.

Optional substituents for any alkyl, alkenyl and aryl group includes substitution with one or more of the following substituents, among others:

halogen, including fluorine, chlorine, bromine or iodine;
pseudohalides, including —CN;
—COOR where R is a hydrogen or an alkyl group or an aryl group and more specifically where R is a methyl, ethyl, propyl, butyl, or phenyl group all of which groups are optionally substituted;
—COR where R is a hydrogen or an alkyl group or an aryl group and more specifically where R is a methyl, ethyl, propyl, butyl, or phenyl group all of which groups are optionally substituted;
—CON(R)$_2$ where each R, independently of each other R, is a hydrogen or an alkyl group or an aryl group and more specifically where R is a methyl, ethyl, propyl, butyl, or phenyl group all of which groups are optionally substituted; and where R and R can form a ring which can contain one or more double bonds and can contain one or more additional carbon atoms;
—OCON(R)$_2$ where each R, independently of each other R, is a hydrogen or an alkyl group or an aryl group and more specifically where R is a methyl, ethyl, propyl, butyl, or phenyl group all of which groups are optionally substituted; and where R and R can form a ring which can contain one or more double bonds and can contain one or more additional carbon atoms;
—N(R)$_2$ where each R, independently of each other R, is a hydrogen, or an alkyl group, or an acyl group or an aryl group and more specifically where R is a methyl, ethyl, propyl, butyl, phenyl or acetyl group, all of which are optionally substituted; and where R and R can form a ring which can contain one or more double bonds and can contain one or more additional carbon atoms;
—SR, where R is hydrogen or an alkyl group or an aryl group and more specifically where R is hydrogen, methyl, ethyl, propyl, butyl, or a phenyl group, which are optionally substituted;
—SO$_2$R, or —SOR where R is an alkyl group or an aryl group and more specifically where R is a methyl, ethyl, propyl, butyl, or phenyl group, all of which are optionally substituted;
—OCOOR where R is an alkyl group or an aryl group;
—SO$_2$N(R)$_2$ where each R, independently of each other R, is a hydrogen, or an alkyl group, or an aryl group all of which are optionally substituted and wherein R and R can form a ring which can contain one or more double bonds and can contain one or more additional carbon atoms;
—OR where R is H, an alkyl group, an aryl group, or an acyl group all of which are optionally substituted. In a particular example R can be an acyl yielding —OCOR" where R" is a hydrogen or an alkyl group or an aryl group and more specifically where R" is methyl, ethyl, propyl, butyl, or phenyl groups all of which groups are optionally substituted.

Specific substituted alkyl groups include haloalkyl groups, particularly trihalomethyl groups and specifically trifluoromethyl groups. Specific substituted aryl groups include mono-, di-, tri, tetra- and pentahalo-substituted phenyl groups; mono-, di-, tri-, tetra-, penta-, hexa-, and hepta-halo-substituted naphthalene groups; 3- or 4-halo-substituted phenyl groups, 3- or 4-alkyl-substituted phenyl groups, 3- or 4-alkoxy-substituted phenyl groups, 3- or 4-RCO-substituted phenyl, 5- or 6-halo-substituted naphthalene groups. More specifically, substituted aryl groups include acetylphenyl groups, particularly 4-acetylphenyl groups; fluorophenyl groups, particularly 3-fluorophenyl and 4-fluorophenyl groups; chlorophenyl groups, particularly 3-chlorophenyl and 4-chlorophenyl groups; methylphenyl groups, particularly 4-methylphenyl groups; and methoxyphenyl groups, particularly 4-methoxyphenyl groups.

As to any of the above groups which contain one or more substituents, it is understood that such groups do not contain any substitution or substitution patterns which are sterically impractical and/or synthetically non-feasible. In addition, the compounds of this invention include all stereochemical isomers arising from the substitution of these compounds.

DETAILED DESCRIPTION OF THE INVENTION

In general, the terms and phrases used herein have their art-recognized meaning, which can be found by reference to standard texts, journal references and contexts known to those skilled in the art.

The invention is further detailed in the following Examples, which are offered by way of illustration and are not intended to limit the scope of the invention in any manner.

Example 1

Wedge-type Block-copolymers and their Self-assembly to Photonic Crystals

The present invention provides a general approach to the synthesis of polymers with reduced chain entanglement and high persistence lengths, so called brush polymers. The employed strategy relies on the steric interactions of side groups attached to the main polymer chain. We have recently reported that brush block-copolymers (BCPs) constructed by means of ring-opening polymerization (ROMP) of lactide- and styrene- or hexyl isocyanate- and 4-phenylbutyl isocyanate-macromonomers (MM) can self-assemble to long-wavelength-reflecting photonic crystals (PCs) without the need for swelling agents.[1,2] The "grafting-through" polymerization strategy of MMs affords highly uniform brush BCPs, where the sterically congested array of low MW side chains greatly inhibits chain entanglement and forces the unifying main chain to assume a highly elongated conformation.[3] As a result, these brush BCPs rapidly self-assembled to stacked lamellae of alternating layers of block-copolymer components domains, forming one-dimensional (1D) PC architectures. Thin films of corresponding polymers deposited on the glass slides by means of controlled evaporation from volatile solvent were capable of reflecting visible and near IR light (up to 1300 nm).

As an alternative to the polymer side chains in brush polymers, it was further developed that bulky side groups, such as wedge side groups, could serve the same purpose. Such side groups would be monodisperse and have a wider range of shapes and functional groups available compared to all-polymer brushes. For this purpose, we exemplify two derivatives of the generic norbornene 'wedge' monomer (W) with decyl groups (AW) and benzyl groups (BnW). FIG. 1 provides structures of example wedge groups useful in the compositions and methods of the invention. Monomers AW and BnW are like G1 dendrimers, with their bulk confined to a specific shape. Ring-opening metathesis polymerization (ROMP) was utilized for the homopolymerization of one wedge monomer or the block copolymerization of both monomers.

Figure 2:
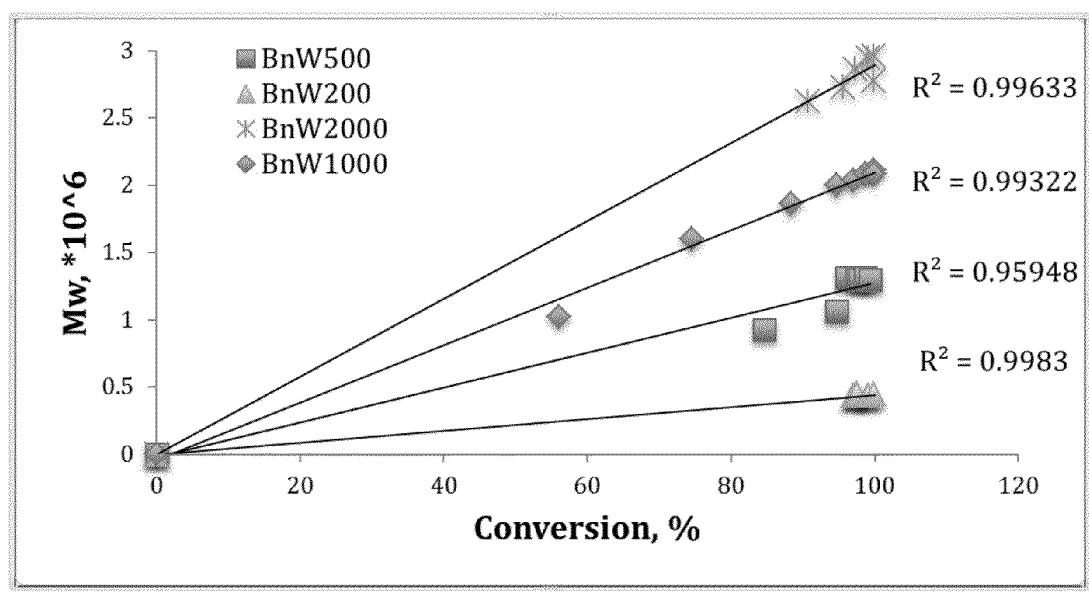
FIG. 2. Plot of Mw as a function of BnW conversion at different initiator to monomer ratios.

Results and Discussion. In order to synthesize well-defined wedge-type block-copolymers composed of AW and BnW we first established polymerization kinetics of one of the monomers: BnW monomer. The monomer was prepared according to synthetic procedure outlined in experimental section and polymerized via ROMP initiated by 1 (see, FIG. 1) at various monomer to catalyst ratios, ranging from 200:1 to 2000:1. FIG. 2 provides plots of Mw as a function of BnW conversion at different initiator to monomer ratios. Closer examination of molecular weight as a function of conversion plot (see, FIG. 2) living characteristics of the ROMP of BnW (i.e. linear increase in molecular weight with BnW conversion). A similarly controlled ROMP of AW was observed.

After establishing the kinetic profile for the ROMP of BnW mediated by 1, we proceeded to synthesize well-defined BCPs by addition of AW after the ROMP of BnW. The BCPs could be isolated in high yields, with MWs ranging from $0.48 \times 10^6$ Da to $3.34 \times 10^6$ Da and impressively low PDIs (PDI=1.05-1.23), (Table 1). All BCPs had nearly equal molar incorporation of each monomer.

TABLE 1

Summary of block copolymerization of BnW and AW with 1 via ROMP

| [I]/[M1]/[M2] | Mw × $10^6$ Da | PDI | Yield, % | $\lambda_{max}$, nm |
|---|---|---|---|---|
| 1:200:200 | 0.48 | 1.05 | 98.2 | 330 |
| 1:350:350 | 0.57 | 1.05 | 94.0 | 400 |
| 1:500:500 | 1.25 | 1.10 | 98.0 | 768 |
| 1:750:750 | 1.39 | 1.24 | 97.0 | 888 |
| 1:1000:1000 | 1.94 | 1.32 | 95.5 | — |
| 1:1500:1500 | 2.9 | 1.30 | 97.2 | — |
| 1:2000:2000 | 3.34 | 1.23 | 96.4 | — |

Figure 3:
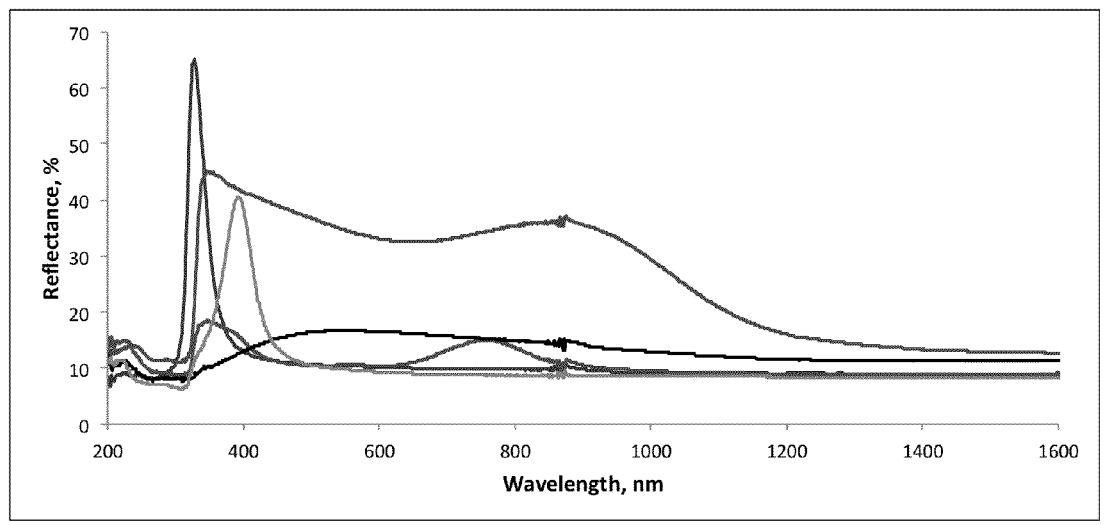
FIG. 3. Plot of reflectance as a function of wavelength for wedge-based BCPs thin films with Mw=0.48×10$^6$ Da (violet), 0.57×10$^6$ Da (blue), 1.25×10$^6$ Da (red), 1.39×10$^6$ Da (green), 1.96×10$^6$ Da (black).

Obtained polymers were used to prepare thin films by controlled evaporation from methylene chloride solutions (concentration 2 g/L). Resulted films appeared to be transparent or slightly translucent with some of them being brightly colored due to the reflection of visible light. FIG. 3 provides plots of reflectance as a function of wavelength for wedge-type BCPs thin films with Mw=$0.48 \times 10^6$Da (violet), $0.57 \times 10^6$Da (blue), $1.25 \times 10^6$Da (red), $1.39 \times 10^6$Da (green), $1.96 \times 10^6$Da (black). To quantitatively measure the PC properties of these materials, reflectance data were acquired as a function of wavelength using a spectrophotometer with 'integrating sphere' diffuse reflectance accessory (see, FIG. 3).

Figure 4:
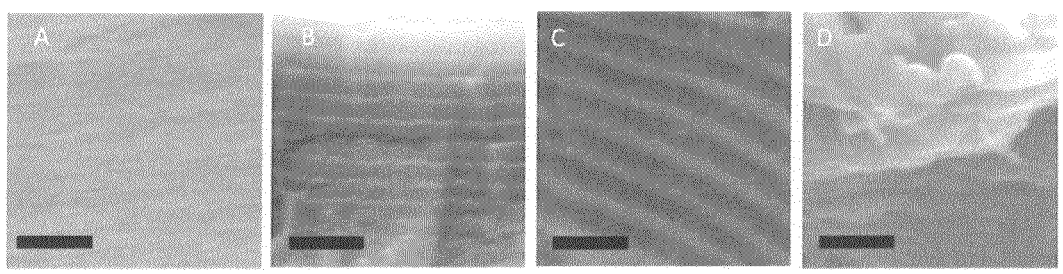
FIG. 4. SEM images of cross sections of block copolymers with Mw=0.48 (a), 1.25 (b), 1.39 (c), and 5319 (d) 1.94×10$^6$ Da, (scale bar=1 μm).

Extremely sharp well-defined peaks were observed for BPCs with molecular weight ranging from 0.48 to $1.25 \times 10^6$ kDa. However, reflectance peaks got broader and eventually disappeared as molecular weight increased, suggesting poor self-assembly. To get insight on the origin of light-reflecting properties of these materials we utilized scanning electron microscopy (SEM). FIG. 4 provides SEM images of cross sections of block copolymers with Mw=0.48 (a), 1.25 (b), 1.39 (c), and 5319 (d) $1.94 \times 10^6$ Da, (scale bar=1 µm). Thus, cross-sections of the $RuO_4$ stained films were analyzed by SEM. For the wedge-type BCPs with molecular weight lower than $1.389 \times 10^6$ Da, stacked lamellar morphologies were observed, as expected for BCPs composed of nearly equal ratios of each block (see, FIG. 4a-c). However, with further increase in molecular weight, rapid loss of defined morphological structure was observed.

The present invention has a wide scope of applications, in the general fields of optics, photonics, chemical sensing, mechanical sensing and radiation management. Specifically, we have demonstrated the facile self-assembly of these wedge-type polymers to afford one-dimensional periodic nanostructures. Two- and three-dimensional periodic nanostructures can also be afforded by changing the size of the different blocks, or through different annealing methods, or through the incorporation of multiple blocks in either the main- or side-chain of the wedge-type polymer. As well, one or more of these materials can serve as a sacrificial template for the incorporation of other media, such as ceramics, polymers or metals.

We have specifically demonstrated the thermomechanical response, as well as solvent dependent self-assembly of these systems[1]. This opens up the possibility for an array of compliant photonic devices, and novel sensors. A number of potential devices are outlined here. The change in color due to the mechanical stretching or compression yields a pressure and/or stress sensor. The change in color due to the change in index of refraction through chemical adsorption, as well as the potential swelling due to solvation, yields an optically read chemical sensor. The ability to tune the spacing of the wedge-type block copolymers through any external stimuli, such as temperature, electric field gradients, solvation or stretching yields a dynamic photonic filter. This could be employed as an optical switch. The ability to remove one of the incorporated polymers, and infill with another material such as a metal affords the ability to template complex nanostructures, such as metamaterials. We have demonstrated the use of these self-assembled polymer wedge-type block copolymers as photonic crystals. In addition, these photonic crystals can be employed as frequency selective filters, e.g. as band reject filters or polarizers in the UV, visible or infrared parts of the electromagnetic spectrum. This has many potential applications in optics, as well as in thermal management (via IR reflecting "paints").

Experimental. I. Materials and Methods. (H2IMes)(PPh3) 2(Cl)2RuCHPh was received as a research gift from Materia Inc. and converted to 1 via literature procedure.[4] All other chemicals were purchased from Sigma Aldrich. Solvents were purified by passage through solvent purification columns and further degassed with argon.

Synthesis of monomers was carried out under ambient conditions, all polymerizations were performed in the nitrogen-filled glovebox in 20 ml scintillation vials. NMR spectra were recorded on a Varian (nova 300 MHz spectrometer. Chemical shifts were referenced to internal solvent resonances and are reported as parts per million relative to tetramethylsilane. High resolution mass spectra were provided by the California Institute of Technology Mass Spectrometry Facility. Polymer molecular weights were determined utilizing THF as the eluent by multiangle light-scattering (MALS) gel permeation chromatography (GPC) using a mini DAWN TREOS light-scattering detector, a Viscostar viscometer, and an OptilabRex refractive index detector, all from Wyatt Technology. An Agilent 1200 UV-vis detector was also present in the detector stack. Absolute molecular weights were determined using do/dc values calculated by assuming 100% mass recovery of the polymer sample injected into the GPC. Polymer thin films were prepared from the controlled evaporation of polymer solutions (~2 g/L) in dichloromethane onto glass slides that had been previously washed with methanol and hexane. After the solvent was allowed to evaporate, the samples were dried under vacuum overnight. SEM images were taken on a ZEISS 1550 VP Field Emission SEM. Reflection measurements were performed on a Cary 5000 UV/vis/NIR spectrophotometer, equipped with an 'integrating sphere' diffuse reflectance accessory (Internal DRA 1800). All measurements were referenced to a LabSphere Spectralon 99% certified reflectance standard. The samples were illuminated through a Spectralon-coated aperture with a diameter of 1 cm, with a beam area of approximately 0.5 cm2. The samples were scanned at a rate of 600 nm/min, with a 1 nm data interval, from 1800 to 200 nm, with a detector crossover (InGaAs to PMT) at 800 nm.

II. Synthesis of Monomers

Alkyl Wedge (AW) Synthesis

Methyl 3,4,5-tris(dodecyloxy)benzoate (1a).

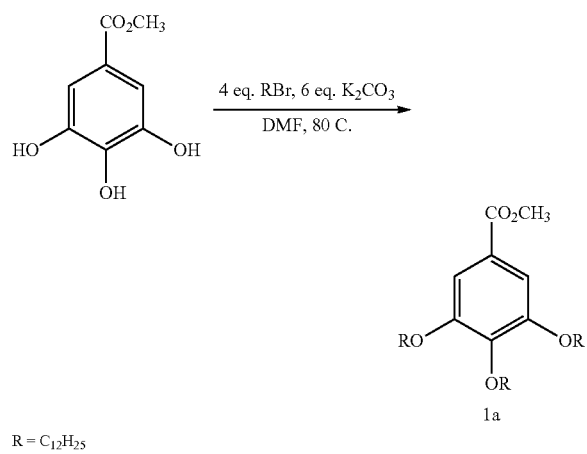

R = C$_{12}$H$_{25}$

A 250 ml round bottomed flask equipped with a stirbar was charged DMF (50 ml). The solution was sparged for 30 minutes with argon. After sparging, flask was sequentially charged with methyl gallate (1.9 g, 10 mmol, 1 eq), bromodecane (10 ml, 40 mmol, 4 eq) and potassium carbonate (8.5 g, 60 mmol, 6 eq). The flask was then equipped with a Vigreux column and heated to 80° C. for 12 hours. Upon cooling to room temperature, the reaction mixture was diluted with water (100 ml) and extracted with diethyl ether (2×100 ml). The combined organic phases were washed with water (100 ml) then 50% brine (100 ml) and dried over magnesium sulfate. The combined organic phases were filtered through a plug of basic alumina. The solvent was removed by rotary evaporation to yield an oil, which became white solid 1a (6.2 g, 9.1 mmol, 91%) in vacuo. $^1$H NMR (500 MHz, CDCl$_3$): δ 7.25 (2H, s), 4.00 (2H, t, J=6.5 Hz), 3.99 (4H, t, J=6.5 Hz), 3.87 (3H, s), 1.80 (4H, quintet, J=7 Hz), 1.73 (2H, quintet, J=7 Hz), 1.46 (6H, quintet, J=7 Hz), 1.38-1.19 (48H, bs), 0.87 (9H, t, 7 Hz). $^{13}$C{$^1$H} NMR (126 MHz, CDCl$_3$): δ 166.93, 152.81, 142.36, 124.64, 107.97, 104.99, 73.48, 69.16, 52.09, 31.95, 31.93, 30.33, 29.75, 29.74, 29.73, 29.70, 29.67, 29.64, 29.57, 29.40, 29.37, 29.31, 26.08, 26.06, 22.70, 22.68, 14.14, 14.12. HRMS (FAB+): calculated 689.6084, found 689.6095.

3,4,5-tris(dodecyloxy)benzoic acid (2a).

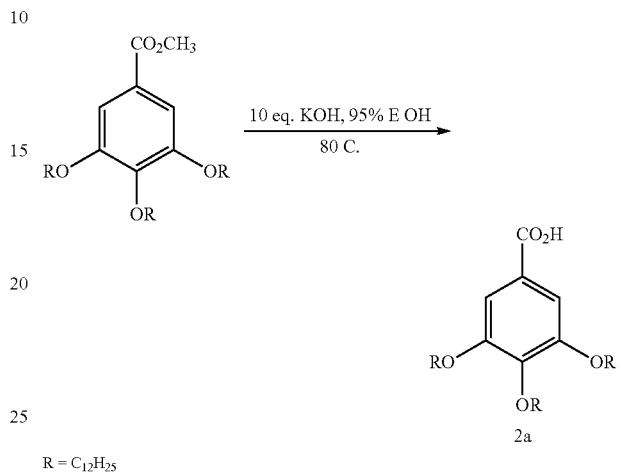

R = C$_{12}$H$_{25}$

A 250 ml round bottomed flask equipped with a stirbar was charged with 1 (4.1 g, 6 mmol, 1 eq), potassium hydroxide (3.4 g, 60 mmol, 10 eq) and 95% EtOH (30 ml). The round bottom flask was equipped with a water-cooled condenser. The suspension was refluxed (~80° C.) for 4 hours. Upon cooling, the reaction mixture thickened substantially. The solid was filtered with a BOchner funnel and washed with cold (–20° C.) 95% EtOH to give a white solid. The white solid was suspended in Et$_2$O (100 ml). Concentrated HCl (6 ml) was added to the ethereal suspension, followed by the precipitation of potassium chloride. Water (50 ml) was added then separated from the organic phase. The organic phase was washed with water (2×50 ml) and brine (1×50 ml) and dried over sodium sulfate. The solution was filtered and the solvent was removed by rotary evaporation to yield 2a as a white solid (3.6 g, 5.3 mmol, 89%). $^1$H NMR (500 MHz, CDCl$_3$): δ 7.32 (2H, s), 4.04 (2H, t, J=7 Hz), 4.02 (4H, t, J=7 Hz), 1.82 (4H, quintet, J=7 Hz), 1.75 (2H, quintet, J=7 Hz), 1.48 (6H, quintet, J=7 Hz), 1.39-1.22 (48H, bs), 0.88 (9H, t, J=7 Hz). $^{13}$C{$^1$H} NMR (126 MHz, CDCl$_3$): δ 171.02, 152.85, 143.16, 123.47, 108.56, 104.99, 73.55, 69.20, 31.95, 31.93, 30.34, 29.76, 29.74, 29.73, 29.70, 29.67, 29.64, 29.57, 29.40, 29.37, 29.28, 26.08, 26.05, 22.70, 14.12. HRMS (ES): calculated 673.5771, found 673.5771.

Alkyl Wedge Monomer (AW).

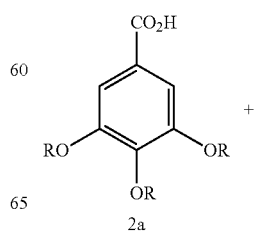

-continued

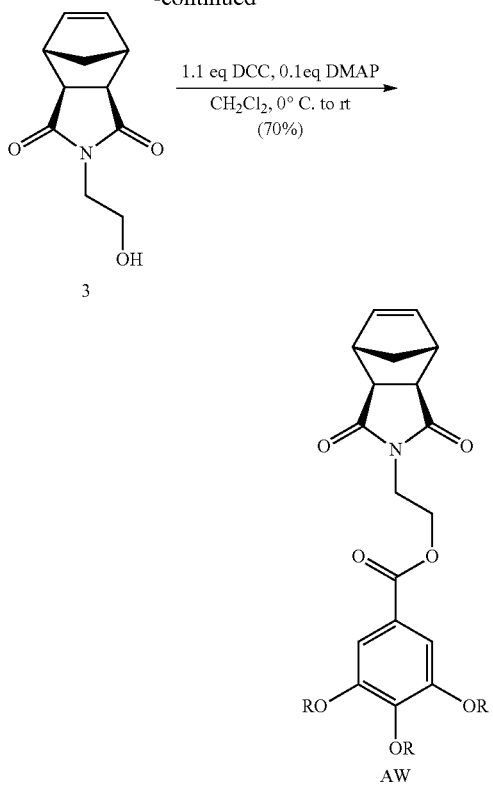

R = C₁₂H₂₅

A 100 ml Schlenk flask equipped with a stirbar was flame-dried under vacuum. The cooled flask was backfilled with argon and charged with 2 (3.8 g, 5.6 mmol, 1 eq), alcohol 3 (1.3 g, 6.2 mmol, 1.1 eq), 4-dimethylaminopyridine (66 mg, 0.56 mmol, 0.1 eq) and $CH_2Cl_2$ (25 ml). The solution was cooled to 0° C. in an ice bath, with precipitation of some reagents. Dicyclohexylcarbodiimide (1.3 g, 6.2 mmol, 1.1 eq) was added to the cooled solution, and the reaction was stirred at 0° C. for 30 minutes. The reaction was warmed to room temperature and stirred for 18 hours. The resulting suspension was filtered and the solid was washed with $CH_2Cl_2$ (25 ml). Solvent was removed from the filtrate by rotary evaporation to yield very viscous oil. Ethanol (95%, 100 ml) was added to the oil and stirred for 3 hours. The resulting white solid was filtered and residual solvent was removed in vacuo to yield the alkyl wedge monomer AW (3.4 g, 3.9 mmol, 70%). $^1H$ NMR (500 MHz, $CDCl_3$): δ 7.20 (2H, s), 6.27 (2H, t, J=2 Hz), 4.40 (2H, t, J=5 Hz), 4.01 (6H, t, J=1 Hz), 3.90 (2H, t, J=5 Hz), 3.23 (2H, m), 2.69 (1H, d, J=2 Hz), 1.82 (4H, quintet, J=7 Hz), 1.73 (2H, quintet, J=7 Hz), 1.55 (1H, s), 1.48 (6H, m), 1.43-1.21 (50H, br), 0.88 (9H, t, J=7 Hz). $^{13}C\{^1H\}$ NMR (126 MHz, $CDCl_3$): δ 177.69, 166.06, 152.81, 142.46, 137.77, 124.01, 107.98, 73.47, 69.12, 61.63, 47.85, 45.25, 42.69, 37.53, 31.95, 31.93, 30.34, 29.76, 29.74, 29.73, 29.71, 29.70, 29.67, 29.66, 29.58, 29.41, 29.40, 29.37, 29.33, 26.11, 22.70, 14.12. HRMS (ES+): calculated 864.6717, found 864.6716.

Benzyl Wedge Monomer (BnW) Synthesis.
Methyl 3,4,5-tribenzylbenzoate (1b).

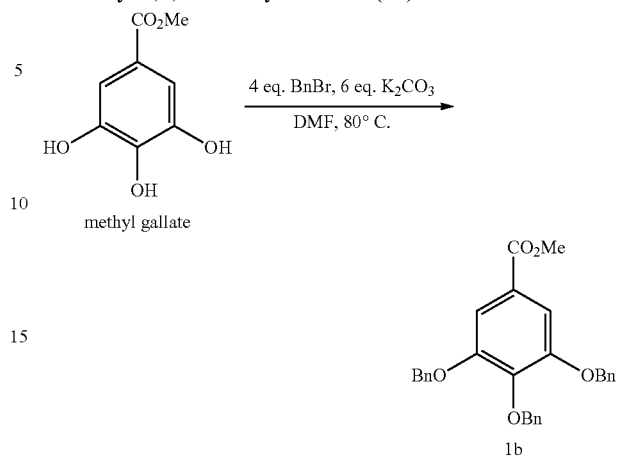

A 250 ml round bottomed flask equipped with a stirbar was charged DMF (50 ml). The solution was sparged for 30 minutes with argon. After sparging, flask was sequentially charged with methyl gallate (1.9 g, 10 mmol, 1 eq), benzyl bromide (4.8 ml, 40 mmol, 4 eq) and potassium carbonate (8.5 g, 60 mmol, 6 eq). The flask was then equipped with a Vigreux column and heated to 80° C. for 12 hours. Upon cooling to room temperature, the reaction mixture was diluted with water (100 ml) and extracted with diethyl ether (2×100 ml). The combined organic phases were washed with water (100 ml) then 50% brine (100 ml) and dried over magnesium sulfate. The combined organic phases were filtered through a plug of basic alumina. The solvent was removed by rotary evaporation to yield an oil, which became white solid 1b (3.9 g, 98.5 mmol, 85%) in vacuo. $^1H$ NMR (500 MHz, $CDCl_3$): δ 7.48-7.44 (4H, m), 7.43-7.38 (8H, m), 7.37-7.33 (2H, m), 7.30-7.26 (3H, m), 5.16 (4H, s), 5.14 (2H, s), 3.91 (3H, s). $^{13}C\{^1H\}$ NMR (126 MHz, $CDCl_3$): δ 166.62, 152.55, 142.41, 137.43, 136.65, 128.53, 128.51, 128.17, 128.01, 127.93, 127.53, 125.21, 109.99, 109.07, 75.12, 71.23, 52.22. HRMS (FAB) calculated 454.17.80, found 454.1782.

3,4,5-tribenzylbenzoic acid (2b).

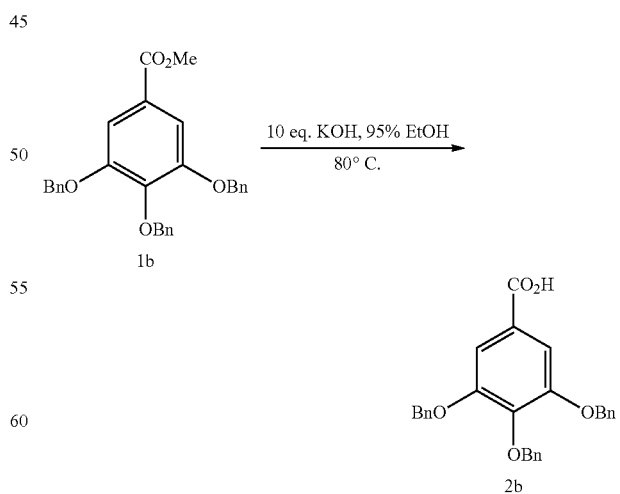

A 250 ml round bottomed flask equipped with a stirbar was charged with 2a (3.9 g, 8.5 mmol, 1 eq), potassium hydroxide (4.8 g, 85 mmol, 10 eq) and 95% EtOH (43 ml). The round bottom flask was equipped with a water-cooled condenser. The suspension was refluxed (~80° C.) for 4 hours. Upon cooling, the reaction mixture thickened substantially. The solid was filtered with a BOchner funnel and washed with cold (−20° C.) 95% EtOH to give a yellow solid. The solid was suspended in Et$_2$O (100 ml). Concentrated HCl (6 ml) was added to the ethereal suspension, followed by the precipitation of potassium chloride. The suspension was filtered, and washed with water. The filtrate was dissolved in acetone and dried over MgSO$_4$. After filtration and solvent removal by rotary evaporation, 2b (1.85 g, 4.2 mmol, 49%). $^1$H NMR (500 MHz, acetone-d$_6$): δ 7.55 (4H, d, J=7 Hz), 7.48-7.44 (4H, m), 7.41 (4H, tt, J=7 Hz, 1.5 Hz), 7.35 (2H, tt, J=7 Hz, 1.5 Hz), 7.30-7.25 (3H, m), 5.23 (4H, s), 5.14 (2H, s). $^{13}$C{$^1$H} NMR (126 MHz, acetone-d$_6$): δ 166.23, 152.62, 142.17, 137.95, 137.20, 128.41, 128.28, 128.04, 127.86, 127.73, 127.64, 125.70, 108.87, 74.59, 70.76. HRMS (FAB) calculated 441.1702, found 441.1682.

Benzyl Wedge Monomer (BnW).

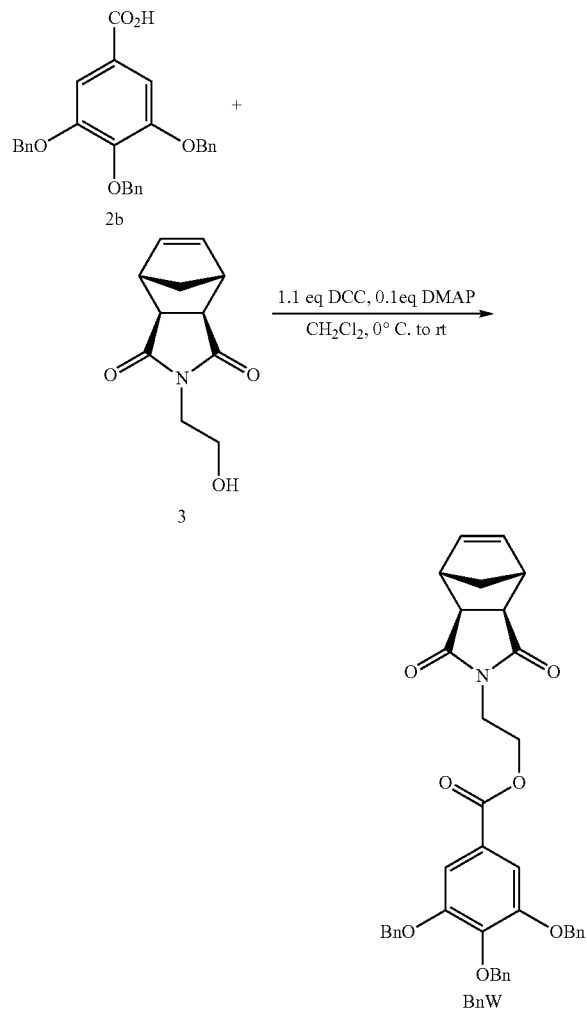

A 100 ml Schlenk flask equipped with a stirbar was flame-dried under vacuum. The cooled flask was backfilled with argon and charged with 2b (1.7 g, 3.8 mmol, 1 eq), alcohol 3 (865 mg, 4.2 mmol, 1.1 eq), 4-dimethylaminopyridine (46 mg, 0.38 mmol, 0.1 eq) and CH$_2$Cl$_2$ (20 ml). The solution was cooled to 0° C. in an ice bath, with precipitation of some reagents. Dicyclohexylcarbodiimide (862 mg, 4.2 mmol, 1.1 eq) was added to the cooled solution, and the reaction was stirred at 0° C. for 30 minutes. The reaction was warmed to room temperature and stirred for 18 hours. The resulting suspension was filtered and the solid was washed with CH$_2$Cl$_2$ (25 ml). Solvent was removed from the filtrate by rotary evaporation to yield an off-white solid. Ethanol (95%, 100 ml) was added to the oil and stirred for 3 hours. The resulting white solid was filtered and residual solvent was removed in vacuo to yield BnW (1.9 g, 3.1 mmol, 82%). $^1$H NMR (500 MHz, CDCl$_3$): 7.49 (4H, d, J=8 Hz), 7.42-7.34 (10H, m), 7.29-7.26 (3H, m), 6.28 (2H, t, J=1.6 Hz), 5.18 (4H, s), 5.14 (2H, s), 4.43 (2H, t, J=5 Hz), 3.94 (2H, t, J=5 Hz), 3.24 (2H, s), 2.70 (2H, s), 1.42 (1H, d, J=10 Hz), 1.25 (1H, d, J=10 Hz). $^{13}$C{$^1$H} NMR (126 MHz, CDCl$_3$) δ 177.76, 165.76, 152.55, 142.50, 137.77, 137.45, 136.71, 128.52, 128.49, 128.16, 127.98, 127.92, 127.56, 124.60, 109.03, 75.08, 71.11, 61.86, 47.85, 45.26, 42.67, 37.50. HRMS (FAB) calculated 629.2413, found 629.2392.

Block Copolymerization of BnW and AW.

In a nitrogen-filled glovebox, BnW (113 mg, 0.18 mmol, [BnW]$_0$:[AW]$_0$:[C]=200:200:1) was dissolved in THF (2 ml) in a scintillation vial. A catalyst stock solution was prepared from 1 (10.5 mg) in THF (0.401 ml). A portion of the catalyst stock solution (0.025 ml) was added to the BnW solution in one portion. The solution rapidly thickens. After 17 min, a powder of AW (150 mg, 0.18 mmol) was added to the living poly-BnW solution. The second block was allowed to polymerize for 1 hour. The vial was removed from the glovebox and the reaction was quenched with ethyl vinyl ether (1 ml). The cloudy suspension was redissolved with methylene chloride, and precipitated again methanol (20 ml). The white solid was collected and dried in vacuo to yield poly-(BnW-block-AW) (258 mg, 98%). All other polymerizations were performed in the similar manner except that polymerizations were allowed to run for 12 hours after addition of AW monomer. Time of polymerization of BnW block was determined based on kinetics plot.

References

1. Sveinbjörnsson, B. R.; Weitekamp, R. A.; Miyake, G. M.; Xia, Y.; Atwater, H. A.; Grubbs, R. H. *P. Nat. Acad. Sci. USA* 2012, 109(36), 14332-14336
2. Miyake, G. M.; Weitekamp, R. A.; Piunova, V. A.; Grubbs, R. H. *J. Am. Chem. Soc.* 2012, 134, 14249-14254
3. Hu, M.; Xia, Y.; McKenna, G. B.; Kornfield, J. A.; Grubbs, R. H. *Macromolecules* 2011, 44, 6935-6934.
4. Love, J. A.; Morgan, J. P.; Trnka, T. M.; Grubbs, R. H. *Angew. Chem., Int. Ed.* 2002, 41, 4035-4037

Example 2

Periodic Nanostructures Form Self-Assembly Wedge-Type Block Copolymers

In this example 2, we describe a simple method for fabrication of well-aligned, periodic nanostructures with large feature sizes upon either hard or flexible surfaces by using brush polymers and wedge-type block polymers. Brush and wedge-type BCPs can be made from a few different approaches such as grafting from, grafting onto and grafting through. All of them can be used for the fabrication of our system, but for our studies we used the grafting through approach for its guaranteed complete grafting and convenience with ring-opening metathesis polymerization to make a number of graft block copolymers of a variety of sizes. The grafting from approach is very compatible but not limited to norbornene derived macromonomers and gives good control over the backbone length and can be easily purified by methods such as but not limited to precipitation into an appropriate solvent. The primary purpose of the side chains is to stretch the backbone and minimize chain-entanglement, and can therefore be any polymer (e.g. polylactide, polystyrene, poly tert-butyl acrylate) as well as large non-polymeric chains such as, but not limited to, "wedge" side chains (FIG. 5e). When these graft block copolymers are big enough they start to exhibit photonic properties by reflecting specific colors. They can self-assemble rapidly into photonic materials through a variety of annealing techniques such as, but not limited to, vapor annealing, thermal annealing and slow evaporation from a solvent. The combination of the simple and rapid self-assembly of these polymers and the improved synthesis of them in the past few years make them an excellent platform for the fabrication of well-aligned, periodic nanostructures.

General Description. The present invention can be employed in many applications, in the general fields of optics, photonics, chemical sensing, mechanical sensing and radiation management. Specifically, we have demonstrated the facile self-assembly of these brush and wedge-type polymers to afford one-dimensional periodic nanostructures. Two- and three-dimensional periodic nanostructures can also be afforded by changing the size of the different blocks, different annealing methods, or through the incorporation of multiple blocks in either the main- or side-chain of the brush or wedge-type polymer. Furthermore, one or more of these materials can serve as a sacrificial template for the incorporation of other media, such as but not limited to ceramics, polymers or metals.

As mentioned above, brush or wedge-type polymers can be made via 3 different routes. Since the same principles hold for the self-assembly of these brush or wedge-type polymers, regardless of the approach used to make them, we decided to utilize the MM approach and will confine further discussion here to graft polymers made with that approach.

We chose to use a norbornene backbone in our studies that we polymerized via ROMP since it has proven a successful approach to obtain well-defined graft polymers, as mentioned earlier. Other backbones can also be polymerized via other polymerization routes (e.g. controlled radical polymerizations) but in the subsequent discussion here we'll focus on our results utilizing the ROMP of norbornene based MMs.

The norbornene is functionalized with the polymer side chain either by using a norbornene derivative as an initiator for a polymerization such as but not limited to ring-opening polymerization (ROP) and controlled radical polymerization (CRP). It is also possible to click or couple a previously made polymer on an appropriately functionalized norbornene.

When the backbone has been functionalized it is polymerized (here via ROMP) in a block-wise manner, i.e. first one type of MM is polymerized followed by a different type of MM to yield the block copolymer.

Figure 5:
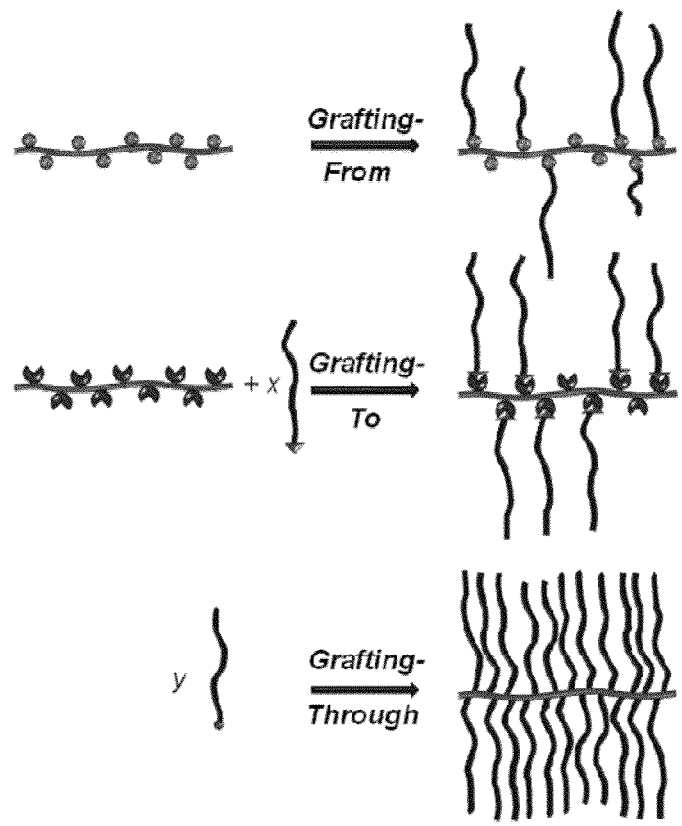

We have been able to obtain photonic crystals with various combinations of side chains such as polylactide (PLA), polystyrene (PS), poly tert-butyl acrylate (PtBA), and even non-polymeric yet long side chains such as dodecanyl norbornene (C12) and norbornene "wedge" MMs (FIG. 5). ROMP of norbornenes with various combinations of the above mentioned side chains have yielded photonic crystals in the visible spectrum (Table 1). This was done to show that any side chains could be used as long as each block is different. The side chains mainly affect how big the subsequent graft polymers need to be to correspond to different photonic band gaps. Incorporation of cross-linkable groups into the polymer can be useful to crosslink the brush or wedge-typepolymer in its self-assembled form. With appropriate side chains it is also possible to incorporate metals and/or other additives into the brush or wedge-type polymer and/or selectively incorporate it into only one of the blocks.

TABLE 1

Preliminary tests of several combinations of macromonomers.

| Test # | Side chain A | Side chain B | A:catalyst ratio | B:catalyst ratio | Observed color |
|---|---|---|---|---|---|
| 1 | PLA | C12 | 200 | 1000 | Dark blue |
| 2 | PLA | C12 | 200 | 1500 | Light blue |
| 3 | PLA | Wedge | 200 | 1000 | Blue |
| 4 | PLA | Wedge | 200 | 2000 | Green |
| 5 | PLA | PS | 400 | 200 | Dark blue |
| 6 | PLA | PS | 400 | 400 | Green |

As shown in the table above the MMs were ROMPed in both symmetric ratios, giving rise to a lamellar structure (1D), and asymmetric ratios where the graft polymers result in a 2D or 3D structures. For the purpose of a systematic study of these materials we have further concentrated on a lamellar (1D) system using the PLA and PS side chains.

Figure 6:
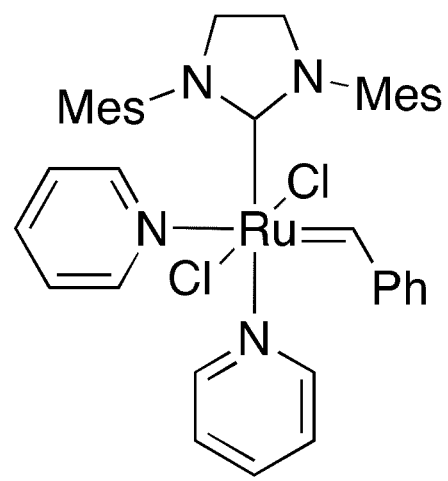
FIG. 6. A bis-pyridine derivative of the second generation Grubbs catalyst.
Figure 7:
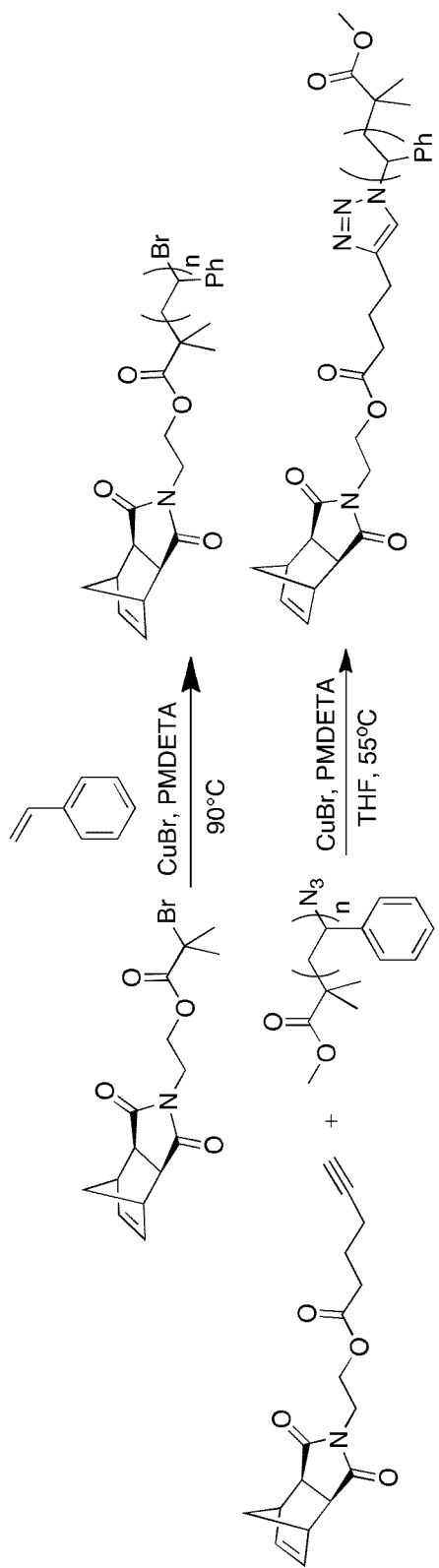
FIG. 7. There are a variety of methods to functionalize norbornenes with a polymer side chain such as direct polymerization from a norbornene initiator (top) and clicking the polymer side chain onto a norbornene alkyne (bottom).
Figure 8:
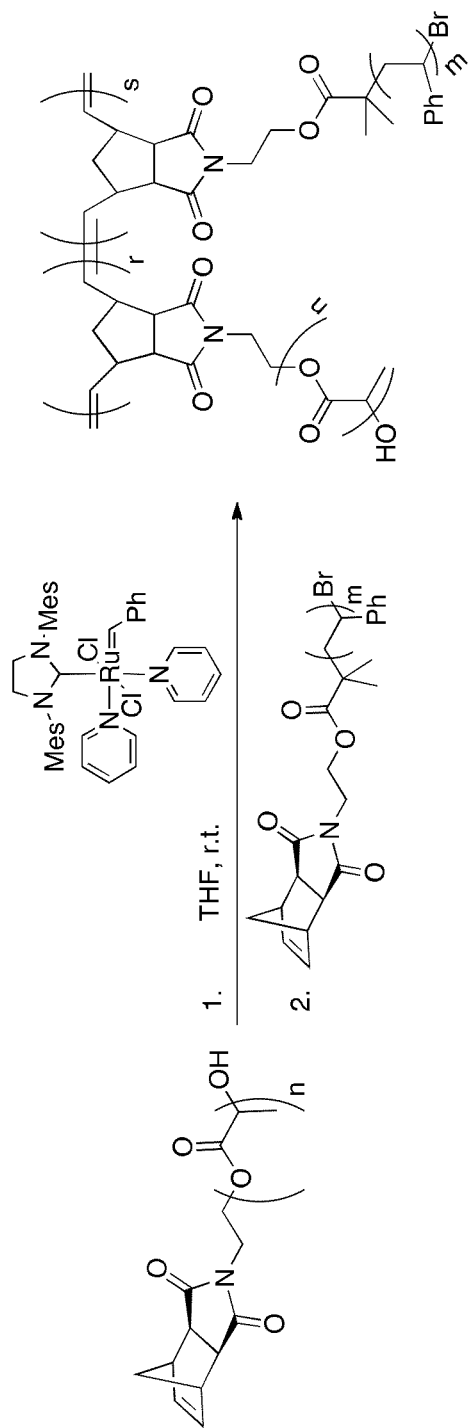
FIG. 8. An example of the synthesis of a graft block copolymer (g-PNB-[PS-b-PLA]).
Figure 9:
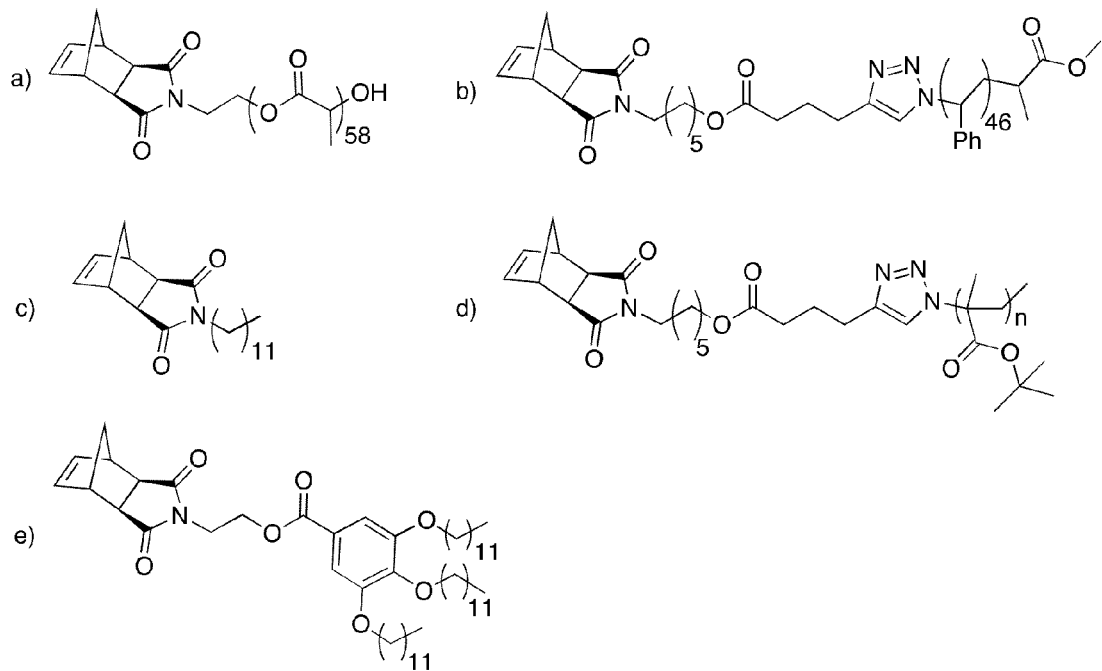
FIG. 9. Chemical structure of the macromonomers tested and the catalyst used: a) Norbornene-polylactide (NB-PLA). b) Norbornene-polystyrene (NB-PS). c) Dodecanyl norbornene (NB-C12). d) Norbornene tert-butyl acrylate (NB-tBA). e) Norbornene wedge (NB-wedge).
Figure 10:
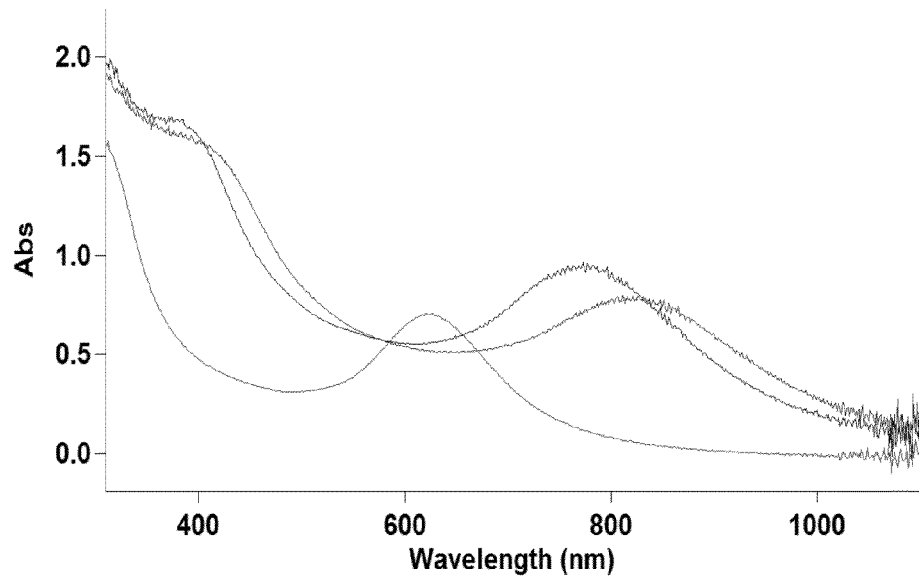
FIG. 10. UV-VIS spectrum of three g-PNB-[PS-b-PLA] of different sizes (Mw=3.4 MDa, PDI=1.17 (red); Mw=4.3 MDa, PDI=1.29 (blue); Mw=5.4 MDa, PDI=1.34 (purple)).
Figure 11:
FIG. 11. A g-PNB-[PS-b-PLA] with Mw=4.3 MDa (PDI=1.29) annealed in several different ways: a) slow evaporation from dichloromethane (top left), b) slow evaporation from tetrahydrofuran (top center), c) slow evaporation from tetrahydrofuran followed by heating at 120° C. for 2 h and d) solid polymer thermally annealed under the pressure of two glass slides clamped together at 140° C. for 30 min under vacuum.

With the PLA/PS system we have now been able to synthesize graft polymers with unprecedented sizes that when self-assembled reach domain sizes not only large enough to give a variety of photonic band gaps throughout all of the visible spectrum but we have UV-VIS (FIG. 6) and integrating sphere data showing that we can even reach into the IR (>1200 nm). The location of the photonic band gap can be easily controlled with the degree of polymerization of the backbone. We have also found that the size of the side chains affect the required degree of polymerization of the backbone to reach the same photonic band gaps. Larger side chains seem to lengthen the domain sizes relative to analogous graft polymers with smaller side chains.

These materials can be annealed in a variety of ways on both hard and soft surfaces. The annealing techniques range from proper solvent annealing with solvents such as but not limited to tetrahydrofuran, dichloromethane, chloroform or mixtures of solvents to methods as simple as dissolving it in a solvent and letting it evaporate over a few hours or just heating the solid polymer for as little as 10-15 minutes at 120-130° C. Detailed studies have been done on the thin films obtained by solvent annealing techniques and are included below. Due to the low amount of entanglement between graft polymers, these materials self-assemble very rapidly compared to many other materials such as linear block copolymers. This is an important factor since time-dependent cost can be significantly decreased with these rapidly self-assembling materials. The different annealing techniques can also be used to reach different domain sizes and thus different band gaps as can be seen by the different colors observed depending on annealing technique.

We have specifically demonstrated the thermomechanical response, as well as solvent-dependent self-assembly of these systems. This opens up the possibility for an array of compliant photonic devices, and novel sensors. A number of potential devices are outlined here. The change in color due to the mechanical stretching or compression yields a pressure and/or stress sensor. The change in color due to the change in index of refraction through chemical adsorption, as well as the potential swelling due to solvation, yields an optically read chemical sensor. The ability to tune the spacing of the brush and wedge type block copolymers through any external stimuli, such as temperature, electric field gradients, solvation or stretching yields a dynamic photonic filter. This could be employed as an optical switch, or other active optical element. The ability to remove one of the incorporated polymers, and infill with another material such as a metal affords the ability to template complex nanostructures, such as metamaterials. We have demonstrated the use of these self-assembled brush and wedge type block copolymers as photonic crystals. We have specifically demonstrated one-dimensional photonic crystals (Bragg reflectors), but higher dimensional photonic crystals can be afforded with the methods described above. These photonic crystals can be employed as frequency selective filters, e.g. as band reject filters or polarizers in the UV, visible or infrared parts of the electromagnetic spectrum. This has many potential applications in optics, as well as in thermal management (via IR reflecting coatings or "paints").

In summary, we have discovered and demonstrated a simple route to fabricate well-ordered, periodic nanostructures on either hard or flexible surfaces that may or may not be transparent using brush and wedge-type block copolymers. Nanostructures with extremely large feature sizes are easily obtained owing to the unique properties of brush and wedge type block copolymers, which would be an ideal candidate for applications such as but not limited to polarizers and photonic band gap materials for visible, ultraviolet and even infrared light. Thin films of brush and wedge-type block copolymers can be directly served as templates and scaffolds for pattern transferring the original patterns onto either hard or flexible surfaces that may or may not be transparent, and the etching contrast for effective pattern transferring can be significantly enhanced by selective etching of one component.

Statements Regarding Incorporation by Reference and Variations

All references cited throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

It must be noted that as used herein and in the appended claims, the singular forms "a", "an", and "the" include plural reference unless the context clearly dictates otherwise. Thus, for example, reference to "a cell" includes a plurality of such cells and equivalents thereof known to those skilled in the art, and so forth. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

Unless defined otherwise, all technical and scientific terms used herein have the same meanings as commonly understood by one of ordinary skill in the art to which this invention belongs. Although any methods and materials similar or equivalent to those described herein can be used in the practice or testing of the present invention, the preferred methods and materials are now described. Nothing herein is to be construed as an admission that the invention is not entitled to antedate such disclosure by virtue of prior invention.

Whenever a range is given in the specification, for example, a temperature range, a time range, or a composition or concentration range, all intermediate ranges and subranges, as well as all individual values included in the ranges given are intended to be included in the disclosure. As used herein, ranges specifically include the values provided as endpoint values of the range. For example, a range of 1 to 100 specifically includes the end point values of 1 and 100. It will be understood that any subranges or individual values in a range or subrange that are included in the description herein can be excluded from the claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

REFERENCES

[1] [1] a) M. Park, C. Harrison, P. M. Chaikin, R. A. Register, D. H. adamson, Science 1997, 276, 1401; b) R. R. Li, et al., Appl. Phys. Lett. 2000, 76, 1689; c) T. Thurn-Albrecht et al., Science 2000, 290, 2126; d) H. C. Kim, et al., Adv. Mater. 2001, 13, 795; e) J. Y. Cheng, et al., Adv. Mater. 2001, 13, 1174; f) C. T. Black, Appl. Phys. Lett. 2001, 79, 409; g) W. A. Lopes, H. M. Jaeger, Nature, 2001, 414, 735; h) C. T. Black, Appl. Phys. Lett. 2005, 87, 163116; i) V. Pelletier, K. Asakawa, M. Wu, D. H. Adamson, R. A. Register, P. M. Chaikin, Appl. Phys. Lett. 2006, 88, 211114; j) Y. Kang, et al., Nat. Mater. 2007, 6, 957; k) J. Y. Cheng, C. A. Ross, H. I. Smith, E. L. Thomas, Adv. Mater. 2006, 18, 2505; I) R. Luttge, J. Phys. D: Appl. Phys. 2009, 42, 123001; m) J. Xu, S. W. Hong, W. Gu, K. Y. Lee, D. S. Kuo, S. Xiao, T. P Russell, Adv. Mater. 2011, 22, 5755.

[2] a) F. S. Bates, G. H. Fredrickson, Ann. Rev. Phys. Chem. 1990, 41, 525; b) I. W. Hamley, Nanotechnology 2003, 14, R39; c) C. Park, J. Yoon, E. L. Thomas, Polymer 2003, 44, 6725; d) R. A. Segalman, Materials Science and Engineering 2005, R48, 191; e) M. P. Stoykovich, P. F. Nealey, Materials Today 2006, 9, 20; f) J. Bang, U. Jeong, D. Y. Ryu, T. P. Russell, C. J. Hawker, Adv. Mater. 2009, 21, 1; g) A. P. Marencic, R. A. Register, Annu. Rev. Chem. Bimol. Eng. 2010, 1, 277; h) J. N. L. Albert, T. H. Epps, III, Materials Today 2010, 13, 24; i) Y.-C. Tseng, S. B. Darling, Polymers 2010, 2, 470.

[3] Y. Kang, J. J. Walish, T. Gorishnyy, E. L. Thomas, Nat. Mater. 2007, 6, 957.

[4] U. F. Gedde, Polymer Physics, Chapman & Hall, London 1995.

[5] a) J. D. Joannopoulos, R. D. Meade, J. N. Winn, Photonic crystals, Princeton University Press, Princeton 1995; b) A. C. Edrington, A. M. Urbas, P. DeRege, C. X. Chen, T. M. Swager, N. Hadjichristidis, M. Xenidou, L. J. Fetters, J. D. Joannopoulos, Y. Fink, E. L. Thomas, Adv. Mater. 2001, 13, 421.

[6] a) N. P. Hadjichristidis, M. Pitskalis, S. Pispas, H. latrou, Chem. Rev. 2001, 101, 3747; b) S. S. Sheiko, M. Möller, Chem. Rev. 2001, 101, 4099; c) M. Zhang, A. H. E. Müller, J. Polym. Sci., Part A: Polym. Chem. 2005, 43, 3461; d) M. B. Runge, N. B. Bowden, J. Am. Chem. Soc. 2007, 129, 10551; e) M. B. Runge, C. E. Lipscomb, L. R. Ditzler, M. K. Mahanthappa, A. V. Tivanski, N. B. Bowden, Macromolecules 2008, 41, 7687; f) Y. Xia, B. D. Olsen, J. A. Kornfield, R. H. Grubbs, J. Am. Chem. Soc. 2009, 131, 18525; g) J. Rzayev, Macromolecules 2009, 42, 2135.

[7] a) D. Neugebauer, B. S. Sumerlin, K. Matyjaszewski, B. Goodhart, S. S. Sheiko, Polymer 2004, 45, 8173; b) M. Schappacher, A. Deffieux, Macromolecules 2005, 38, 7209; c) H. Gao, K. Matyjaszewski, J. Am. Chem. Soc. 2007, 129, 6633; d) B. S. Sumerlin, D. Neugebauer, K. Matyjaszewski, Macromolecules 2007, 40, 5559; e) D. Lanson, M. Schappacher, R. Borsali, A. Deffieux, Macromolecules 2007, 38, 702; f) D. Lanson, M. Schappacher, R. Borsali, A. Deffieux, Macromolecules 2007, 40, 9503; g) H.-I. Lee, K. Matyjaszewski, S. Yu-Su, S. S. Sheiko, Macromolecules 2008, 41, 6073.

[8] N. Hadjichristidis, M. Pitsikalis, H. latrou, S. Pispas, Macromol. Rapid Commun. 2003, 24, 979.

[9] M. Vayer, M. A. Hillmyer, M. Dirany, G. Thevenin, R. Erre, C. Sinturel, Thin Solid Films 2010, 518, 3710.

We claim:

1. A wedge-type block copolymer comprising:
a first polymer block comprising at least 10 first repeating units; wherein each of said first repeating units of said first polymer block comprises a first polymer backbone group covalently linked to a first wedge group characterized by at least three branch points each terminating in an independent branch moiety comprising at least 10 atoms; said first wedge group having a molecular weight greater than or equal to 50 Da; and
a second polymer block comprising at least 10 second repeating units; said second polymer block directly or indirectly covalently linked to said first polymer block along a backbone of said wedge-type block copolymer; wherein each of said second repeating units of said second polymer block comprises a second polymer backbone group covalently linked to a first polymer side chain group or a second wedge group different from said first wedge group;
wherein said wedge-type block copolymer has a molecular weight selected from the range of 1,000,000 Da to 30,000,000 Da;
wherein said wedge-type block copolymer has the formula (FX2a), (FX2b), (FX2c) or (FX2d):

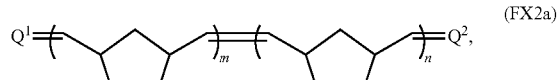

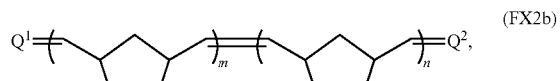
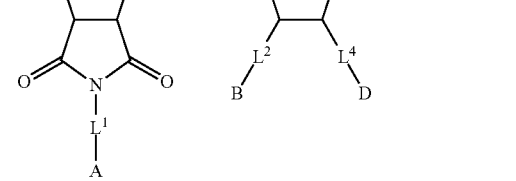

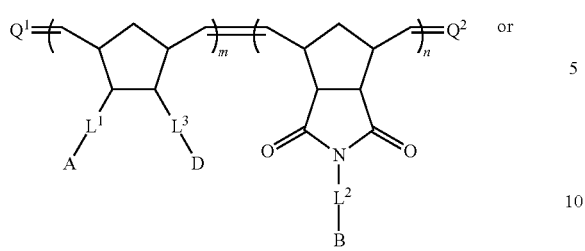

(FX2c)

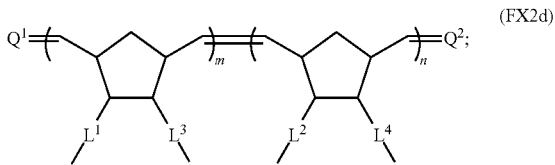

(FX2d)

wherein:
Q$^1$ is a first backbone terminating group and Q$^2$ is a second backbone terminating group;
L$^1$ is a first linking group, L$^2$ is a second linking group, L$^3$ is a third linking group and L$^4$ is a fourth linking group;
A is said first wedge group;
B is said first polymer side chain group or said second wedge group;
D is a wedge group;
E is a polymer side chain group or a wedge group; and
each of n and m is independently an integer selected from the range of 20 to 2000.

2. The wedge-type block copolymer of claim 1, wherein said first wedge group and said first polymer side chain group or second wedge group provide steric interactions within said wedge-type block copolymer resulting in said backbone of said wedge-type block copolymer being an extended backbone.

3. The wedge-type block copolymer of claim 1, wherein said first wedge group has a molecular weight selected over the range of 50 Da to 1500 Da.

4. The wedge-type block copolymer of claim 1, wherein said first wedge group comprises a $C_2$-$C_{30}$ alkyl, $C_3$-$C_{30}$ cycloalkyl, $C_5$-$C_{30}$ aryl, $C_5$-$C_{30}$ heteroaryl, $C_2$-$C_{30}$ ester, $C_2$-$C_{30}$ ether, $C_2$-$C_{30}$ thioether, $C_2$-$C_{30}$ amine, $C_2$-$C_{30}$ imide, $C_2$-$C_{30}$ halocarbon chain, $C_2$-$C_{30}$ perfluorocarbon or $C_2$-$C_{30}$ polyethylene glycol; or wherein said first wedge group comprises a group derived from a substituted or unsubstituted adamantane, silsesquioxane, norbornane, terpenoid, polyethylene glycol, or borneol.

5. The wedge-type block copolymer of claim 1, wherein said first wedge group (A) has the formula (W1), (W2), (W3), (W4), (W5), (W6), (W7), (W8), (W9) or (W10):

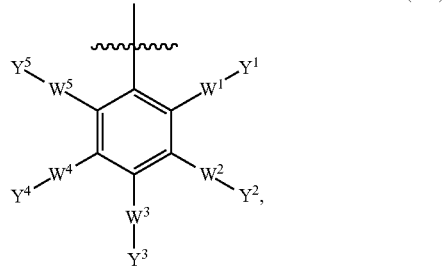
(W1)

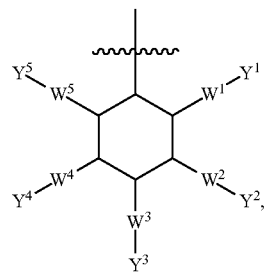
(W2)

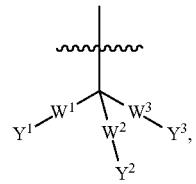
(W3)

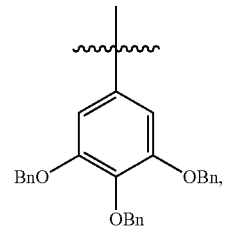
(W4)

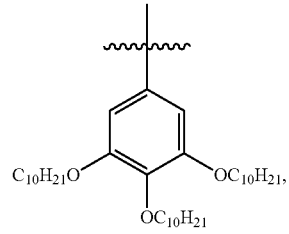
(W5)

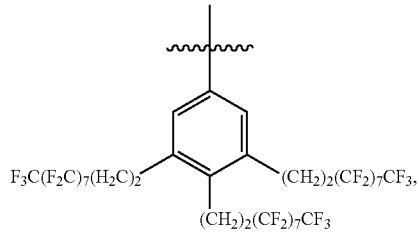
(W6)

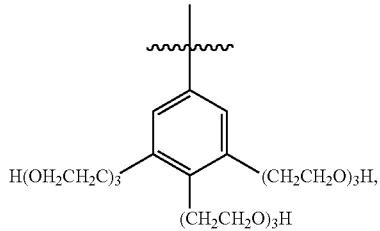
(W7)

(W8)
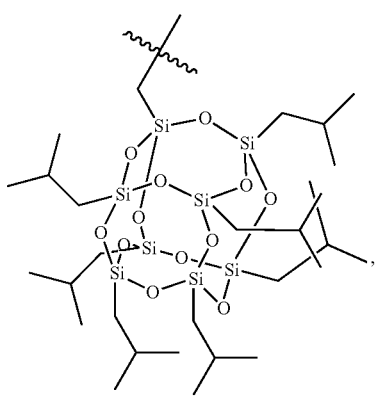

(W9)
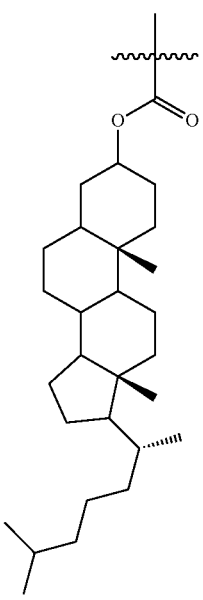

or (W10)
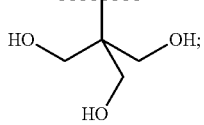

wherein each of $W^1$-$W^5$ is independently a linking group; Bn is a benzyl group, and each of $Y^1$-$Y^5$ is independently a hydrogen, $C_1$-$C_{30}$ alkyl, $C_3$-$C_{30}$ cycloalkyl, $C_5$-$C_{30}$ aryl, $C_5$-$C_{30}$ heteroaryl, $C_1$-$C_{30}$ acyl, $C_1$-$C_{30}$ hydroxyl, $C_1$-$C_{30}$ alkoxy, $C_2$-$C_{30}$ alkenyl, $C_2$-$C_{30}$ alkynyl, $C_5$-$C_{30}$ alkylaryl, —$CO_2R^{30}$, —$CONR^{31}R^{32}$, —$COR^{33}$, —$SOR^{34}$, —$OSR^{35}$, —$SO_2R^{36}$, —$OR^{37}$, —$SR^{38}$, —$NR^{39}R^{40}$, —$NR^{41}COR^{42}$, $C_1$-$C_{30}$ alkyl halide, phosphonate, phosphonic acid, silane, siloxane, silsesquioxane, $C_2$-$C_{30}$ halocarbon chain, $C_2$-$C_{30}$ perfluorocarbon, or $C_2$-$C_{30}$ polyethylene glycol; wherein each of $R^{30}$-$R^{42}$ is independently H, $C_5$-$C_{10}$ aryl or $C_1$-$C_{10}$ alkyl.

6. The wedge-type block copolymer of claim 1, wherein said wedge-type block copolymer has the formula (FX3a), (FX3b) or (FX3c):

(FX3a)
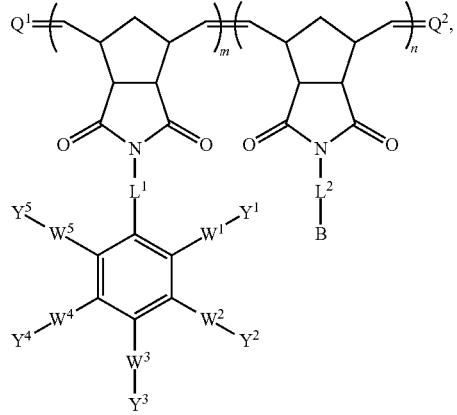

(FX3b)
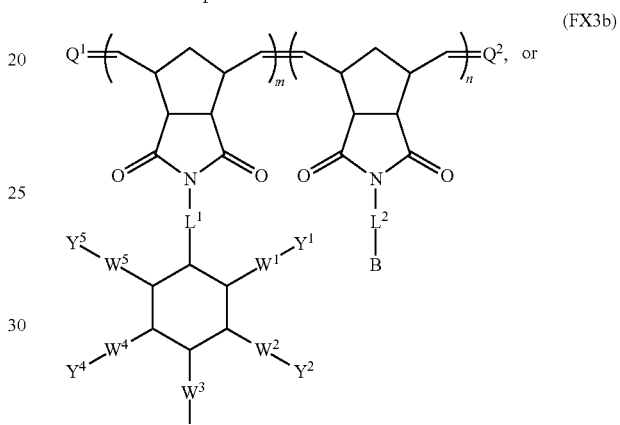

or (FX3c)
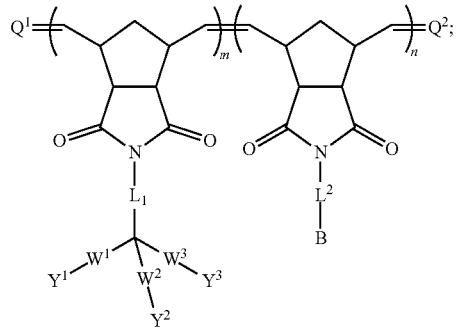

wherein each of $W^1$-$W^5$ is independently a linking group; each of $Y^1$-$Y^5$ is independently a hydrogen, $C_1$-$C_{30}$ alkyl, $C_3$-$C_{30}$ cycloalkyl, $C_5$-$C_{30}$ aryl, $C_5$-$C_{30}$ heteroaryl, $C_1$-$C_{30}$ acyl, $C_1$-$C_{30}$ hydroxyl, $C_1$-$C_{30}$ alkoxy, $C_2$-$C_{30}$ alkenyl, $C_2$-$C_{30}$ alkynyl, $C_5$-$C_{30}$ alkylaryl, —$CO_2R^{30}$, —$CONR^{31}R^{32}$, —$COR^{33}$, —$SOR^{34}$, —$OSR^{35}$, —$SO_2R^{36}$, —$OR^{37}$, —$SR^{38}$, —$NR^{39}R^{40}$, —$NR^{41}COR^{42}$, $C_1$-$C_{30}$ alkyl halide, phosphonate, phosphonic acid, silane, siloxane, silsesquioxane, $C_2$-$C_{30}$ halocarbon chain, $C_2$-$C_{30}$ perfluorocarbon, or $C_2$-$C_{30}$ polyethylene glycol; wherein each of $R^{30}$-$R^{42}$ is independently hydrogen, $C_5$-$C_{10}$ aryl or $C_1$-$C_{10}$ alkyl.

7. The wedge-type block copolymer of claim 5, wherein each of $W^1$-$W^5$ is independently a single bond, —$(CH_2)_q$—, —$(CH_2)_qO(CH_2)_r$—, —$(CH_2)_qS(CH_2)_r$—, —$(CH_2)_qO_2(CH_2)_r$—, —$(CH_2)_qSO(CH_2)_r$—, —$(CH_2)_qSO_2(CH_2)_r$—, —$(CH_2)_qSO_3(CH_2)_r$—, —$(CH_2)_qOSO_2(CH_2)_r$—, —$(CH_2)_q$ NR$^{19}$(CH$_2$)$_r$—, —(CH$_2$)$_q$CO(CH$_2$)$_r$—, —(CH$_2$)$_q$COO(CH$_2$)$_r$—, —(CH$_2$)$_q$OCO(CH$_2$)$_r$—, —(CH$_2$)$_q$OCOO(CH$_2$)$_r$—, —(CH$_2$)$_q$CONR$^{20}$(CH$_2$)$_r$—, —(CH$_2$)$_q$NR$^{21}$CO(CH$_2$)$_r$—, —(CH$_2$)$_q$OCONR$^{22}$(CH$_2$)$_r$—, —(CH$_2$)$_q$NR$^{23}$COO(CH$_2$)$_r$—, or —(CH$_2$)$_q$NR$^{24}$CONR$^{25}$(CH$_2$)$_r$—; wherein each of R$^{19}$-R$^{25}$ is independently hydrogen, or C$_1$-C$_5$ alkyl; and wherein each of q and r is independently an integer selected from the range of 0 to 10.

8. The wedge-type block copolymer of claim 1, wherein B is said second wedge group different from said first wedge group.

9. The wedge-type block copolymer of claim 8, wherein said second wedge block group has a molecular weight greater than or equal to 50 Da and wherein said second wedge group is characterized by at least two branch points each terminating in an independent terminating branch moiety comprising at least 4 atoms.

10. The wedge-type block copolymer of claim 8, wherein said second wedge group independently comprises a C$_1$-C$_{30}$ alkyl, C$_3$-C$_{30}$ cycloalkyl, C$_5$-C$_{30}$ aryl, C$_5$-C$_{30}$ heteroaryl, C$_2$-C$_{30}$ ester, C$_2$-C$_{30}$ ether, C$_2$-C$_{30}$ thioether, C$_2$-C$_{30}$ amine, C$_2$-C$_{30}$ imide, C$_2$-C$_{30}$ halocarbon chain, C$_2$-C$_{30}$ perfluorocarbon or C$_2$-C$_{30}$ polyethylene glycol; or wherein second wedge group independently comprises a group derived from a substituted or unsubstituted adamantane, silsesquioxane, norbornane, terpenoid, polyethylene glycol, or borneol.

11. The wedge-type block copolymer of claim 8, wherein said second wedge group independently has the formula (W1), (W2), (W3), (W4), (W5), (W6), (W7), (W8), (W9) or (W10):

(W1)
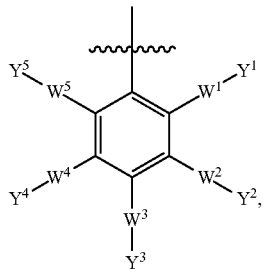

(W2)
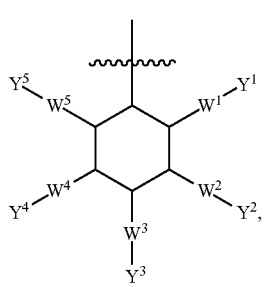

(W3)
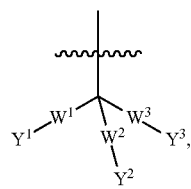

(W4)
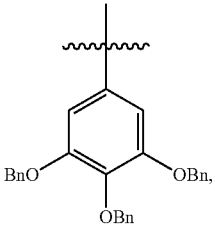

(W5)
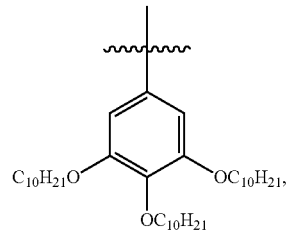

(W6)
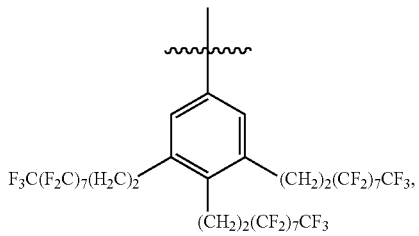

(W7)
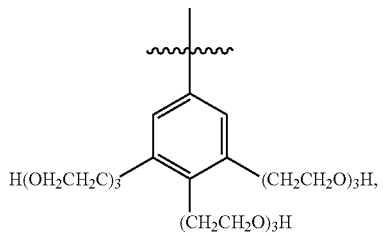

(W8)
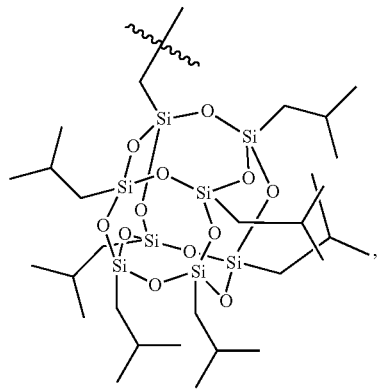

-continued (W9)

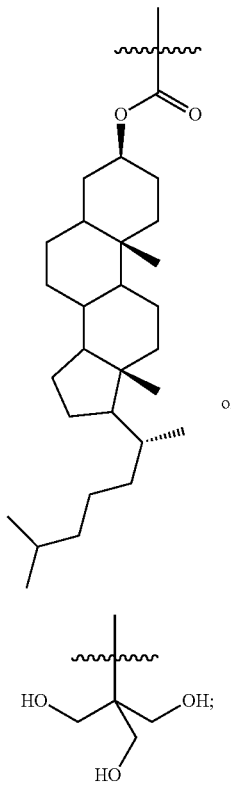

or (W10)

wherein each of $W^1$-$W^5$ is independently a linking group, Bn is a benzyl group; and each of $Y^1$-$Y^5$ is independently a hydrogen, $C_1$-$C_{30}$ alkyl, $C_3$-$C_{30}$ cycloalkyl, $C_5$-$C_{30}$ aryl, $C_5$-$C_{30}$ heteroaryl, $C_1$-$C_{30}$ acyl, $C_1$-$C_{30}$ hydroxyl, $C_1$-$C_{30}$ alkoxy, $C_2$-$C_{30}$ alkenyl, $C_2$-$C_{30}$ alkynyl, $C_5$-$C_{30}$ alkylaryl, —$CO_2R^{30}$, —$CONR^{31}R^{32}$, —$COR^{33}$, —$SOR^{34}$, —$OSR^{35}$, —$SO_2R^{36}$, —$OR^{37}$, —$SR^{38}$, —$NR^{39}R^{40}$, —$NR^{41}COR^{42}$, $C_1$-$C_{30}$ alkyl halide, phosphonate, phosphonic acid, silane, siloxane, silsesquioxane, $C_2$-$C_{30}$ halocarbon chain, $C_2$-$C_{30}$ perfluorocarbon, or $C_2$-$C_{30}$ polyethylene glycol; wherein each of $R^{30}$-$R^{42}$ is independently hydrogen, $C_5$-$C_{10}$ aryl or $C_1$-$C_{10}$ alkyl.

12. The wedge-type block copolymer of claim 8, wherein said wedge-type block copolymer has the formula (FX4):

(FX4)

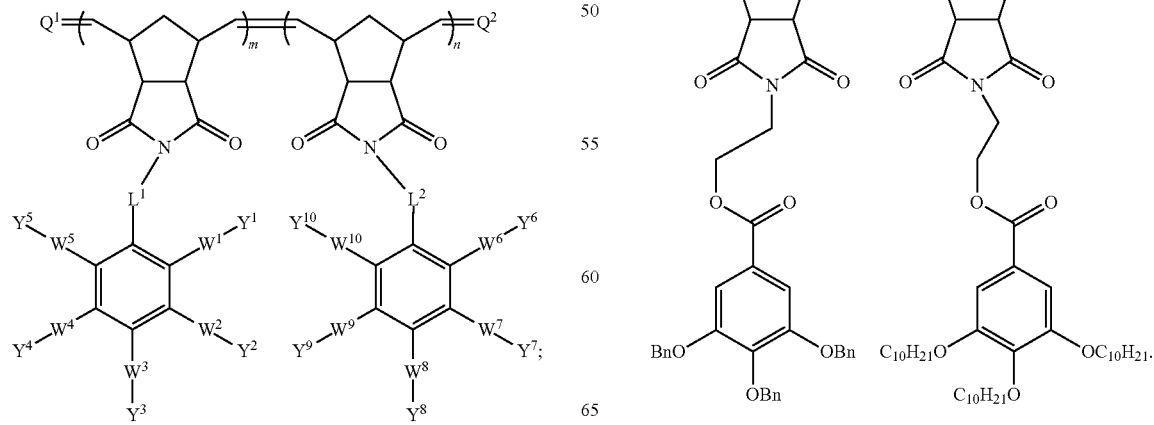

wherein each of $W^1$-$W^{10}$ is independently a linking group; and each of $Y^1$-$Y^{10}$ independently a hydrogen, $C_1$-$C_{30}$ alkyl, $C_3$-$C_{30}$ cycloalkyl, $C_5$-$C_{30}$ aryl, $C_5$-$C_{30}$ heteroaryl, $C_1$-$C_{30}$ acyl, $C_1$-$C_{30}$ hydroxyl, $C_1$-$C_{30}$ alkoxy, $C_2$-$C_{30}$ alkenyl, $C_2$-$C_{30}$ alkynyl, $C_5$-$C_{30}$ alkylaryl, —$CO_2R^{30}$, —$CONR^{31}R^{32}$, —$COR^{33}$, —$SOR^{34}$, —$OSR^{35}$, —$SO_2R^{36}$, —$OR^{37}$, —$SR^{38}$, —$NR^{39}R^{40}$, —$NR^{41}COR^{42}$, $C_1$-$C_{30}$ alkyl halide, phosphonate, phosphonic acid, silane, siloxane, silsesquioxane, $C_2$-$C_{30}$ halocarbon chain, $C_2$-$C_{30}$ perfluorocarbon, or $C_2$-$C_{30}$ polyethylene glycol; wherein each of $R^{30}$-$R^{42}$ is independently hydrogen, $C_5$-$C_{10}$ aryl or $C_1$-$C_{10}$ alkyl; and wherein at least a portion of $Y^1$-$Y^5$ are different than $Y^6$-$Y^{10}$.

13. The wedge-type block copolymer of claim 11, wherein each of $W^1$-$W^5$ is independently a single bond, —$(CH_2)_q$—, —$(CH_2)_qO(CH_2)_r$—, —$(CH_2)_qS(CH_2)_r$—, —$(CH_2)_qO_2(CH_2)_r$—, —$(CH_2)_qSO(CH_2)_r$—, —$(CH_2)_qSO_2(CH_2)_r$—, —$(CH_2)_qSO_3(CH_2)_r$—, —$(CH_2)_qOSO_2(CH_2)_r$—, —$(CH_2)_qNR^{19}(CH_2)_r$—, —$(CH_2)_qCO(CH_2)_r$—, —$(CH_2)_qCOO(CH_2)_r$—, —$(CH_2)_qOCO(CH_2)_r$—, —$(CH_2)_qOCOO(CH_2)_r$—, —$(CH_2)_qCONR^{20}(CH_2)_r$—, —$(CH_2)_qNR^{21}CO(CH_2)_r$—, —$(CH_2)_qOCONR^{22}(CH_2)_r$—, —$(CH_2)_qNR^{23}COO(CH_2)_r$—, or —$(CH_2)_qNR^{24}CONR^{25}(CH_2)_r$—; wherein each of $R^{19}$-$R^{25}$ is independently hydrogen, or $C_1$-$C_5$ alkyl; and wherein each of q and r is independently an integer selected from the range of 0 to 10.

14. The wedge-type block copolymer of claim 8, wherein said wedge-type block copolymer has the formula (FX5) or (FX6):

(FX5)

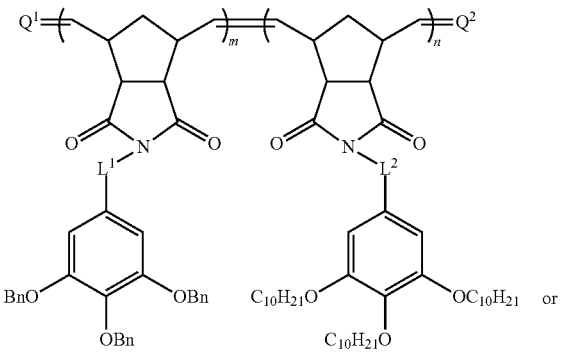

(FX6)

wherein Bn is a benzyl group.

15. The wedge-type block copolymer of claim 1, wherein B is said first polymer side chain group.

16. The wedge-type block copolymer of claim 15, wherein said first polymer side chain group has a molecular weight greater than or equal to 500 Da; or wherein said first polymer side chain group has a molecular weight selected from the range of 500 Da to 30,000 Da.

17. The wedge-type block copolymer of claim 15, wherein said wedge-type block copolymer has the formula (FX7):

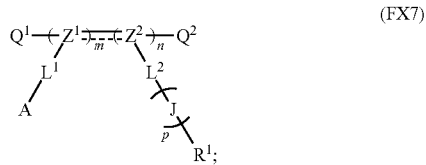

(FX7)

wherein J is a repeating group of said first polymer side chain group;
$R^1$ is a polymer side chain terminating group and wherein p is selected from the range of 35 to 2000.

18. The wedge-type block copolymer of claim 17, wherein a repeating unit of said first polymer side chain group is a group corresponding to a lactide, styrene, acrylate, tert-butyl acrylate, methyl methacrylate, siloxane, di methylsiloxane, n-butyl acrylate, ethylene glycol, ethylene oxide, ethylene, propylene, tetrafluoroethylene, or vinyl chloride.

19. The wedge-type block copolymer of claim 15, wherein said wedge-type block copolymer has the formula (FX8):

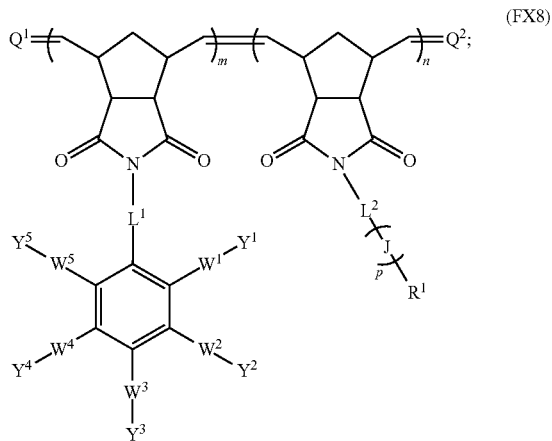

(FX8)

wherein each of $W^1$-$W^5$ is independently a linking group;
each of $Y^1$-$Y^5$ is independently a hydrogen, $C_1$-$C_{30}$ alkyl, $C_3$-$C_{30}$ cycloalkyl, $C_5$-$C_{30}$ aryl, $C_5$-$C_{30}$ heteroaryl, $C_1$-$C_{30}$ acyl, $C_1$-$C_{30}$ hydroxyl, $C_1$-$C_{30}$ alkoxy, $C_2$-$C_{30}$ alkenyl, $C_2$-$C_{30}$ alkynyl, $C_5$-$C_{30}$ alkylaryl, $-CO_2R^{30}$, $-CONR^{31}R^{32}$, $-COR^{33}$, $-SOR^{34}$, $-OSR^{35}$, $-SO_2R^{36}$, $-OR^{37}$, $-SR^{38}$, $-NR^{39}R^{40}$, $-NR^{41}COR^{42}$, $C_1$-$C_{30}$ alkyl halide, phosphonate, phosphonic acid, silane, siloxane, silsesquioxane, $C_2$-$C_{30}$ halocarbon chain, $C_2$-$C_{30}$ perfluorocarbon, or $C_2$-$C_{30}$ polyethylene glycol; wherein each of $R^{30}$-$R^{42}$ is independently hydrogen, $C_5$-$C_{10}$ aryl or $C_1$-$C_{10}$ alkyl, and J is a repeating group of said first polymer side chain group; $R^1$ is a polymer side chain terminating group and wherein p is selected from the range of 35 to 2000.

20. The wedge-type block copolymer of claim 19, wherein each of $W^1$-$W^5$ is independently a single bond, $-(CH_2)_q-$, $-(CH_2)_qO(CH_2)_r-$, $-(CH_2)_qS(CH_2)_r-$, $-(CH_2)_qO_2(CH_2)_r-$, $-(CH_2)_qSO(CH_2)_r-$, $-(CH_2)_qSO_2(CH_2)_r-$, $-(CH_2)_qSO_3(CH_2)_r-$, $-(CH_2)_qOSO_2(CH_2)_r-$, $-(CH_2)_qNR^{19}(CH_2)_r-$, $-(CH_2)_qCO(CH_2)_r-$, $-(CH_2)_qCOO(CH_2)_r-$, $-(CH_2)_qOCO(CH_2)_r-$, $-(CH_2)_qOCOO(CH_2)_r-$, $-(CH_2)_qCONR^{20}(CH_2)_r-$, $-(CH_2)_qNR^{21}CO(CH_2)_r-$, $-(CH_2)_qOCONR^{22}(CH_2)_r-$, $-(CH_2)_qNR^{23}COO(CH_2)_r-$, or $-(CH_2)_qNR^{24}CONR^{25}(CH_2)_r-$; wherein each of $R^{19}$-$R^{25}$ is independently hydrogen, or $C_1$-$C_5$ alkyl; and wherein each of q and r is independently an integer selected from the range of 0 to 10; and wherein $R^1$ is hydrogen, $C_1$-$C_{10}$ alkyl, $C_3$-$C_{10}$ cycloalkyl, $C_5$-$C_{10}$ aryl, $C_5$-$C_{10}$ heteroaryl, $C_1$-$C_{10}$ acyl, $C_1$-$C_{10}$ hydroxyl, $C_1$-$C_{10}$ alkoxy, $C_2$-$C_{10}$ alkenyl, $C_2$-$C_{10}$ alkynyl, $C_5$-$C_{10}$ alkylaryl, $-CO_2R^{30}$, $-CONR^{31}R^{32}$, $-COR^{33}$, $-SOR^{34}$, $-OSR^{35}$, $-SO_2R^{36}$, $-OR^{37}$, $-SR^{38}$, $-NR^{39}R^{40}$, $-NR^{41}COR^{42}$, $C_1$-$C_{10}$ alkyl halide, phosphonate, phosphonic acid, silane, siloxane acrylate, or catechol; wherein each of $R^{30}$-$R^{42}$ is independently hydrogen or $C_1$-$C_5$ alkyl.

21. The wedge-type block copolymer of claim 1, wherein each of $L^1$, $L^2$, $L^3$ and $L^4$ is independently a single bond, $-(CH_2)_q-$, $-(CH_2)_qO(CH_2)_r-$, $-(CH_2)_qS(CH_2)_r-$, $-(CH_2)_qO_2(CH_2)_r-$, $-(CH_2)_qSO(CH_2)_r-$, $-(CH_2)_qSO_2(CH_2)_r-$, $-(CH_2)_qSO_3(CH_2)_r-$, $-(CH_2)_qOSO_2(CH_2)_r-$, $-(CH_2)_qNR^{19}(CH_2)_r-$, $-(CH_2)_qCO(CH_2)_r-$, $-(CH_2)_qCOO(CH_2)_r-$, $-(CH_2)_qOCO(CH_2)_r-$, $-(CH_2)_qOCOO(CH_2)_r-$, $-(CH_2)_qCONR^{20}(CH_2)_r-$, $-(CH_2)_qNR^{21}CO(CH_2)_r-$, $-(CH_2)_qOCONR^{22}(CH_2)_r-$, $-(CH_2)_qNR^{23}COO(CH_2)_r-$, or $-(CH_2)_qNR^{24}CONR^{25}(CH_2)_r-$; wherein each of $R^{19}$-$R^{25}$ is independently hydrogen, or $C_1$-$C_5$ alkyl; and wherein each of q and r is independently an integer selected from the range of 0 to 10 and wherein each of $Q^1$ and $Q^2$ is independently hydrogen, $C_1$-$C_{10}$ alkyl, $C_3$-$C_{10}$ cycloalkyl, $C_5$-$C_{10}$ aryl, $C_5$-$C_{10}$ heteroaryl, $C_1$-$C_{10}$ acyl, $C_1$-$C_{10}$ hydroxyl, $C_1$-$C_{10}$ alkoxy, $C_2$-$C_{10}$ alkenyl, $C_2$-$C_{10}$ alkynyl, $C_5$-$C_{10}$ alkylaryl, $-CO_2R^{30}$, $-CONR^{31}R^{32}$, $-COR^{33}$, $-SOR^{34}$, $-OSR^{35}$, $-SO_2R^{36}$, $-OR^{37}$, $-SR^{38}$, $-NR^{39}R^{40}$, $-NR^{41}COR^{42}$, $C_1$-$C_{10}$ alkyl halide, phosphonate, phosphonic acid, silane, siloxane acrylate, or catechol; wherein each of $R^{30}$-$R^{42}$ is independently hydrogen, $C_1$-$C_{10}$ alkyl or $C_5$-$C_{10}$ aryl.

22. The wedge-type block copolymer of claim 1, further comprising a third polymer block comprising at least 10 third repeating units; said third polymer block indirectly or directly covalently linked to said first polymer block and said second polymer block along the backbone of said wedge-type block copolymer; wherein each of said third repeating units of said third polymer block comprises a third polymer backbone group covalently linked to a second polymer side chain group or a third wedge group.

23. A structure comprising a supramolecular assembly of a plurality of the wedge-type block copolymers of claim 1.

24. The wedge-type block copolymer of claim 1, wherein molecular self-assembly of a plurality of said block copolymers generates a lamellar structure.

25. The wedge-type block copolymer of claim 1, wherein each of $Q^1$ and $Q^2$ is independently hydrogen, $C_1$-$C_{10}$ alkyl, $C_3$-$C_{10}$ cycloalkyl, $C_5$-$C_{10}$ aryl, $C_5$-$C_{10}$ heteroaryl, $C_1$-$C_{10}$ acyl, $C_1$-$C_{10}$ hydroxyl, $C_1$-$C_{10}$ alkoxy, $C_2$-$C_{10}$ alkenyl, $C_2$-$C_{10}$ alkynyl, $C_5$-$C_{10}$ alkylaryl, $-CO_2R^{39}$, $-CONR^{31}R^{32}$, $-COR^{33}$, $-SOR^{34}$, $-OSR^{35}$, $-SO_2R^{36}$, $-OR^{37}$, $-SR^{38}$, $-NR^{39}R^{40}$, $-NR^{41}COR^{42}$, $C_1$-$C_{10}$ alkyl halide, phosphonate, phosphonic acid, silane, siloxane, acrylate, or catechol; wherein each of $R^{30}$-$R^{42}$ is independently hydrogen, $C_1$-$C_{10}$ alkyl or $C_5$-$C_{10}$ aryl.

26. The structure of claim 23, wherein said structure is formed via molecular self-assembly of said plurality of wedge-type block copolymers to generate said supramolecular assembly.

27. The structure of claim 23, wherein said structure is formed via thermal annealing, solvent annealing or by the application of an external pressure.

28. The structure of claim 23 comprising a periodic structure.

29. The structure of claim 23, wherein said structure is characterized by at least one domain having a size greater than or equal to 80 nm.

30. The structure of claim 23, wherein said structure is a stacked lamellar structure.

31. The structure of claim 23, comprising a one dimensional, two dimensional or three dimensional photonic crystal.

\* \* \* \* \*

UNITED STATES PATENT AND TRADEMARK OFFICE
CERTIFICATE OF CORRECTION

PATENT NO. : 9,045,579 B2
APPLICATION NO. : 13/801710
DATED : June 2, 2015
INVENTOR(S) : Yan Xia et al.

It is certified that error appears in the above-identified patent and that said Letters Patent is hereby corrected as shown below:

In the Claims

In claim 5 column 45 line 17 Formula (W9) replace " 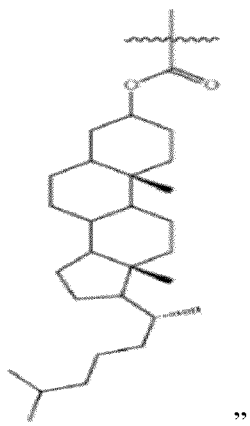 "

with -- 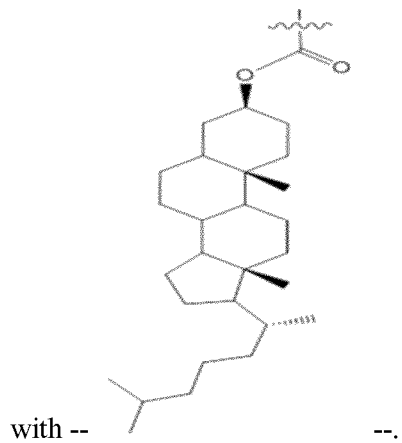 --.

In claim 7 column 46 line 65 replace "–(CH$_2$)$_{,q}$O(CH$_2$)$_r$–," with -- –(CH$_2$)$_q$O(CH$_2$)$_r$–,--.

In claim 7 column 46 line 66 replace "–(CH$_2$)$_{,q}$SO(CH$_2$)$_r$–," with -- –(CH$_2$)$_q$SO(CH$_2$)$_r$–,--.

Signed and Sealed this
Twenty-fourth Day of May, 2016

Michelle K. Lee
*Director of the United States Patent and Trademark Office*

CERTIFICATE OF CORRECTION (continued)
U.S. Pat. No. 9,045,579 B2

In claim 12 column 50 line 15 replace "$_{than}Y^6\text{-}Y^{10}$" with --than $Y^6\text{-}Y^{10}$--.

In claim 13 column 50 line 17 replace "$W^1\text{-}W^5$" with --$W^1\text{-}W^{10}$--.

In claim 13 column 50 line 18 replace "–$(CH_2)_qO(CH_2)_r$–," with -- –$(CH_2)_qO(CH_2)_r$–,--.

In claim 18 column 51 line 27 replace "di methylsiloxane," with --dimethylsiloxane,--.

In claim 21 column 52 lines 41-42 replace "siloxane acrylate" with --siloxane, acrylate--.